United States Patent
Kinomoto et al.

(10) Patent No.: US 8,882,299 B2
(45) Date of Patent: Nov. 11, 2014

(54) WAVELENGTH CONVERSION MEMBER, LIGHT EMITTING DEVICE AND IMAGE DISPLAY DEVICE, AND METHOD FOR MANUFACTURING WAVELENGTH CONVERSION MEMBER

(75) Inventors: Junichi Kinomoto, Osaka (JP); Tatsuya Ryowa, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 91 days.

(21) Appl. No.: 13/582,281

(22) PCT Filed: Feb. 25, 2011

(86) PCT No.: PCT/JP2011/054270
§ 371 (c)(1),
(2), (4) Date: Aug. 31, 2012

(87) PCT Pub. No.: WO2011/108449
PCT Pub. Date: Sep. 9, 2011

(65) Prior Publication Data
US 2012/0320607 A1    Dec. 20, 2012

(30) Foreign Application Priority Data

Mar. 3, 2010  (JP) ................................. 2010-046147
Feb. 16, 2011  (JP) ................................. 2011-030333

(51) Int. Cl.
*F21V 9/00* (2006.01)
*H01L 27/32* (2006.01)
*H01L 33/50* (2010.01)
*G02F 1/1335* (2006.01)

(52) U.S. Cl.
CPC ............. *H01L 27/322* (2013.01); *H01L 33/504* (2013.01); *G02F 2202/102* (2013.01); *H01L 33/505* (2013.01); *G02F 2001/133614* (2013.01); *G02F 1/133621* (2013.01); *H01L 2251/5369* (2013.01)
USPC ........... 362/293; 362/351; 362/510; 313/501; 313/502; 313/503

(58) Field of Classification Search
USPC ........... 313/501–503; 362/317, 510, 293, 351
See application file for complete search history.

(56) References Cited

U.S. PATENT DOCUMENTS 5,627,429 A * 5/1997 Iwasaki .......................... 313/474
7,582,906 B2 * 9/2009 Kurihara ......................... 257/79
(Continued)

FOREIGN PATENT DOCUMENTS

JP    2002-510866    4/2002
JP    2004-107572    4/2004
(Continued)

OTHER PUBLICATIONS

Office Action dated May 31, 2011, directed to Japanese Application No. 2011-030333; 3 pages.
(Continued)

*Primary Examiner* — Nimeshkumar Patel
*Assistant Examiner* — Jose M Diaz
(74) *Attorney, Agent, or Firm* — Morrison & Foerster LLP

(57) ABSTRACT

Disclosed is a wavelength conversion member that is provided with: a light transmissive member including a light input plane into which excitation light is inputted, and a light output plane from which wavelength converted light is outputted; and a semiconductor fine particle phosphor, which is dispersed in the light transmissive member, and which absorbs the excitation light, converts the wavelength, and emits light. The dispersion concentration of the semiconductor fine particle phosphor in the direction parallel to the light traveling direction, i.e., the direction connecting the light input plane and the light output plane, is lower than the dispersion concentration of the semiconductor fine particle phosphor in the direction orthogonal to the light traveling direction.

32 Claims, 37 Drawing Sheets

(56) References Cited

U.S. PATENT DOCUMENTS

| | | | |
|---|---|---|---|
| 8,471,283 B2 * | 6/2013 | Ishii et al. | 257/98 |
| 8,492,746 B2 * | 7/2013 | Yen | 257/14 |
| 2004/0105481 A1 * | 6/2004 | Ishida et al. | 372/108 |
| 2004/0145895 A1 | 7/2004 | Ouderkirk et al. | |
| 2005/0012076 A1 | 1/2005 | Morioka et al. | |
| 2005/0205876 A1 | 9/2005 | Harada et al. | |
| 2006/0068154 A1 | 3/2006 | Parce et al. | |
| 2006/0071591 A1 * | 4/2006 | Takezawa et al. | 313/501 |
| 2006/0244358 A1 | 11/2006 | Kim et al. | |
| 2007/0246734 A1 | 10/2007 | Lee et al. | |
| 2008/0012031 A1 | 1/2008 | Jang et al. | |
| 2008/0128732 A1 * | 6/2008 | Haruna et al. | 257/98 |
| 2008/0173845 A1 | 7/2008 | Ryowa et al. | |
| 2008/0231170 A1 * | 9/2008 | Masato et al. | 313/501 |
| 2009/0224177 A1 | 9/2009 | Kinomoto et al. | |
| 2009/0267051 A1 | 10/2009 | Kim et al. | |
| 2010/0033074 A1 * | 2/2010 | Nakakawaji et al. | 313/483 |
| 2010/0140551 A1 * | 6/2010 | Parce et al. | 252/301.36 |
| 2011/0068676 A1 | 3/2011 | Jeon et al. | |

FOREIGN PATENT DOCUMENTS

| | | |
|---|---|---|
| JP | 2005-56767 | 3/2005 |
| JP | 2005-268708 | 9/2005 |
| JP | 2005-285800 | 10/2005 |
| JP | 2006-313902 | 11/2006 |
| JP | 2007-35885 | 2/2007 |
| JP | 2007-103513 | 4/2007 |
| JP | 2007-266170 | 10/2007 |
| JP | 2007-281484 | 10/2007 |
| JP | 2008-094968 | 4/2008 |
| JP | 2009-206459 | 9/2009 |
| JP | 2009-263621 | 11/2009 |
| JP | 2009-289829 | 12/2009 |
| JP | 2009-544805 | 12/2009 |
| KR | 10-2009-0123817 | 2/2009 |
| WO | WO-99/50916 | 10/1999 |

OTHER PUBLICATIONS

Office Action dated Feb. 14, 2012, directed to Japanese Application No. 2011-030333; 3 pages.

International Search Report mailed May 21, 2011, directed to International Application No. PCT/JP2011/054270; 2 pages.

* cited by examiner

FIG.30

| | WEIGHT OF PHOSPHOR [mg] | | | | WEIGHT OF SILICONE RESIN [mg] | | MANUFACTURING METHOD FOR WAVELENGTH CONVERSION MEMBER | DISPERSED STATE OF PHOSPHOR | | OPTICAL CHARACTERISTICS | | |
|---|---|---|---|---|---|---|---|---|---|---|---|---|
| | BLUE | GREEN | YELLOW | RED | A LIQUID | B LIQUID | | XY IN-PLANE | Z AXIAL DIRECTION | IQE [%] | ABSORPTANCE [%] | EQE [%] |
| EXAMPLE A1 | – | 5.38 | – | 0.29 | 512.0 | 506.7 | FIG. 16 | FIG. 15 | FIG. 14 | 59.6 | 90.3 | 53.8 |
| EXAMPLE A2 | – | 2.73 | – | 0.15 | 495.4 | 494.5 | FIG. 16 | FIG. 15 | FIG. 14 | 64.3 | 69.1 | 44.4 |
| EXAMPLE A3 | – | 1.61 | – | 0.09 | 496.7 | 489.7 | FIG. 16 | FIG. 15 | FIG. 14 | 65.3 | 50.2 | 32.8 |
| EXAMPLE A4 | – | 0.83 | – | 0.04 | 504.4 | 500.0 | FIG. 16 | FIG. 15 | FIG. 14 | 65.0 | 30.1 | 19.6 |
| EXAMPLE A5 | – | 5.41 | – | 0.30 | 496.2 | 511.0 | FIG. 16 | FIG. 15 | FIG. 14 | 41.3 | 89.9 | 37.1 |
| EXAMPLE A6 | – | 2.75 | – | 0.14 | 502.1 | 487.6 | FIG. 16 | FIG. 15 | FIG. 14 | 52.1 | 68.6 | 35.7 |
| EXAMPLE A7 | – | 1.56 | – | 0.09 | 498.4 | 491.5 | FIG. 16 | FIG. 15 | FIG. 14 | 56.4 | 49.9 | 28.1 |
| EXAMPLE A8 | – | 0.86 | – | 0.04 | 503.7 | 511.9 | FIG. 16 | FIG. 15 | FIG. 14 | 59.8 | 30.4 | 18.2 |
| EXAMPLE A9 | – | – | 2.17 | – | 493.8 | 504.5 | FIG. 16 | FIG. 15 | FIG. 14 | 65.3 | 90.5 | 59.1 |
| EXAMPLE A10 | – | 3.11 | 0.55 | 0.35 | 495.0 | 498.2 | FIG. 16 | FIG. 15 | FIG. 14 | 54.8 | 90.5 | 49.6 |
| EXAMPLE A11 | 127.28 | 0.82 | 0.15 | 0.13 | 495.3 | 504.3 | FIG. 16 | FIG. 15 | FIG. 14 | 48.3 | 88.1 | 42.5 |
| EXAMPLE A12 | – | 18.92 | – | 1.01 | 497.5 | 512.0 | FIG. 16 | FIG. 15 | FIG. 14 | 59.7 | 90.3 | 53.9 |
| EXAMPLE A13 | – | 45.37 | – | 2.44 | 490.4 | 503.0 | FIG. 16 | FIG. 15 | FIG. 14 | 53.6 | 90.4 | 48.4 |
| EXAMPLE A14 | – | 95.59 | – | 5.32 | 491.6 | 496.1 | FIG. 16 | FIG. 15 | FIG. 14 | 47.7 | 90.3 | 43.1 |
| EXAMPLE A15 | – | 5.40 | – | 0.29 | 512.2 | 497.4 | FIG. 11 | FIG. 10 | FIG. 9 | 49.0 | 92.4 | 45.2 |
| EXAMPLE A16 | – | 2.76 | – | 0.14 | 504.3 | 509.2 | FIG. 11 | FIG. 10 | FIG. 9 | 53.9 | 69.4 | 37.4 |
| EXAMPLE A17 | – | 1.59 | – | 0.09 | 489.9 | 504.4 | FIG. 11 | FIG. 10 | FIG. 9 | 57.5 | 49.7 | 28.6 |
| EXAMPLE A18 | – | 0.84 | – | 0.04 | 490.9 | 495.5 | FIG. 11 | FIG. 10 | FIG. 9 | 61.3 | 29.9 | 18.3 |
| COMPARATIVE EXAMPLE A1 | – | 5.48 | – | 0.29 | 501.6 | 511.2 | FIG. 53 | FIG. 51 | FIG. 50 | 33.5 | 90.3 | 30.3 |
| COMPARATIVE EXAMPLE A2 | – | 2.72 | – | 0.14 | 496.5 | 494.6 | FIG. 53 | FIG. 51 | FIG. 50 | 48.0 | 69.1 | 33.2 |
| COMPARATIVE EXAMPLE A3 | – | 1.64 | – | 0.09 | 502.1 | 495.0 | FIG. 53 | FIG. 51 | FIG. 50 | 55.6 | 50.2 | 27.9 |
| COMPARATIVE EXAMPLE A4 | – | 0.84 | – | 0.04 | 490.0 | 506.0 | FIG. 53 | FIG. 51 | FIG. 50 | 59.4 | 30.1 | 17.9 |
| COMPARATIVE EXAMPLE A5 | – | – | 2.18 | – | 487.7 | 494.3 | FIG. 53 | FIG. 51 | FIG. 50 | 36.1 | 89.8 | 32.4 |
| COMPARATIVE EXAMPLE A6 | – | 3.19 | 0.56 | 0.36 | 512.1 | 496.5 | FIG. 53 | FIG. 51 | FIG. 50 | 26.9 | 91.8 | 24.7 |
| COMPARATIVE EXAMPLE A7 | 129.47 | 0.85 | 0.16 | 0.14 | 509.1 | 507.5 | FIG. 53 | FIG. 51 | FIG. 50 | 22.4 | 90.2 | 20.2 |
| COMPARATIVE EXAMPLE A8 | – | 19.30 | – | 1.00 | 503.1 | 502.9 | FIG. 53 | FIG. 51 | FIG. 50 | 33.1 | 90.5 | 29.9 |
| COMPARATIVE EXAMPLE A9 | – | 45.38 | – | 2.38 | 499.8 | 506.3 | FIG. 53 | FIG. 51 | FIG. 50 | – | – | – |
| COMPARATIVE EXAMPLE A10 | – | 94.59 | – | 5.30 | 496.1 | 504.9 | FIG. 53 | FIG. 51 | FIG. 50 | – | – | – |

FIG.35

| | SILICONE RESIN/ PHOSPHOR RATIO BY WEIGHT | FILM THICKNESS OF PART WHERE PHOSPHOR IS DISPERSED [μm] | ABSORBANCE WITH RESPECT TO LIGHT HAVING WAVELENGTH OF 450 nm | ABSORPTANCE [%] WITH RESPECT TO LIGHT HAVING WAVELENGTH OF 450 nm | ABSORBANCE PER 1 μm OF FILM THICKNESS WITH RESPECT TO LIGHT HAVING WAVELENGTH OF 450 nm |
|---|---|---|---|---|---|
| EXAMPLE A1 | 179.5 | 217.0 | 1.014 | 90.3 | 0.005 |
| EXAMPLE A12 | 50.7 | 74.6 | 1.015 | 90.3 | 0.014 |
| EXAMPLE A13 | 20.8 | 42.2 | 1.016 | 90.4 | 0.024 |
| EXAMPLE A14 | 9.8 | 30.4 | 1.014 | 90.3 | 0.033 |
| COMPARATIVE EXAMPLE A1 | 175.4 | 205.9 | 1.014 | 90.3 | 0.005 |
| COMPARATIVE EXAMPLE A8 | 49.6 | 73.6 | 1.021 | 90.5 | 0.014 |
| COMPARATIVE EXAMPLE A9 | 21.1 | – | – | – | – |
| COMPARATIVE EXAMPLE A10 | 10.0 | – | – | – | – |

FIG.37

| | KIND OF EXCITATION SOURCE | WEIGHT OF PHOSPHOR [mg] | | | | WEIGHT OF SILICONE RESIN [mg] | | MANUFACTURING METHOD FOR WAVELENGTH CONVERSION MEMBER | DISPERSED STATE OF PHOSPHOR | | OPTICAL CHARACTERISTICS | | | | |
|---|---|---|---|---|---|---|---|---|---|---|---|---|---|---|---|
| | | BLUE | GREEN | YELLOW | RED | A LIQUID | B LIQUID | | XY IN-PLANE | Z AXIAL DIRECTION | EMISSION EFFICIENCY [lm/W] | Ra | Tcp | u´ | v´ |
| EXAMPLE B1 | BLUE LED | – | 5.76 | – | 1.32 | 501.2 | 490.9 | FIG. 16 | FIG. 15 | FIG. 14 | 53.5 | 70.0 | 4934 | 0.203 | 0.500 |
| EXAMPLE B2 | BLUE LED | – | 7.70 | – | 1.13 | 490.0 | 492.7 | FIG. 11 | FIG. 10 | FIG. 9 | 35.8 | 68.8 | 4914 | 0.210 | 0.490 |
| EXAMPLE B3 | BLUE LED | – | 9.08 | – | 0.86 | 504.5 | 492.9 | FIG. 16 | FIG. 15 | FIG. 14 | 31.4 | 68.3 | 5050 | 0.209 | 0.487 |
| EXAMPLE B4 | BLUE LED | – | – | 3.51 | – | 501.7 | 501.4 | FIG. 16 | FIG. 15 | FIG. 14 | 76.4 | 16.3 | 5496 | 0.199 | 0.489 |
| EXAMPLE B5 | BLUE LED | – | 3.73 | 0.92 | 1.04 | 511.9 | 492.4 | FIG. 16 | FIG. 15 | FIG. 14 | 52.4 | 73.7 | 4865 | 0.211 | 0.490 |
| EXAMPLE B6 | BLUE LED | 77.73 | 4.97 | 0.18 | 1.61 | 503.7 | 509.1 | FIG. 16 | FIG. 15 | FIG. 14 | 40.2 | 75.1 | 4861 | 0.212 | 0.488 |
| EXAMPLE B7 | BLUE LED | – | 16.59 | – | 4.03 | 501.3 | 504.9 | FIG. 16 | FIG. 15 | FIG. 14 | 52.3 | 68.9 | 5070 | 0.207 | 0.490 |
| EXAMPLE B8 | BLUE LED | – | 41.00 | – | 10.22 | 489.2 | 511.5 | FIG. 16 | FIG. 15 | FIG. 14 | 52.0 | 68.4 | 5060 | 0.208 | 0.488 |
| EXAMPLE B9 | BLUE LED | – | 80.00 | – | 20.41 | 511.0 | 503.2 | FIG. 16 | FIG. 15 | FIG. 14 | 51.7 | 68.0 | 5001 | 0.210 | 0.487 |
| EXAMPLE B10 | BLUE VIOLET LED | 56.40 | 2.54 | – | 0.83 | 505.1 | 493.8 | FIG. 16 | FIG. 15 | FIG. 14 | 37.6 | 68.9 | 4972 | 0.209 | 0.490 |
| EXAMPLE B11 | BLUE LD | – | 5.44 | – | 1.32 | 510.2 | 487.9 | FIG. 16 | FIG. 15 | FIG. 14 | 17.5 | 67.4 | 5012 | 0.208 | 0.490 |
| EXAMPLE B12 | BLUE VIOLET LD | 63.45 | 2.55 | – | 0.89 | 493.8 | 493.5 | FIG. 16 | FIG. 15 | FIG. 14 | 15.9 | 65.5 | 4882 | 0.211 | 0.489 |
| EXAMPLE B13 | BLUE EL | – | 4.39 | – | 1.20 | 489.1 | 497.9 | FIG. 16 | FIG. 15 | FIG. 14 | 8.5 | 69.8 | 4982 | 0.210 | 0.488 |
| COMPARATIVE EXAMPLE B1 | BLUE LED | – | 9.65 | – | 0.92 | 508.5 | 497.1 | FIG. 53 | FIG. 51 | FIG. 50 | 27.1 | 68.5 | 4974 | 0.210 | 0.487 |
| COMPARATIVE EXAMPLE B2 | BLUE LED | – | 17.28 | – | 1.51 | 511.8 | 503.9 | FIG. 53 | FIG. 51 | FIG. 50 | 39.5 | 69.2 | 4958 | 0.209 | 0.490 |
| COMPARATIVE EXAMPLE B3 | BLUE LED | – | 42.41 | – | 3.83 | 510.2 | 510.5 | FIG. 53 | – | – | – | – | – | – | – |
| COMPARATIVE EXAMPLE B4 | BLUE EL | – | 72.91 | – | 7.02 | 491.1 | 488.9 | FIG. 53 | – | – | – | – | – | – | – |
| COMPARATIVE EXAMPLE B5 | BLUE VIOLET LED | 84.60 | 2.18 | – | 0.56 | 500.7 | 507.5 | FIG. 53 | FIG. 51 | FIG. 50 | 24.5 | 67.6 | 5036 | 0.210 | 0.486 |
| COMPARATIVE EXAMPLE B6 | BLUE LD | – | 10.65 | – | 0.84 | 507.6 | 501.8 | FIG. 53 | FIG. 51 | FIG. 50 | 8.4 | 67.4 | 5147 | 0.206 | 0.488 |
| COMPARATIVE EXAMPLE B7 | BLUE VIOLET LD | 77.55 | 2.12 | – | 0.54 | 505.0 | 504.7 | FIG. 53 | FIG. 51 | FIG. 50 | 10.7 | 69.2 | 4987 | 0.208 | 0.490 |
| COMPARATIVE EXAMPLE B8 | BLUE EL | – | 8.05 | – | 0.93 | 496.7 | 499.0 | FIG. 53 | FIG. 51 | FIG. 50 | 5.1 | 69.9 | 5048 | 0.207 | 0.489 |

| | SILICONE RESIN/ PHOSPHOR RATIO BY WEIGHT | FILM THICKNESS OF PART WHERE PHOSPHOR IS DISPERSED [μm] |
|---|---|---|
| EXAMPLE B1 | 140.1 | 166.2 |
| EXAMPLE B7 | 48.8 | 69.4 |
| EXAMPLE B8 | 19.5 | 43.7 |
| EXAMPLE B9 | 10.1 | 30.5 |
| COMPARATIVE EXAMPLE B1 | 95.2 | 115.3 |
| COMPARATIVE EXAMPLE B2 | 54.1 | 75.8 |
| COMPARATIVE EXAMPLE B3 | 22.1 | – |
| COMPARATIVE EXAMPLE B4 | 12.3 | – |

FIG.44

| | STRUCTURE OF IMAGE DISPLAY DEVICE | KIND OF EXCITATION SOURCE | WEIGHT OF PHOSPHOR [mg] | | | WEIGHT OF SILICONE RESIN [mg] | | MANUFACTURING METHOD FOR WAVELENGTH CONVERSION MEMBER | DISPERSED STATE OF PHOSPHOR | | OPTICAL CHARACTERISTICS | | | | |
|---|---|---|---|---|---|---|---|---|---|---|---|---|---|---|---|
| | | | BLUE | GREEN | RED | A LIQUID | B LIQUID | | XY IN-PLANE | Z AXIAL DIRECTION | SCREEN BRIGHTNESS [%] | NTSC RATIO [%] | COLOR TEMPERATURE | u′ | v′ |
| EXAMPLE C1 | FIG. 21 | BLUE LED | – | 4.12 | 0.75 | 500.5 | 498.9 | FIG. 16 | FIG. 15 | FIG. 14 | 142.4 | 108.2 | 9921 | 0.187 | 0.443 |
| EXAMPLE C2 | FIG. 21 | BLUE LED | – | 5.41 | 0.70 | 500.3 | 494.6 | FIG. 11 | FIG. 10 | FIG. 9 | 112.0 | 109.2 | 10110 | 0.189 | 0.440 |
| EXAMPLE C3 | FIG. 21 | BLUE VIOLET LED | 84.66 | 1.75 | 0.56 | 511.6 | 512.3 | FIG. 16 | FIG. 15 | FIG. 14 | 81.1 | 82.4 | 10038 | 0.188 | 0.441 |
| EXAMPLE C4 | FIG. 21 | BLUE LD | – | 4.25 | 0.79 | 507.7 | 507.1 | FIG. 16 | FIG. 15 | FIG. 14 | 47.5 | 110.6 | 9891 | 0.190 | 0.441 |
| EXAMPLE C5 | FIG. 21 | BLUE VIOLET LD | 84.66 | 1.65 | 0.55 | 511.9 | 509.2 | FIG. 16 | FIG. 15 | FIG. 14 | 33.9 | 79.6 | 10161 | 0.188 | 0.441 |
| EXAMPLE C6 | FIG. 26 | BLUE EL | – | 3.30 | 0.72 | 507.7 | 496.0 | FIG. 16 | FIG. 15 | FIG. 14 | 22.6 | 102.4 | 10038 | 0.189 | 0.441 |
| EXAMPLE C7 | FIG. 24 | BLUE LED | – | 4.37 | 0.82 | 504.8 | 505.3 | FIG. 16 | FIG. 15 | FIG. 14 | 127.3 | 112.7 | 10120 | 0.188 | 0.441 |
| EXAMPLE C8 | FIG. 24 | BLUE LED | – | 13.05 | 2.35 | 505.4 | 510.1 | FIG. 16 | FIG. 15 | FIG. 14 | 127.2 | 105.4 | 10150 | 0.186 | 0.442 |
| EXAMPLE C9 | FIG. 24 | BLUE LED | – | 32.54 | 6.22 | 489.2 | 497.0 | FIG. 16 | FIG. 15 | FIG. 14 | 126.2 | 104.5 | 9829 | 0.189 | 0.442 |
| EXAMPLE C10 | FIG. 24 | BLUE LED | – | 64.11 | 11.77 | 491.6 | 505.2 | FIG. 16 | FIG. 15 | FIG. 14 | 126.4 | 107.8 | 10349 | 0.187 | 0.440 |
| EXAMPLE C11 | FIG. 28 | BLUE EL | – | 3.60 | 0.79 | 501.7 | 495.1 | FIG. 16 | FIG. 15 | FIG. 14 | 20.6 | 103.7 | 9864 | 0.190 | 0.441 |
| COMPARATIVE EXAMPLE C1 | FIG. 21 | BLUE LED | – | 6.31 | 0.64 | 488.3 | 498.2 | FIG. 53 | FIG. 51 | FIG. 50 | 100.0 | 107.2 | 9907 | 0.187 | 0.443 |
| COMPARATIVE EXAMPLE C2 | FIG. 21 | BLUE VIOLET LED | 104.79 | 1.32 | 0.34 | 509.5 | 492.4 | FIG. 53 | FIG. 51 | FIG. 50 | 51.4 | 83.0 | 10066 | 0.188 | 0.441 |
| COMPARATIVE EXAMPLE C3 | FIG. 21 | BLUE LD | – | 6.72 | 0.64 | 489.2 | 496.5 | FIG. 53 | FIG. 51 | FIG. 50 | 32.6 | 111.4 | 10154 | 0.188 | 0.441 |
| COMPARATIVE EXAMPLE C4 | FIG. 21 | BLUE VIOLET LD | 109.90 | 1.19 | 0.33 | 510.7 | 493.7 | FIG. 53 | FIG. 51 | FIG. 50 | 20.6 | 80.1 | 10066 | 0.188 | 0.440 |
| COMPARATIVE EXAMPLE C5 | FIG. 26 | BLUE EL | – | 4.78 | 0.65 | 494.0 | 506.3 | FIG. 53 | FIG. 51 | FIG. 50 | 17.8 | 102.7 | 10223 | 0.187 | 0.441 |
| COMPARATIVE EXAMPLE C6 | FIG. 24 | BLUE LED | – | 7.01 | 0.65 | 498.8 | 504.5 | FIG. 53 | FIG. 51 | FIG. 50 | 87.2 | 108.6 | 9981 | 0.186 | 0.443 |
| COMPARATIVE EXAMPLE C7 | FIG. 24 | BLUE LED | – | 22.11 | 2.24 | 491.2 | 487.5 | FIG. 53 | FIG. 51 | FIG. 50 | 87.7 | 106.5 | 10197 | 0.187 | 0.441 |
| COMPARATIVE EXAMPLE C8 | FIG. 24 | BLUE LED | – | 50.29 | 5.26 | 498.4 | 508.4 | FIG. 53 | – | – | – | – | – | – | – |
| COMPARATIVE EXAMPLE C9 | FIG. 24 | BLUE LED | – | 101.25 | 10.62 | 487.6 | 498.8 | FIG. 53 | – | – | – | – | – | – | – |
| COMPARATIVE EXAMPLE C10 | FIG. 28 | BLUE EL | – | 5.38 | 0.69 | 501.3 | 497.2 | FIG. 53 | FIG. 51 | FIG. 50 | 15.8 | 106.8 | 9918 | 0.187 | 0.443 |

|  | SILICONE RESIN/ PHOSPHOR RATIO BY WEIGHT | FILM THICKNESS OF PART WHERE PHOSPHOR IS DISPERSED [$\mu$m] |
|---|---|---|
| EXAMPLE C7 | 205.3 | 229.8 |
| EXAMPLE C8 | 65.9 | 87.6 |
| EXAMPLE C9 | 25.4 | 46.4 |
| EXAMPLE C10 | 13.1 | 33.8 |
| COMPARATIVE EXAMPLE C6 | 142.0 | 165.2 |
| COMPARATIVE EXAMPLE C7 | 40.2 | 61.4 |
| COMPARATIVE EXAMPLE C8 | 18.1 | – |
| COMPARATIVE EXAMPLE C9 | 8.8 | – |

WAVELENGTH CONVERSION MEMBER, LIGHT EMITTING DEVICE AND IMAGE DISPLAY DEVICE, AND METHOD FOR MANUFACTURING WAVELENGTH CONVERSION MEMBER

REFERENCE TO RELATED APPLICATIONS

This application is a national stage application under 35 USC 371 of International Application No. PCT/JP2011/054270, filed Feb. 25, 2011, which claims priority from Japanese Patent Application Nos. 2010-046147, filed Mar. 3, 2010, and 2011-030333, filed Feb. 16, 2011, the entire contents of which are incorporated herein by reference.

FIELD OF THE INVENTION

The present invention relates to a wavelength conversion member that converts wavelength of at least part of input light and outputs the resultant light, and a light emitting device and an image display device having the same, and more specifically, to a wavelength conversion member containing a semiconductor fine particle phosphor dispersed in a light transmissive member, and a light emitting device and an image display device including the same. Also, the present invention relates to a method for manufacturing the wavelength conversion member.

BACKGROUND OF THE INVENTION

Recently, as a light emitting element, a light emitting diode (LED) element formed of a gallium nitride-based compound semiconductor material attracts an attention. The light emitting diode element has characteristics of small size, light weight, power saving, long product life, resistance to repeated on/off lighting and so on. Therefore, by combining a light emitting diode element that radiates blue light or ultraviolet light, and various phosphors that emit light by excitation by part of the light radiated from the light emitting diode element as an excitation source, a light emitting device that outputs light of different color from that of light emitted by the light emitting diode element including white is developed. For such a light emitting device, not only use as an illumination device that is alternative to an incandescent bulb or a fluorescent lamp is expected, but also use as a light source of an image display device is expected.

As a phosphor used for such a light emitting device, semiconductor fine particle phosphors attract attention as an alternative to rare earth-activated phosphors that have been conventionally used. The semiconductor fine particle phosphors have such a feature that emission wavelength can be appropriately adjusted, that is not realized by conventional phosphors. Therefore, a light emitting device using such a semiconductor fine particle phosphor is able to have various emission spectrums. Therefore, use of a semiconductor fine particle phosphor is expected as a technique that enables production of a light emitting device having high color rendition and high efficiency.

Currently, the development of the aforementioned light emitting device having a light emitting diode element and a semiconductor fine particle phosphor is advanced, and a concrete constitution thereof is disclosed, for example, in Japanese Patent Laying-Open No. 2005-285800 (Patent document 1) and so on. In the light emitting device disclosed in Japanese Patent Laying-Open No. 2005-285800, it is intended to realize high emission efficiency by combining a light emitting diode element that outputs blue-violet excitation light, with a wavelength conversion member constituted by dispersing three or four kinds of semiconductor fine particle phosphors.

PTL 1: Japanese Patent Laying-Open No. 2005-285800

SUMMARY OF THE INVENTION

However, when such a constitution as that of the light emitting device disclosed in the above Japanese Patent Laying-Open No. 2005-285800 is employed, it becomes difficult to realize sufficiently high emission efficiency due to concentration quenching. Here, concentration quenching means a phenomenon that emission efficiency is saturated when concentration of semiconductor fine particle phosphor in a wavelength conversion member is increased.

The present invention was devised to solve the aforementioned problems, and it is an object of the present invention to provide a wavelength conversion member having high emission efficiency, and a light emitting device and an image display device including the same, and to provide a method for manufacturing a wavelength conversion member having high emission efficiency.

As a result of diligent effort, the present inventor elucidated that a wavelength conversion member having high emission efficiency can be realized by providing dispersion concentration and/or particle number of semiconductor fine particle phosphor in the wavelength conversion member with specific anisotropy, and accomplished the present invention.

A wavelength conversion member based on a first aspect includes: a light transmissive member including a light input plane into which light is inputted, and a light output plane from which light is outputted; and a semiconductor fine particle phosphor dispersed inside the light transmissive member, for absorbing excitation light and emitting light after converting wavelength of the same, wherein dispersion concentration of the semiconductor fine particle phosphor in a direction, which connects the light input plane and the light output plane, parallel to a light traveling direction is lower than dispersion concentration of the semiconductor fine particle phosphor in a direction orthogonal to the light traveling direction.

In the wavelength conversion member based on the first aspect, it is preferred that the semiconductor fine particle phosphor is regularly arrayed in the plane that is orthogonal to the light traveling direction, and in this case, it is preferred that the semiconductor fine particle phosphor is packed in the form of hexagonal lattice or cubic lattice in the plane that is orthogonal to the light traveling direction.

In the wavelength conversion member based on the first aspect, it is preferred that the semiconductor fine particle phosphor is localized either on the side of the light input plane or on the side of the light output plane in the light transmissive member.

In the wavelength conversion member based on the first aspect, as the semiconductor fine particle phosphor, a plurality of kinds of semiconductor fine particle phosphors having different emission wavelengths may be contained.

When the wavelength conversion member based on the first aspect contains a plurality of kinds of semiconductor fine particle phosphors having different wavelengths as the semiconductor fine particle phosphor, it is preferred that the plurality of kinds of semiconductor fine particle phosphors having different wavelengths are arranged in the form of layers along the light traveling direction while they are separated by kind. In this case, it is preferred that respective layers of the plurality of kinds of semiconductor fine particle phosphors arranged in the form of layers while they are separated by kind are arrayed so that emission wavelength of the semiconductor fine particle phosphor contained in each layer decreases from the side of the light input plane to the side of the light output plane, or respective layers of the plurality of kinds of semiconductor fine particle phosphors arranged in the form of layers while they are separated by kind are arrayed so that particle size of the semiconductor fine particle phosphor contained in each layer decreases from the side of the light input plane to the side of the light output plane.

In the wavelength conversion member based on the first aspect, it is preferred that the semiconductor fine particle phosphor emits visible light by absorbing excitation light and converting wavelength of the same.

In the wavelength conversion member based on the first aspect, it is preferred that absorbance per 1 µm along the light traveling direction is greater than or equal to 0.02.

The wavelength conversion member based on the first aspect preferably has a thickness along the light traveling direction of greater than or equal to 0.5 nm and less than or equal to 50 µm, and absorbing greater than or equal to 90% of inputted excitation light and converting wavelength of the same.

In the wavelength conversion member based on the first aspect, it is preferred that the semiconductor fine particle phosphor has a core part formed of a semiconductor material, and a shell part that covers the core part, and is formed of a material different from that of the core part. In this case, it is preferred that the core part is formed of a material selected from the group consisting of a III-V group compound semiconductor material, InP, InN, mixed crystal of InP and mixed crystal of InN.

A light emitting device based on a first aspect includes: the wavelength conversion member based on the first aspect as described above; and a light emitting element that irradiates the light input plane of the wavelength conversion member with excitation light.

In the light emitting device based on the first aspect, it is preferred that the light emitting element is a semiconductor light emitting diode element or a semiconductor laser diode element or an organic electroluminescence element.

In the light emitting device based on the first aspect, it is preferred that emission spectrum of the light emitting element has a peak wavelength of greater than or equal to 350 nm and less than or equal to 420 nm or a peak wavelength of greater than or equal to 420 nm and less than or equal to 480 nm.

An image display device based on a first aspect includes: an image display part capable of displaying image; and an irradiation part for irradiating the image display part with light from behind, the image display part including the wavelength conversion member based on the first aspect as described above, the irradiation part including a light emitting element for irradiating the light input plane of the wavelength conversion member with excitation light.

An image display device based on a second aspect includes: an image display part capable of displaying image; and an irradiation part for irradiating the image display part with light from behind, the irradiation part including the wavelength conversion member based on the first aspect as described above, and a light emitting element for irradiating the light input plane of the wavelength conversion member with excitation light.

In the image display devices based on the first and second aspects, it is preferred that the light emitting element is a semiconductor light emitting diode element or a semiconductor laser diode element or an organic electroluminescence element.

In the image display devices based on the first and second aspects, it is preferred that emission spectrum of the light emitting element has a peak wavelength of greater than or equal to 350 nm and less than or equal to 420 nm, or a peak wavelength of greater than or equal to 420 nm and less than or equal to 480 nm.

A method for manufacturing a wavelength conversion member based on a first aspect is a method for manufacturing the wavelength conversion member based on the first aspect as described above, and includes the steps of: producing the semiconductor fine particle phosphor; preparing a dispersed liquid containing the semiconductor fine particle phosphor dispersed in a liquid; and aggregating and precipitating the semiconductor fine particle phosphor in the dispersed liquid to make it self-organize.

In the method for manufacturing the wavelength conversion member based on the first aspect, it is preferred that in the step of preparing the dispersed liquid, a volatile solvent is used as a liquid for dispersing the semiconductor fine particle phosphor, and in this case, it is preferred that the method for manufacturing the wavelength conversion member based on the first aspect further includes the step of: volatilizing the volatile solvent after self-organization of the semiconductor fine particle phosphor and then sealing the self-organized semiconductor fine particle phosphor with a light transmissive resin.

On the other hand, a wavelength conversion member based on a second aspect includes: a wavelength conversion layer including a light input plane into which light is inputted, and a light output plane from which light is outputted; and a semiconductor fine particle phosphor situated in the wavelength conversion layer, for absorbing excitation light and emitting light after converting wavelength of the same, wherein the wavelength conversion layer is constituted by an aggregate of the semiconductor fine particle phosphor, and a number of particles of the semiconductor fine particle phosphor in a direction, which connects the light input plane and the light output plane, parallel to a light traveling direction is smaller than a number of particles of the semiconductor fine particle phosphor in a direction orthogonal to the light traveling direction.

In the wavelength conversion member based on the second aspect, it is preferred that the semiconductor fine particle phosphor is laminated plurally in a direction parallel to the light traveling direction.

In the wavelength conversion member based on the second aspect, it is preferred that the semiconductor fine particle phosphor is regularly arrayed in the plane that is orthogonal to the light traveling direction, and in this case, it is preferred that the semiconductor fine particle phosphor is packed in the form of hexagonal lattice or cubic lattice in the plane that is orthogonal to the light traveling direction.

In the wavelength conversion member based on the second aspect, as the semiconductor fine particle phosphor, a plurality of kinds of semiconductor fine particle phosphors having different emission wavelengths may be contained.

When the wavelength conversion member based on the second aspect contains a plurality of kinds of semiconductor fine particle phosphors having different wavelengths as the semiconductor fine particle phosphor, it is preferred that the plurality of kinds of semiconductor fine particle phosphors having different wavelengths are arranged in the form of layers along the light traveling direction while they are separated by kind. In this case, it is preferred that respective layers of the plurality of kinds of semiconductor fine particle phosphors arranged in the form of layers while they are separated by kind are arrayed so that emission wavelength of the semiconductor fine particle phosphor contained in each layer decreases from the side of the light input plane to the side of the light output plane, or respective layers of the plurality of kinds of semiconductor fine particle phosphors arranged in the form of layers while they are separated by kind are arrayed so that particle size of the semiconductor fine particle phosphor contained in each layer decreases from the side of the light input plane to the side of the light output plane.

In the wavelength conversion member based on the second aspect, it is preferred that the semiconductor fine particle phosphor emits visible light by absorbing excitation light and converting wavelength of the same.

In the wavelength conversion member based on the second aspect, it is preferred that absorbance per 1 µm along the light traveling direction is greater than or equal to 0.02.

The wavelength conversion member based on the second aspect preferably has a thickness along the light traveling direction of greater than or equal to 0.5 nm and less than or equal to 50 µm, and absorbing greater than or equal to 90% of inputted excitation light and converting wavelength of the same.

In the wavelength conversion member based on the second aspect, it is preferred that the semiconductor fine particle phosphor has a core part formed of a semiconductor material, and a shell part that covers the core part, and is formed of a material different from that of the core part. In this case, it is preferred that the core part is formed of material selected from the group consisting of a III-V group compound semiconductor material, InP, InN, mixed crystal of InP and mixed crystal of InN.

In the wavelength conversion member based on the second aspect, it is preferred that the wavelength conversion layer constituted by an aggregate of the semiconductor fine particle phosphor so as to cover the light input plane and the light output plane is sandwiched between a pair of light transmissive members.

A light emitting device based on a second aspect includes: the wavelength conversion member based on the second aspect as described above; and a light emitting element for irradiating the light input plane of the wavelength conversion member with excitation light.

In the light emitting device based on the second aspect, it is preferred that the light emitting element is a semiconductor light emitting diode element or a semiconductor laser diode element or an organic electroluminescence element.

In the light emitting device based on the second aspect, it is preferred that emission spectrum of the light emitting element has a peak wavelength of greater than or equal to 350 nm and less than or equal to 420 nm, or a peak wavelength of greater than or equal to 420 nm and less than or equal to 480 nm.

An image display device based on a third aspect includes: an image display part capable of displaying image; and an irradiation part for irradiating the image display part with light from behind, the image display part including the wavelength conversion member based on the second aspect as described above, the irradiation part including a light emitting element for irradiating the light input plane of the wavelength conversion member with excitation light.

An image display device based on a fourth aspect includes: an image display part capable of displaying image; and an irradiation part for irradiating the image display part with light from behind, the irradiation part including the wavelength conversion member based on the second aspect as described above, and a light emitting element for irradiating the light input plane of the wavelength conversion member with excitation light.

In the image display devices based on the third and fourth aspects, it is preferred that the light emitting element is a semiconductor light emitting diode element or a semiconductor laser diode element or an organic electroluminescence element.

In the image display devices based on the third and fourth aspects, it is preferred that emission spectrum of the light emitting element has a peak wavelength of greater than or equal to 350 nm and less than or equal to 420 nm, or a peak wavelength of greater than or equal to 420 nm and less than or equal to 480 nm.

A method for manufacturing a wavelength conversion member based on a second aspect is a method for manufacturing the wavelength conversion member based on the second aspect as described above, and includes the steps of: producing the semiconductor fine particle phosphor; preparing a dispersed liquid containing the semiconductor fine particle phosphor dispersed in a liquid; and aggregating and precipitating the semiconductor fine particle phosphor in the dispersed liquid to make it self-organize.

In the method for manufacturing the wavelength conversion member based on the second aspect, it is preferred that in the step of preparing the dispersed liquid, a volatile solvent is used as a liquid for dispersing the semiconductor fine particle phosphor, and in this case, it is preferred that the method for manufacturing the wave conversion member based on the second aspect further includes the step of: producing the wavelength conversion layer constituted by an aggregate of the semiconductor fine particle phosphor by volatilizing the volatile solvent after self-organization of the semiconductor fine particle phosphor.

According to the present invention, it is possible to provide a wavelength conversion member having high emission efficiency and a light emitting device and an image display device including the same.

BRIEF DESCRIPTION OF THE DRAWINGS

FIG. 30 is a table collectively showing compositions, manufacturing methods, characteristics and the like of wavelength conversion members according to Examples A1 to A18 and Comparative Examples A1 to A10.

FIG. 35 is a table showing results of various experimental manufactures in Examples A1, A12 to A14 and Comparative Examples A1, A8 to A10.

FIG. 37 is a table collectively showing compositions and manufacturing methods of wavelength conversion members of light emitting devices according to Examples B1 to B13 and Comparative Examples B1 to B8, and optical characteristics and so on of the light emitting devices.

FIG. 44 is a table collectively showing compositions and manufacturing methods of wavelength conversion members of image display devices according to Examples C1 to C11 and Comparative Examples C1 to C10, and optical characteristics and so on of the image display devices.

DETAILED DESCRIPTION OF THE INVENTION

In the following, embodiments of the present invention will be specifically described with reference to drawings. In the following embodiments, wavelength conversion members to which the present invention is applied are exemplarily described as Embodiments 1 to 7 and 15, light emitting devices to which the present invention is applied are exemplarily described as Embodiments 8 to 10, and image display devices to which the present invention is applied are exemplarily described as Embodiments 11 to 14.

Figure 1:
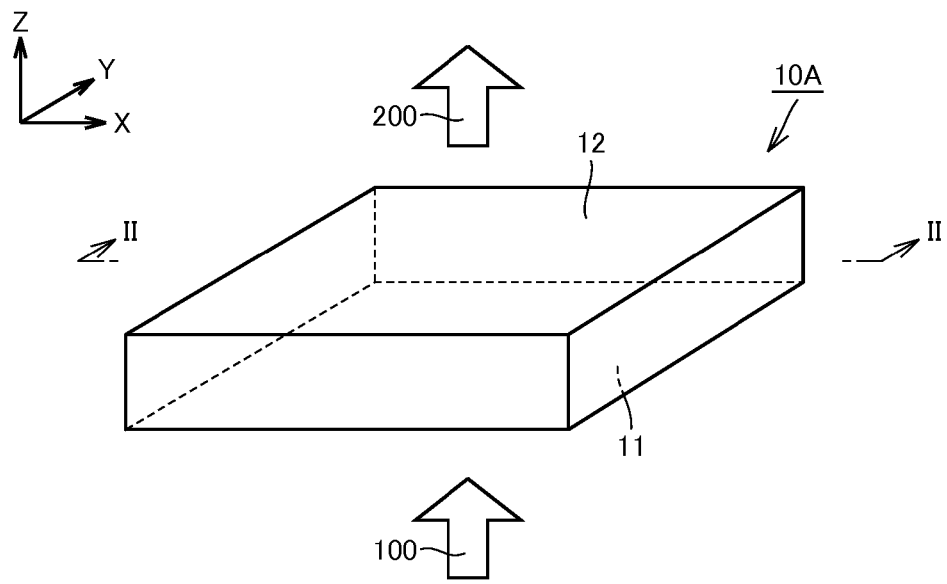
FIG. 1 is a schematic perspective view of a wavelength conversion member in Embodiment 1 of the present invention.
Figure 2:
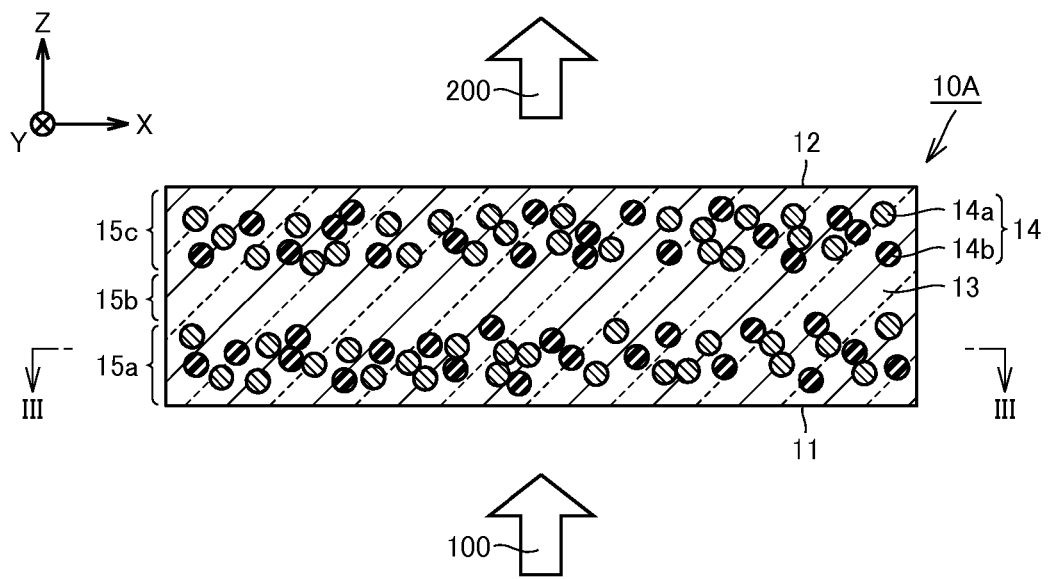
FIG. 2 is a schematic section view of the wavelength conversion member in Embodiment 1 of the present invention, cut along the XZ plane.
Figure 3:
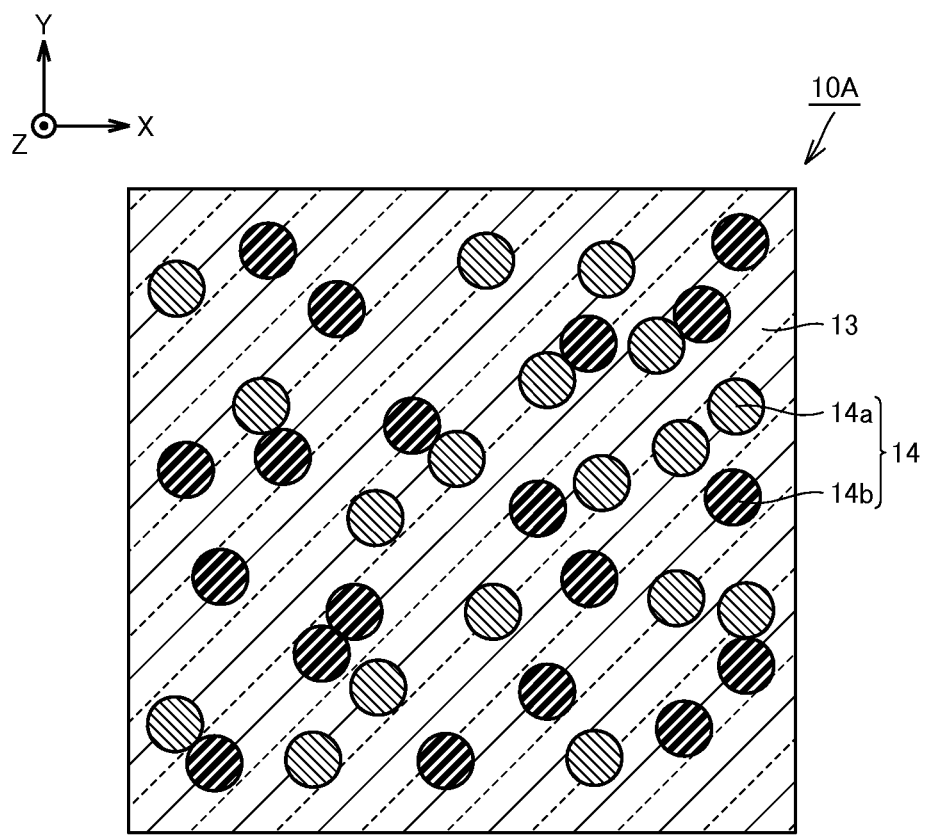
FIG. 3 is a schematic section view of the wavelength conversion member in Embodiment 1 of the present invention, cut along the XY plane.

FIG. 1 is a schematic perspective view of a wavelength conversion member in Embodiment 1 of the present invention. FIG. 2 is a schematic section view of the wavelength conversion member in the present embodiment, cut along the XZ plane. FIG. 3 is a schematic section view of the wavelength conversion member in the present embodiment, cut along the XY plane. The section shown in FIG. 2 is a schematic section along the line II-II shown in FIG. 1. The section shown in FIG. 3 is a schematic section along the line III-III shown in FIG. 2. First, with reference to these FIG. 1 to FIG. 3, structure of the wavelength conversion member in the present embodiment will be described.

As shown in FIG. 1, a wavelength conversion member 10A in the present embodiment is formed from a member in the shape of a substantially rectangular parallelepiped having a predetermined thickness, and has a function of absorbing at least part of input light and outputting light having a wavelength that is different from the wavelength of the absorbed light. Wavelength conversion member 10A has its one principal plane as a light input plane 11, and its other principal plane as a light output plane 12.

Light input plane 11 of wavelength conversion member 10A is irradiated with excitation light 100 outputted from a light emitting element. Excitation light 100 irradiating light input plane 11 is introduced into wavelength conversion member 10A, and wavelength of part of the introduced light is converted in wavelength conversion member 10A. From light output plane 12 of wavelength conversion member 10A, light containing light after wavelength conversion as described above is outputted outside as wavelength converted light 200.

Here, as shown in FIG. 1, among translational three axes that are orthogonal to one another (X axis, Y axis and Z axis), when light axes of excitation light 100 and wavelength converted light 200 are defined in the Z axial direction, both light input plane 11 and light output plane 12 as described above are configured on the XY plane that is orthogonal to the Z axis.

While wavelength conversion member 10A depicted in the drawing has a flattened plate-like profile, the shape of the wavelength conversion member is not limited to this shape, and may be of any profiles including a rectangular parallelepiped shape, a disc-like shape, a cylindrical shape and a prism-like shape other than the plate-like shape.

As shown in FIG. 2 and FIG. 3, wavelength conversion member 10A mainly has a light transmissive member 13 and a semiconductor fine particle phosphor 14. Semiconductor fine particle phosphor 14 emits light having a different wavelength by absorbing excitation light 100 introduced into wavelength conversion member 10A and converting the wavelength of the light, and is a member principally formed of semiconductor microcrystalline particles. Semiconductor fine particle phosphor 14 is dispersed inside wavelength conversion member 10A. On the other hand, light transmissive member 13 is provided for sealing semiconductor fine particle phosphor 14 while it is dispersed, and is formed from a member that will not absorb excitation light 100 introduced into wavelength conversion member 10A and light emitted from semiconductor fine particle phosphor 14.

More specifically, light transmissive member 13 is preferably formed of a material that will not transmit moisture and oxygen. With such a constitution, moisture and oxygen are prevented from entering inside wavelength conversion member 10A by light transmissive member 13, so that it is possible to alleviate influence of moisture and oxygen on semiconductor fine particle phosphor 14, and to improve the durability of semiconductor fine particle phosphor 14.

As a material for light transmissive member 13 satisfying the condition as described above, for example, light transmissive resin materials such as silicone resin, epoxy resin, acryl resin, fluorine resin, polycarbonate resin, polyimide resin, urea resin and so on, and light transmissive inorganic materials such as aluminum oxide, silicon oxide, yttria and so on can be recited.

Figure 4A:
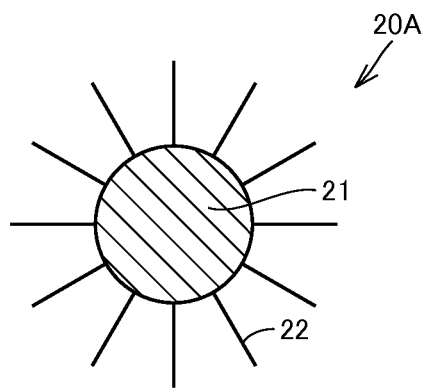
FIG. 4A is a schematic section view of a semiconductor fine particle phosphor shown in FIG. 2 and FIG. 3.
Figure 4B:
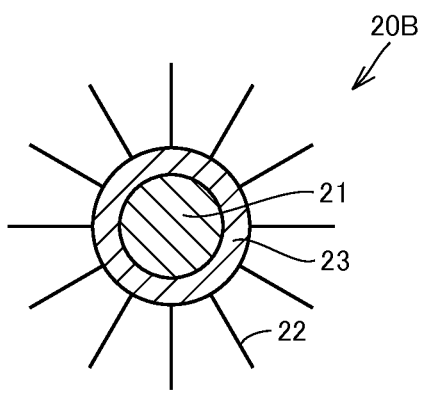
FIG. 4B is a schematic section view of a semiconductor fine particle phosphor shown in FIG. 2 and FIG. 3.

FIG. 4A and FIG. 4B are schematic section views of the semiconductor fine particle phosphors shown in FIG. 2 and FIG. 3. As a semiconductor fine particle phosphor included in the wavelength conversion member in the present embodiment, those having various structures may be used, and in the following, semiconductor fine particle phosphors having particularly preferred structures will be specifically described with reference to FIG. 4A and FIG. 4B.

A semiconductor fine particle phosphor 20A shown in FIG. 4A is a semiconductor fine particle phosphor having structure generally called a core structure. As depicted in the drawing, semiconductor fine particle phosphor 20A having the core structure has a core part 21 which is a light emitting part. Core part 21 is formed of a semiconductor microcrystalline particle having a particle size of about several nanometers, and is a site where recombination of an electron and a hole occurs to emit light.

Also as depicted in the drawing, surface of core part 21 of semiconductor fine particle phosphor 20A may be provided with an organic compound 22 that binds with core part 21. By selecting an appropriate substance as organic compound 22, it becomes possible to adjust dispersivity in dispersing the semiconductor microcrystalline phosphors into liquid or solid. Also, by selecting an appropriate substance as organic compound 22, it is possible to add a function of confining an electron inside the semiconductor fine particle phosphor, and a function of protecting the semiconductor fine particle phosphor from external adverse effect, and a function of suppressing aggregation of the semiconductor fine particle phosphor.

A semiconductor fine particle phosphor 20B shown in FIG. 4B is a semiconductor fine particle phosphor having structure generally called a core/shell structure. As depicted, semiconductor fine particle phosphor 20B having the core/shell structure has core part 21 which is a light emitting part and a shell part 23 covering core part 21. Here, core part 21 is formed of a semiconductor microcrystalline particle having a particle size of about several nanometers, and is a site where recombination of an electron and a hole occurs to emit light. On the other hand, shell part 23 is formed of a material different from that of core part 21, and is a site having a function of protecting core part 21 from external adverse effect. Here, shell part 23 is preferably formed of a material having larger band gap energy than core part 21. With such a constitution, a function of confining an electron and a hole inside a semiconductor fine particle phosphor is exerted, and it becomes possible to reduce loss of electrons and holes by non-light emitting transition, so that emission efficiency is improved.

Also as depicted, semiconductor fine particle phosphor 20B may have, on surface of shell part 23, organic compound 22 that binds with shell part 23. By selecting an appropriate substance as organic compound 22, it becomes possible to adjust dispersivity in dispersing the semiconductor fine particle phosphors into liquid or solid. Also, by selecting an appropriate substance as organic compound 22, it is possible to add a function of confining an electron inside the semiconductor fine particle phosphor, and a function of protecting the semiconductor fine particle phosphor from external adverse effect, and a function of suppressing aggregation of the semiconductor fine particle phosphor.

While omitted in the drawing, as semiconductor fine particle phosphor 14 included in wavelength conversion member 10A in the present embodiment, a semiconductor fine particle phosphor having a multi-shell structure may be used besides semiconductor fine particle phosphors 20A, 20B having the core structure and the core/shell structure as described above. Concrete examples of the semiconductor fine particle phosphor having the multi-shell structure include semiconductor fine particle phosphors having a core/shell/shell structure where a shell part formed of different material is further provided outside shell part 23 of semiconductor fine particle phosphor 20B having the above core/shell structure and having a shell/core/shell structure where a shell part is arranged in the center part, and a core part is provided so as to cover the same, and a shell part is provided so as to cover outside the core part.

When the semiconductor fine particle phosphor having the core/shell/shell structure is used, the shell part situated on the outer side protects the shell part situated on the inner side, so that durability of the semiconductor fine particle phosphor is improved. When the semiconductor fine particle phosphor having the shell/core/shell structure is used, since inside and outside the core part are enclosed by the shell parts, it is possible to obtain an electron confining effect that is much better than the core/shell structure, and emission efficiency of the semiconductor fine particle phosphor is improved.

As semiconductor fine particle phosphor 14 described above, those having various shapes such as columnar, cubic, regular tetrahedral and the like may be used besides those having spherical shapes as shown in FIG. 2 and FIG. 3, and the shape is not particularly limited. However, when those having a spherical shape as depicted in the drawing are used, a proportion of surface area to volume is smaller than that in other shape, so that probability of non-light emitting transition in the surface is small, and as a result, a semiconductor fine particle phosphor having high emission efficiency can be realized.

Here, arbitrary shapes may be employed for both the shape of the core part and the shape of the shell part included in semiconductor fine particle phosphor 14. However, as a shape of a shell part that covers a core part, the shape covering the entire surface of the core part is preferred. This is because with such a constitution, a defect existing in the surface of the core part is covered with the shell part and inactivated, and hence emission efficiency can be improved.

A semiconductor microcrystalline particle forming a core part is sometimes called a colloid particle or a nanoparticle or a quantum dot or the like.

Semiconductor fine particle phosphor 14 included in wavelength conversion member 10A in the present embodiment is featured in that emission wavelength can be arbitrarily adjusted in comparison with other phosphor such as rare earth-activated phosphor or the like that is conventionally used. This is because a quantum confining effect that arises when the particle size (diameter) of the semiconductor microcrystalline particle is decreased to twice or less the Bohr radius can be utilized. As to the core part of the semiconductor fine particle phosphor, the band gap energy of the core part changes by the quantum confining effect depending on the particle size. Therefore, by varying the band gap energy by adjusting the particle size, it is possible to arbitrarily adjust the emission wavelength. Also, when a mixed crystal material is used in the core part of the semiconductor fine particle phosphor, it is possible to arbitrarily adjust emission wavelength by adjusting the mixed crystal ratio of the mixed crystal material.

Also, as semiconductor fine particle phosphor 14 included in wavelength conversion member 10A in the present embodiment, those having any emission wavelength may be used depending on its use, and in particular, those including a visible light wavelength as emission wavelength are preferably used. This is because by using a semiconductor fine particle phosphor having emission wavelength in the visible light wavelength region, it is possible to realize a wavelength conversion member, a light emitting device, an image display device and the like having excellent characteristics. As a concrete example of emission wavelength of semiconductor fine particle phosphor 14, a wavelength region of 420 to 480 nm in the case of a blue light emitting phosphor, a wavelength region of 500 to 565 nm in the case of a green light emitting phosphor, a wavelength region of 565 to 585 nm in the case of a yellow light emitting phosphor, and a wavelength region of 595 to 720 nm in the case of a red light emitting phosphor are exemplified.

As for semiconductor fine particle phosphor 14 included in wavelength conversion member 10A in the present embodiment, its half band width of emission spectrum is not limited, and from the view point of manufacture of a light emitting device, a larger half band width is preferred. This is because when the half band width of emission spectrum of semiconductor fine particle phosphor 14 is large, it is possible to manufacture a light emitting device having high color rendition with less kinds of semiconductor fine particle phosphors. In such a case, as a concrete example of the half band width of emission spectrum, greater than or equal to 40 nm is preferred, greater than or equal to 60 nm is more preferred, and greater than or equal to 80 nm is further preferred. On the other hand, from the view point of manufacture of an image display device, the half band width of semiconductor fine particle phosphor 14 included in wavelength conversion member 10A in the present embodiment is preferably narrow. This is because when the half band width of emission spectrum of semiconductor fine particle phosphor 14 is narrow, an image display device having high color reproducibility can be manufactured. In this case, as a concrete example of the half band width of emission spectrum, less than or equal to 80 nm is preferred, less than or equal to 60 nm is more preferred, and less than or equal to 40 nm is further preferred.

As semiconductor fine particle phosphor 14 included in wavelength conversion member 10A in the present embodiment, band gap energy of the core part included in semiconductor fine particle phosphor 14 is not limited, and more preferably, the one having a band gap energy of less than or equal to 2.9 eV is used. This is because when the band gap energy of the core part of the semiconductor fine particle phosphor exceeds 2.9 eV, human visibility greatly decreases, and optical characteristics of the wavelength conversion member, the light emitting device, the image display device and the like are deteriorated.

As semiconductor fine particle phosphor 14 included in wavelength conversion member 10A in the present embodiment, its average particle size is not limited, and the one having an average particle size of the core part of twice or less the Bohr radius is more preferably used. This is because by setting the average particle size of the core part twice or less the Bohr radius as described above, high quantum confining effect is obtained, and the band gap energy can be readily adjusted. Bohr radii of InP, InN, and CdSe that are representative materials used for the core part are 8.3 nm, 7.0 nm, and 4.9 nm, respectively.

Here, variation in particle size of the core part of the semiconductor fine particle phosphor greatly influences on emission spectrum of the semiconductor fine particle phosphor. Concretely, when variation in particle size of the core part of the semiconductor fine particle phosphor is large, half band width of emission spectrum of the semiconductor fine particle phosphor is large, whereas when variation in particle size of the core part of the semiconductor fine particle phosphor is small, half band width of emission spectrum of the semiconductor fine particle phosphor is small. Therefore, it is preferred to adjust the particle size distribution so that half band width of emission spectrum of the semiconductor fine particle phosphor that is required for the particular use.

As a method for adjusting average particle size and particle size distribution of the core part of the semiconductor fine particle phosphor, conventionally known classification methods may be used, and as such classification methods, for example, electrophoresis, size selective precipitation, light-assisted etching and the like may be used.

As semiconductor fine particle phosphor 14 included in wavelength conversion member 10A in the present embodiment, band gap energy of the shell part included in semiconductor fine particle phosphor 14 is not limited, and is preferably larger than band gap energy of the core part. With such a constitution, it is possible to obtain high effect of confining an exciton generated by light absorption in the core part, so that the semiconductor fine particle phosphor emits light efficiently.

As a material of the core part of semiconductor fine particle phosphor 14 included in wavelength conversion member 10A in the present embodiment, for example, a IV group semiconductor or IV-IV group semiconductor material, a III-V group compound semiconductor material, a II-VI group compound semiconductor material, a I-VIII group compound semiconductor material, a IV-VI group compound semiconductor material and so on are exemplified. As a material of the core part, an elemental semiconductor where the mixed crystal is formed of one kind of element, a binary compound semiconductor where the mixed crystal is formed of two kinds of elements, and a mixed crystal semiconductor where the mixed crystal is formed of three or more kinds of elements may be used. From the view point of improving emission efficiency of the wavelength conversion member, the light emitting device, or the image display device, it is preferred to form the core part by using a semiconductor fine particle formed of a direct transition type semiconductor material.

As a semiconductor fine particle forming the core part, it is preferred to use those emitting visible light as described above. From the view point of durability, it is preferred to use a III-V group compound semiconductor material having strong atomic binding force and high chemical stability. For facilitating adjustment of peak wavelength of emission spectrum of semiconductor fine particle phosphor 14, it is preferred to form the core part using a mixed crystal semiconductor material as described above. On the other hand, for further facilitating manufacture, it is preferred to form the core part using a semiconductor fine particle phosphor formed of quaternary or less mixed crystal.

As a semiconductor material formed of a binary compound that may be used as the core part of semiconductor fine particle phosphor 14 described above, for example, InP, InN, InAs, GaAs, CdSe, CdTe, ZnSe, ZnTe, PbS, PbSe, PbTe, CuCl and the like can be recited. However, from the view point of safety to human body and environmental load, it is preferred to use InP or InN as a material of the core part. From the view point of facility of manufacture, CdSe or CdTe is preferably used as a material of the core part.

As a semiconductor material of tertiary mixed crystal that may be used as the core part of semiconductor fine particle phosphor 14 described above, for example, InGaP, AlInP, InGaN, AlInN, ZnCdSe, ZnCdTe, PbSSe, PbSTe, PbSeTe and so on can be recited. Here, for manufacturing a semiconductor fine particle phosphor that is compatible to the environment and unsusceptible to the external world, it is preferred to form the core part using a III-V group mixed crystal semiconductor fine particle formed of InGaP or InGaN.

As a material of the shell part of semiconductor fine particle phosphor 14 included in wavelength conversion member 10A in the present embodiment, for example, a IV group semiconductor or IV-IV group semiconductor material, a III-V group compound semiconductor material, a II-VI group compound semiconductor material, a I-VIII group compound semiconductor material, a IV-VI group compound semiconductor material and so on are exemplified. As a material of the shell part, an elemental semiconductor where the mixed crystal is formed of one kind of element, a binary compound semiconductor where the mixed crystal is formed of two kinds of elements, and a mixed crystal semiconductor where the mixed crystal is formed of three or more kinds of elements may be used. From the view point of improving emission efficiency of the wavelength conversion member, the light emitting device, or the image display device, it is preferred to use, as a material of the shell part, a semiconductor material having higher band gap energy than the material of the core part.

As a semiconductor fine particle forming the shell part, it is preferred to use a III-V group compound semiconductor material having strong atomic binding force and high chemical stability, from the view point of protective function of the core part as described above. On the other hand, for further facilitating manufacture, it is preferred to form the shell part using a semiconductor fine particle phosphor formed of quaternary or less mixed crystal.

As a semiconductor material formed of a binary compound that may be used as the shell part of semiconductor fine particle phosphor 14 described above, for example, AlP, GaP, AlN, GaN, AlAs, ZnO, ZnS, ZnSe, ZnTe, MgO, MgS, MgSe, MgTe, CuCl and the like can be recited. However, from the view point of safety to human body and environmental load, it is preferred to use AlP, GaP, AlN, GaN, ZnO, ZnS, ZnSe, ZnTe, MgO, MgS, MgSe, MgTe, CuCl, SiC as a material of the shell part.

As a semiconductor material of tertiary mixed crystal that may be used as the core part of semiconductor fine particle phosphor 14 described above, for example, AlGaN, GaInN, ZnOS, ZnOSe, ZnOTe, ZnSSe, ZnSTe, ZnSeTe and the like can be recited. Here, for manufacturing a semiconductor fine particle phosphor that is compatible to the environment and unsusceptible to the external world, it is preferred to form the shell part using AlGaN, GaInN, ZnOS, ZnOTe or ZnSTe.

As a material of the organic compound bound to surface of semiconductor fine particle phosphor 14 included in wavelength conversion member 10A in the present embodiment, an organic compound composed of an alkyl group which is a functional part, and a binding site with the core part or shell part as described above, and concrete examples include an amine compound, a phosphine compound, a phosphine oxide compound, a thiol compound, a fatty acid and the like.

Examples of the phosphine compound include tributylphosphine, trihexylphosphine, trioctylphosphine and so on.

Examples of the phosphine oxide compound include 1-dichlorophosphinorheptane, 1-dichlorophosphinornonane, t-butylphosphonic acid, tetradecylphosphonic acid, dodecyldimethylphosphine oxide, dioctylphosphine oxide, didecylphosphine oxide, tributylphosphine oxide, tripentylphosphine oxide, trihexylphosphine oxide, trioctylphosphine oxide and so on.

Examples of the thiol compound include tributyl sulfide, trihexyl sulfide, trioctyl sulfide, 1-heptyl thiol, 1-octyl thiol, 1-nonanethiol, 1-decanethiol, 1-undecanethiol, 1-dodecanethiol, 1-tridecanethiol, 1-tetradecanethiol, 1-pentadecanethiol, 1-hexadecanethiol, 1-octadecanethiol, dihexyl sulfide, diheptyl sulfide, dioctyl sulfide, dinonyl sulfide and so on.

Examples of the amine compound include heptylamine, octylamine, nonylamine, decylamine, undecylamine, dodecylamine, tridecylamine, tetradecylamine, hexadecylamine, octadecylamine, oleylamine, dioctylamine, tributylamine, tripentylamine, trihexylamine, triheptylamine, trioctylamine, trinonylamine and so on.

Examples of the fatty acid include lauric acid, myristic acid, palmitic acid, stearic acid, oleic acid and so on.

As a method for manufacturing semiconductor fine particle phosphor 14 included in wavelength conversion member 10A in the present embodiment, conventionally known various synthesis methods, for example, a gas phase synthesis method, a liquid phase synthesis method, a solid phase synthesis method, a vacuum synthesis method and the like may be used. However, from the view point of adaptation to mass production, it is preferred to use a liquid phase synthesis method, and from the view point of capability of synthesizing a semiconductor fine particle phosphor having high emission efficiency, it is particularly preferred to use synthesis techniques such as a hot soap technique, a reverse micelle technique, a solvothermal synthesis technique, a hydrothermal technique, a co-precipitation technique and so on, among the liquid phase synthesis methods.

As a method for identifying the material forming the light transmissive member as described above, X-ray photoelectric spectroscopy and the like may be used.

As a method for examining structure of the semiconductor fine particle phosphor as described above, various methods can be applied, and preferably, direct observation by TEM (Transmission Electron Microscope) may be used.

As a method for determining a peak wavelength and a half band width of emission spectrum of the semiconductor fine particle phosphor as described above, a method for calculating a peak wavelength and a half band width of emission spectrum by measuring emission spectrum by carrying out photoluminescence measurement, cathode luminescence measurement, electroluminescence measurement or the like can be exemplified.

As a method for determining absorption characteristics of the semiconductor fine particle phosphor as described above, various methods can be employed, and preferably, measurement of absorption spectrum by a spectrophotometer may be used.

As a method for determining band gap energy of the core part of the semiconductor fine particle phosphor as described above, a method for identifying a material and an average particle size of the core part and determining by calculation based on the same, and a method for identifying from emission characteristics and absorption characteristics are exemplified.

As a method for determining average particle size of the core part of the semiconductor fine particle phosphor as described above, a method for measuring by dynamic scattering method (DLS), a method for measuring by a powder X-ray diffraction (XRD) apparatus, and a method for using direct observation by a transmissive electron microscope are exemplified. Here, when the powder X-ray diffraction apparatus is used, from the obtained half band width of diffraction peak of crystal, average particle size of crystal can be determined by using a Scherrer formula. When the transmissive electron microscope is used, for example, by measuring particle sizes of arbitrary 20 particles and conducting statistical processing, average particle size can be calculated.

As a method for determining band gap energy of the shell part of the semiconductor fine particle phosphor as described above, a method for identifying a material of the shell part and determining by calculation based on the same, and a method for identifying from emission characteristic and absorption characteristic are exemplified.

As a method for identifying a material forming the core part and/or the shell part of the semiconductor fine particle phosphor as described above, a powder X-ray diffraction method, an electron ray diffraction method, a X-ray electron spectroscopy and so on may be used.

As a method for determining a material of the organic compound covering the semiconductor fine particle phosphor as described above, infrared spectroscopy (IR), nuclear magnetic resonance analysis (NMR) and so on may be used.

As shown in FIG. 2 and FIG. 3, in wavelength conversion member 10A in the present embodiment, as semiconductor fine particle phosphor 14, two kinds of semiconductor fine particle phosphors 14a, 14b are included. Semiconductor fine particle phosphor 14a emits fluorescence having a long wavelength by converting wavelength of absorbed excitation light 100, and semiconductor fine particle phosphor 14b emits fluorescence having a short wavelength by converting wavelength of absorbed excitation light 100. Both of semiconductor fine particle phosphor 14a emitting long-wavelength fluorescence and semiconductor fine particle phosphor 14b emitting short-wavelength fluorescence are dispersed in light transmissive member 13.

Here, in wavelength conversion member 10A in the present embodiment, dispersion concentrations of semiconductor fine particle phosphors 14a, 14b dispersed in light transmissive member 13 are provided with specific anisotropy. In other words, in wavelength conversion member 10A in the present embodiment, amounts of semiconductor fine particle phosphors 14a, 14b existing per unit length inside wavelength conversion member 10A differ depending on the direction. More specifically, as shown in FIG. 2, dispersion concentrations of semiconductor fine particle phosphors 14a, 14b in the direction parallel to the light traveling direction, i.e., the direction connecting light input plane 11 and light output plane 12 of wavelength conversion member 10A (that is Z axial direction) is lower than dispersion concentrations of semiconductor fine particle phosphors 14a, 14b in the direction that is orthogonal to the light travelling direction (that is the direction involved in the XY plane).

Concretely, wavelength conversion member 10A has three regions 15a, 15b, 15c along the Z axial direction, and among these, semiconductor fine particle phosphors 14a, 14b are respectively dispersed in region 15a situated on the side of light input plane 11 and in region 15c situated on the side of light output plane 12, and semiconductor fine particle phosphors 14a, 14b are not dispersed in region 15b situated between regions 15a, 15c. In this manner, anisotropy of dispersion concentrations of semiconductor fine particle phosphors 14a, 14b as described above is realized.

By constituting as described above, in wavelength conversion member 10A in the present embodiment, it is possible to realize high emission efficiency by suppressing occurrence of concentration quenching while increasing absorptance of excitation light by semiconductor fine particle phosphors in comparison with a conventional wavelength conversion member.

Figure 5:
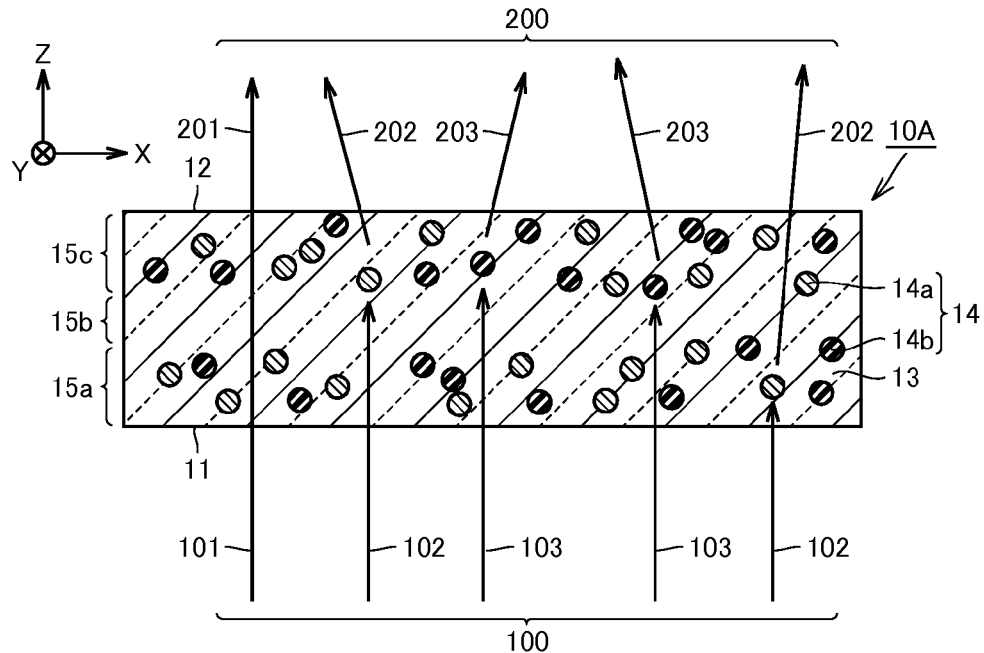
FIG. 5 is a view schematically showing the aspect that wavelength of light is converted in the wavelength conversion member in Embodiment 1 of the present invention.
Figure 50:
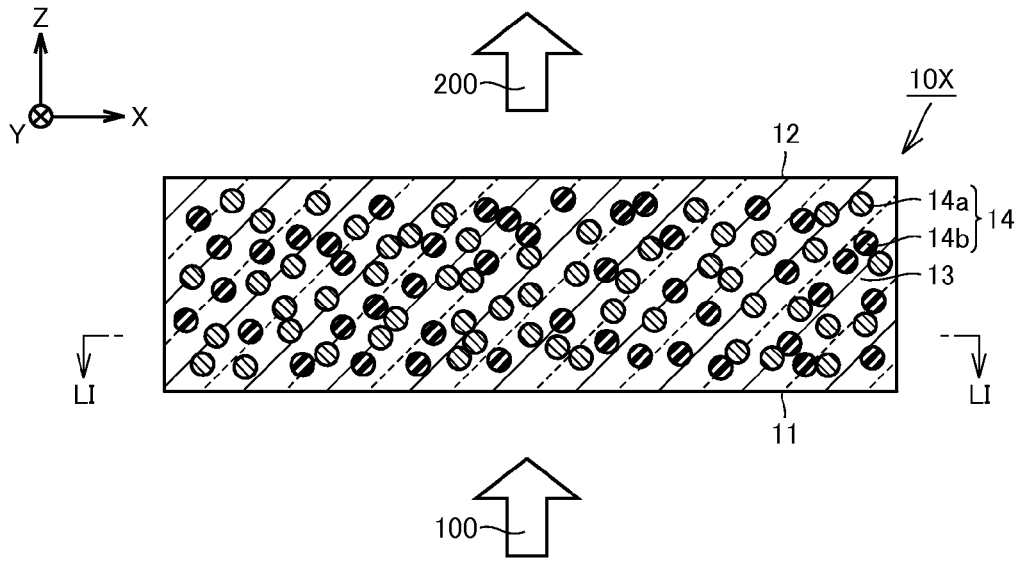
FIG. 50 is a schematic section view of a wavelength conversion member in a conventional example, cut along the XZ plane.
Figure 51:
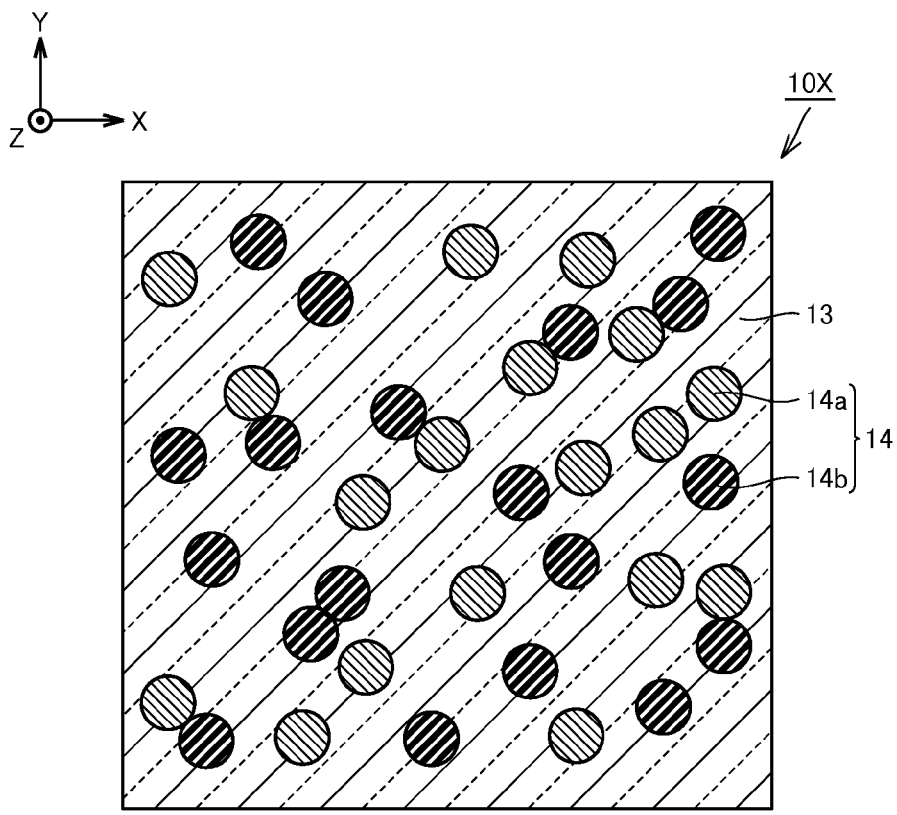
FIG. 51 is a schematic section view of a wavelength conversion member in a conventional example, cut along the XY plane.
Figure 52:
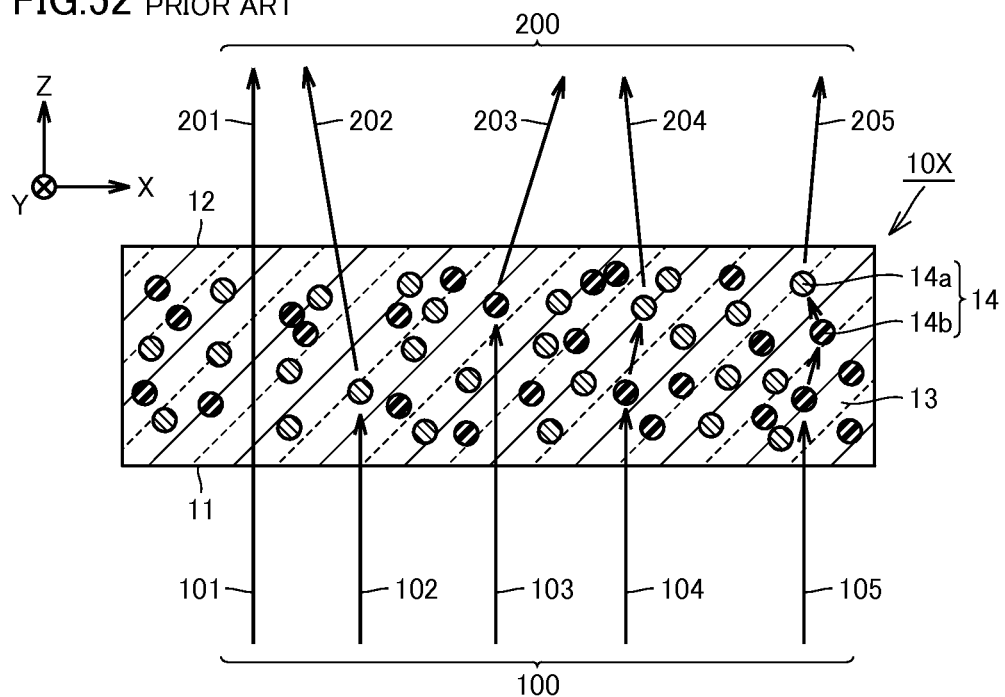
FIG. 52 is a view schematically showing the aspect that wavelength of light is converted in a wavelength conversion member in a conventional example.

FIG. 5 is a view schematically showing the aspect that wavelength of light is converted in the wavelength conversion member in the present embodiment. FIG. 50 is a schematic section view of a wavelength conversion member in a conventional example, cut along the XZ plane, and FIG. 51 is a schematic section view of a wavelength conversion member in a conventional example, cut along the XY plane. FIG. 52 is a view schematically showing the aspect that wavelength of light is converted in the wavelength conversion member in the conventional example. The section shown in FIG. 51 is a schematic section cut along the line LI-LI shown in FIG. 50. In the following, with reference to FIG. 5 and FIG. 50 to FIG. 52, the reason why the wavelength conversion member in the present embodiment has higher emission efficiency than the wavelength conversion member in the conventional example by comparison between the wavelength conversion member in the present embodiment and the wavelength conversion member in the conventional example.

As shown in FIG. 50 and FIG. 51, in a wavelength conversion member 10X in the conventional example, there is no specific anisotropy in dispersion concentrations of semiconductor fine particle phosphors 14a, 14b dispersed in light transmissive member 13 as is described above, and dispersion concentrations of semiconductor fine particle phosphor 14a, 14b in wavelength conversion member 10X are uniform over almost the entirety.

Therefore, as shown in FIG. 52, when light input plane 11 of wavelength conversion member 10X is irradiated with excitation light 100, the following phenomenon occurs. To be more specific, part of light in excitation light 100 penetrates light transmissive member 13 as it is without being absorbed by any of semiconductor fine particle phosphors 14a, 14b as shown by arrows 101, 201 in the drawing. Also, part of light in excitation light 100 penetrates light transmissive member 13 while it is absorbed by any of semiconductor fine particle phosphors 14a, 14b where it undergoes wavelength conversion into fluorescence as shown by arrows 102, 202 in the drawing and arrows 103, 203 in the drawing. Also, part of light in excitation light 100 penetrates light transmissive member 13 while it is once absorbed by semiconductor fine particle phosphors 14a, 14b where it undergoes wavelength conversion into fluorescence, and then absorbed again by other semiconductor fine particle phosphors 14a, 14b, and occasionally absorbed again by other semiconductor fine particle phosphors 14a, 14b as shown by arrows 104, 204 in the drawing and arrows 105, 205 in the drawing. And the light having passed through light transmissive member 13 is outputted from light output plane 12 of wavelength conversion member 10X, and each light is mixed and outputted outside as wavelength converted light 200.

Here, the semiconductor fine particle phosphor does not emit the entire absorbed light after wavelength conversion, and part of the absorbed light is lost as a loss. Therefore, when the reabsorption (that is, the phenomenon that the light once absorbed by a semiconductor fine particle phosphor and emitted is absorbed again by other semiconductor fine particle phosphor) as described above significantly occurs, emission efficiency of the wavelength conversion member itself will be significantly deteriorated.

On the other hand, for efficiently converting excitation light into wavelength converted light by using the wavelength conversion member, it is necessary to increase the proportion of absorption by the semiconductor fine particle phosphor. As a measure for achieving this, it is supposed to increase concentration of the semiconductor fine particle phosphor dispersed in the light transmissive member, however, when such a measure is taken, reabsorption of the light as described above becomes more likely to occur. Therefore, in wavelength conversion member 10X in the conventional example as described above, even though concentrations of semiconductor fine particle phosphors 14a, 14b are increased, concentration quenching occurs and emission efficiency is saturated, so that it is impossible to further improve the emission efficiency.

In contrast to this, in wavelength conversion member 10A in the present embodiment, since it has anisotropy in dispersion concentrations of semiconductor fine particle phosphors 14a, 14b as described above, even when light input plane 11 of wavelength conversion member 10A is irradiated with excitation light 100, the proportion of reabsorption of light as described above decreases. That is, as shown in FIG. 5, the light that penetrates light transmissive member 13 as it is without being absorbed by any of semiconductor fine particle phosphors 14a, 14b shown by arrows 101, 102 in the drawing, and the light that is absorbed by any of semiconductor fine particle phosphors 14a, 14b where it undergoes wavelength conversion into fluorescence, and penetrates light transmissive member 13 as it is without being reabsorbed as shown by arrows 102, 202 in the drawing and arrows 103, 203 in the drawing is dominant.

Here, even when concentrations of semiconductor fine particle phosphors 14a, 14b dispersed in light transmissive member 13 are increased, it is possible to efficiently convert excitation light 100 into wavelength converted light by increasing concentrations of semiconductor fine particle phosphors 14a, 14b in the XY in-plane direction in regions 15a, 15c even if concentrations of semiconductor fine particle phosphors 14a, 14b in the Z axial direction are low. Therefore, by wavelength conversion member 10A in the present embodiment, it is possible to obtain higher emission efficiency than by wavelength conversion member 10X in the conventional example.

Also in wavelength conversion member 10A in the present embodiment as described above, it is possible to freely adjust the light quantity or the spectrum of wavelength converted light 200 outputted from wavelength conversion member 10A by appropriately adjusting the kind, the number or the concentration of semiconductor fine particle phosphor 14 to be contained, the kind of excitation light 100 inputted into wavelength conversion member 10A and so on (Concentration of semiconductor fine particle phosphor 14 should be adjusted by sufficiently considering provision of anisotropy).

Figure 6:
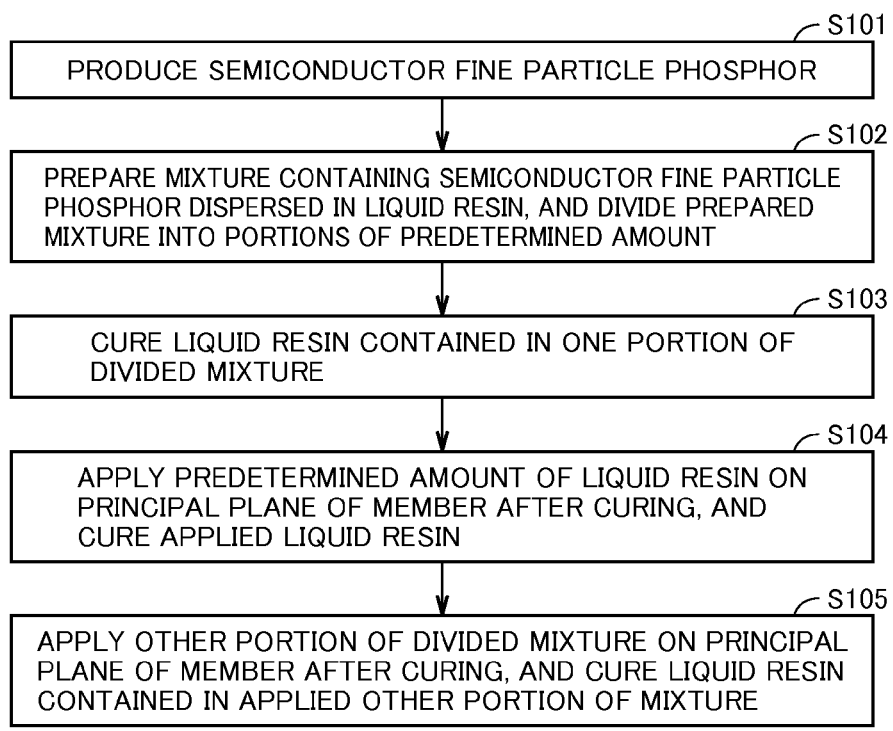
FIG. 6 is a flow chart showing a method for manufacturing the wavelength conversion member in Embodiment 1 of the present invention.
Figure 53:
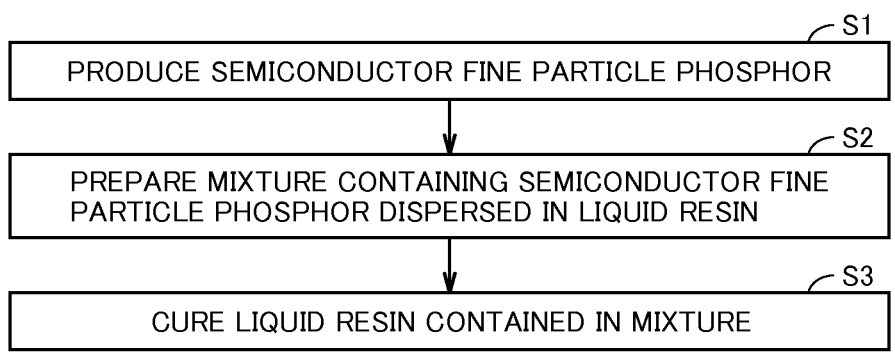
FIG. 53 is a flow chart showing a method for manufacturing a wavelength conversion member in a conventional example.

FIG. 6 is a flow chart showing a method for manufacturing the wavelength conversion member in Embodiment 1 of the present invention, and FIG. 53 is a flow chart showing a method for manufacturing the wavelength conversion member in a conventional example as described above. Next, referring to these FIG. 6 and FIG. 53, the method for manufacturing the wavelength conversion member in the present embodiment will be described in comparison with the method for manufacturing a wavelength conversion member in a conventional example.

As shown in FIG. 53, in manufacturing wavelength conversion member 10X in the conventional example, first, in step S1, a semiconductor fine particle phosphor is produced. As a method for producing the semiconductor fine particle phosphor, known synthesis methods as described above (for example, liquid phase synthesis method and so on) may be used.

Next, in step S2, by adding and dispersing the semiconductor fine particle phosphor into a liquid resin, a mixture containing the semiconductor fine particle phosphor dispersed in the liquid resin is prepared. Here, as the resin for use, the one having light transmissivity after curing, such as silicone resin is used.

Next, in step S3, the mixture is poured into a forming die or the like, and the liquid resin contained in the mixture is cured.

In this manner, manufacture of wavelength conversion member 10X in the conventional example where dispersion concentrations of semiconductor fine particle phosphors 14a, 14b are substantially uniform over the entirety as shown in FIG. 50 and FIG. 51 is completed.

On the other hand, as shown in FIG. 6, for manufacturing wavelength conversion member 10A in the present embodiment, first, in step S101, a semiconductor fine particle phosphor is produced. As a method for producing the semiconductor fine particle phosphor, known synthesis methods as described above (for example, liquid phase synthesis method and so on) may be used.

Next, in step S102, by adding and dispersing the semiconductor fine particle phosphor into a liquid resin, a mixture containing the semiconductor fine particle phosphor dispersed in the liquid resin is prepared, and the prepared mixture is divided into portions of a predetermined amount. Here, as the resin for use, the one having light transmissivity after curing, such as silicone resin is used.

Next, in step S103, the liquid resin contained in one portion of the divided mixture is cured. As a result, region 15a shown in FIG. 2 is formed.

Next, in step S104, a predetermined amount of a liquid resin is applied on principal plane of the member after the curing, and the applied liquid resin is cured. As a result, region 15b shown in FIG. 2 is formed.

Next, in step S105, the other portion of the divided mixture is applied on principal plane of the member after the curing, and the liquid resin contained in the applied other portion of the mixture is cured. As a result, region 15c shown in FIG. 2 is formed.

In this way, manufacture of wavelength conversion member 10A in the present embodiment having specific anisotropy in dispersion concentrations of semiconductor fine particle phosphors 14a, 14b as shown in FIG. 1 to FIG. 3 is completed.

As described in the above, by employing the structure and the method for manufacturing wavelength conversion member 10A in the present embodiment, it is possible to provide a wavelength conversion member having improved emission efficiency in comparison with the conventional example.

Figure 7:
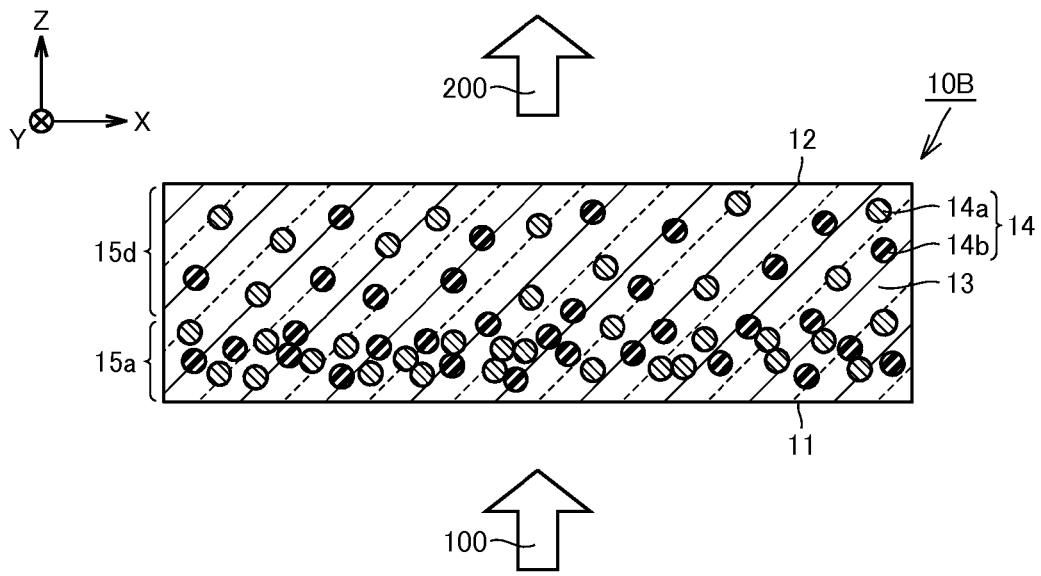
FIG. 7 is a schematic section view of a wavelength conversion member in Embodiment 2 of the present invention, cut along the XZ plane.
Figure 8:
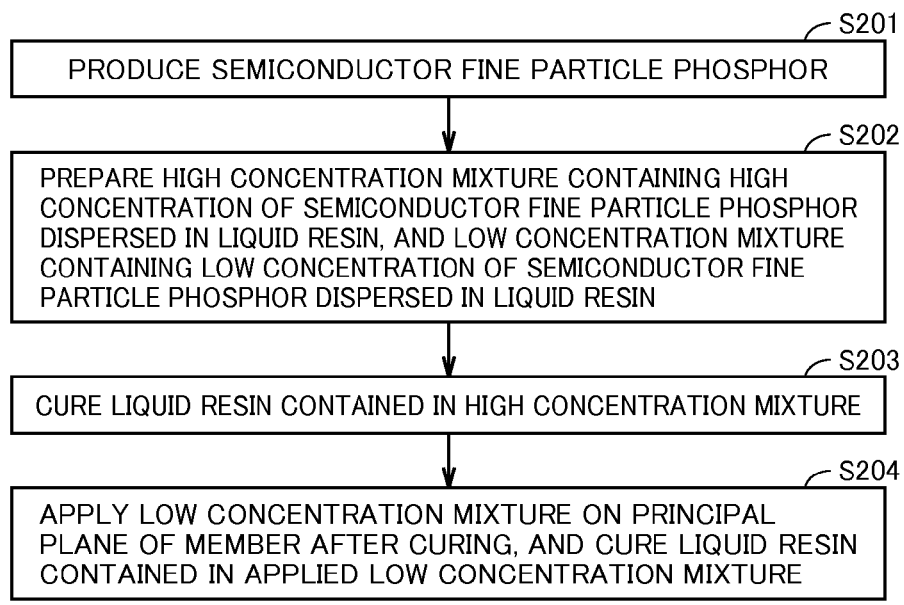
FIG. 8 is a flow chart showing a method for manufacturing the wavelength conversion member in Embodiment 2 of the present invention.

FIG. 7 is a schematic section view of a wavelength conversion member in Embodiment 2 of the present invention, cut along the XZ plane. FIG. 8 is a flow chart showing a method for manufacturing the wavelength conversion member in the present embodiment. Next, referring to these FIG. 7 and FIG. 8, structure and a manufacturing method for the wavelength conversion member in the present embodiment will be described. The similar part as that in Embodiment 1 of the present invention described above is denoted by the same reference numeral in the drawing, and description thereof will not be repeated here.

As shown in FIG. 7, also in a wavelength conversion member 10B in the present embodiment, dispersion concentrations of semiconductor fine particle phosphors 14a, 14b dispersed in light transmissive member 13 are provided with the specific anisotropy as described above, and dispersion concentrations of semiconductor fine particle phosphors 14a, 14b in the Z axial direction of wavelength conversion member 10B are lower than dispersion concentrations of semiconductor fine particle phosphors 14a, 14b in the direction contained in the XY plane.

More concretely, wavelength conversion member 10B has two regions 15a, 15d having different concentrations along the Z axial direction, and of these, in region 15a situated on the side of light input plane 11, semiconductor fine particle phosphors 14a, 14b are dispersed at high concentrations, and in region 15d situated on the side of light output plane 12, semiconductor fine particle phosphors 14a, 14b are dispersed at low concentrations. As a result, anisotropy in dispersion concentrations of semiconductor fine particle phosphors 14a, 14b as described above is realized.

For manufacturing wavelength conversion member 10B having such structure, as shown in FIG. 8, first in step S201, semiconductor fine particle phosphors 14a, 14b are produced. As a method for producing the semiconductor fine particle phosphors, known synthesis methods as described above (for example, liquid phase synthesis method and so on) may be used.

Next, in step S202, by adding and dispersing the semiconductor fine particle phosphor into a liquid resin, a high concentration mixture containing the semiconductor fine particle phosphors dispersed at high concentration in the liquid resin, and a low concentration mixture containing the semiconductor fine particle phosphors dispersed at low concentration in the liquid resin are prepared. Here, as the resin for use, the one having light transmissivity after curing, such as silicone resin is used.

Next, in step S203, the liquid resin contained in the high concentration mixture is cured. As a result, region 15a shown in FIG. 7 is formed.

Next, in step S204, a low concentration mixture is applied on the principal plane of the member after the curing, and the liquid resin contained in the applied low concentration mixture is cured. As a result, region 15d shown in FIG. 7 is formed.

In this way, manufacture of wavelength conversion member 10B in the present embodiment having specific anisotropy in dispersion concentrations of semiconductor fine particle phosphors 14a, 14b as shown in FIG. 7 is completed.

As described above, by employing the structure and the method for manufacturing wavelength conversion member 10B in the present embodiment, it is possible to achieve a wavelength conversion member having improved emission efficiency in comparison with the conventional example, likewise the Embodiment 1 of the present invention as described above.

Figure 9:
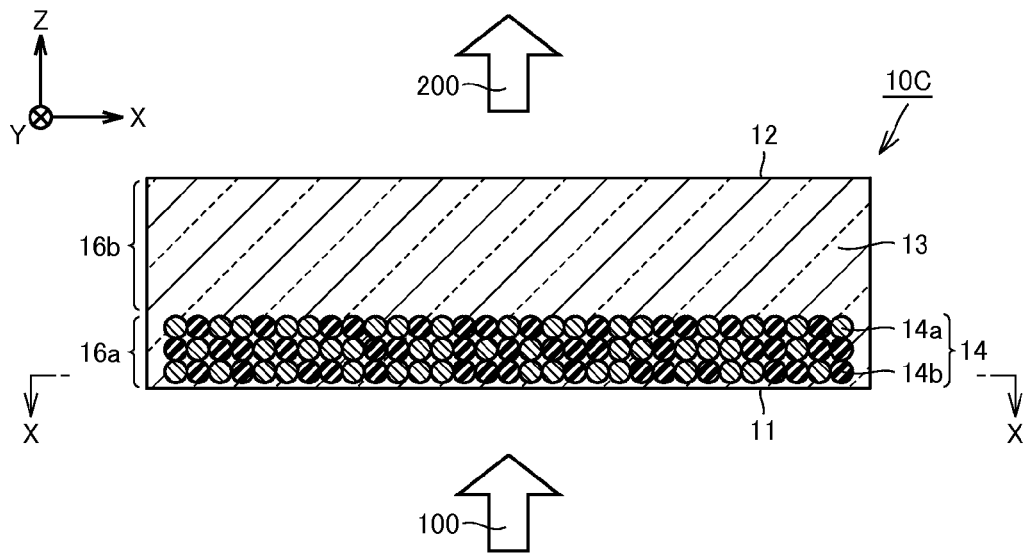
FIG. 9 is a schematic section view of a wavelength conversion member in Embodiment 3 of the present invention, cut along the XZ plane.
Figure 10:
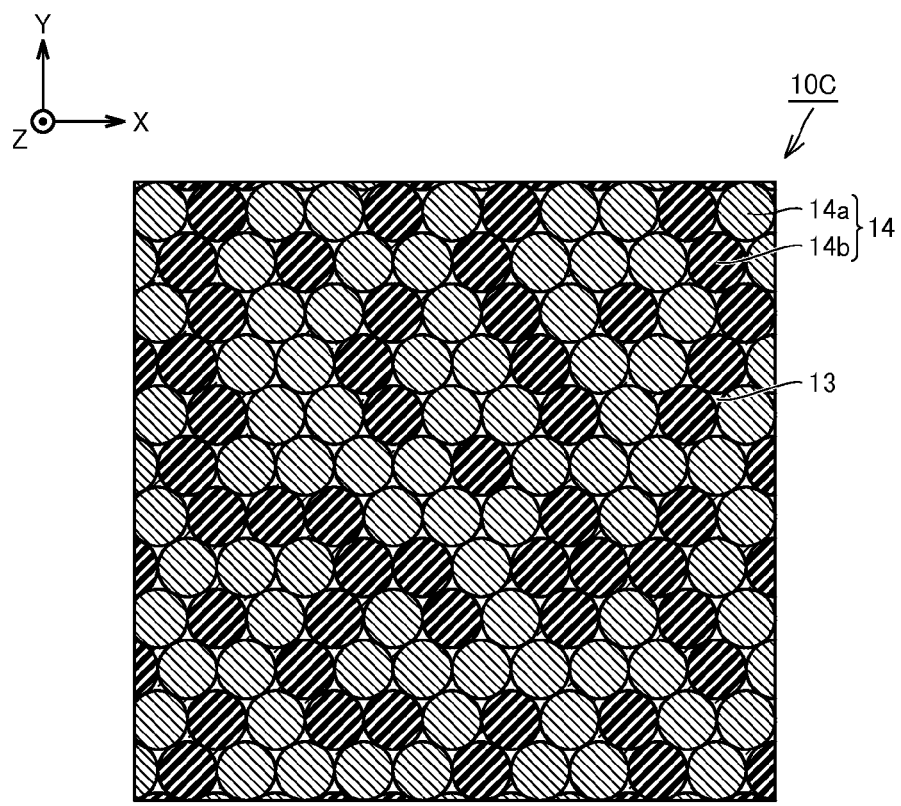
FIG. 10 is a schematic section view of the wavelength conversion member in Embodiment 3 of the present invention, cut along the XY plane.
Figure 11:
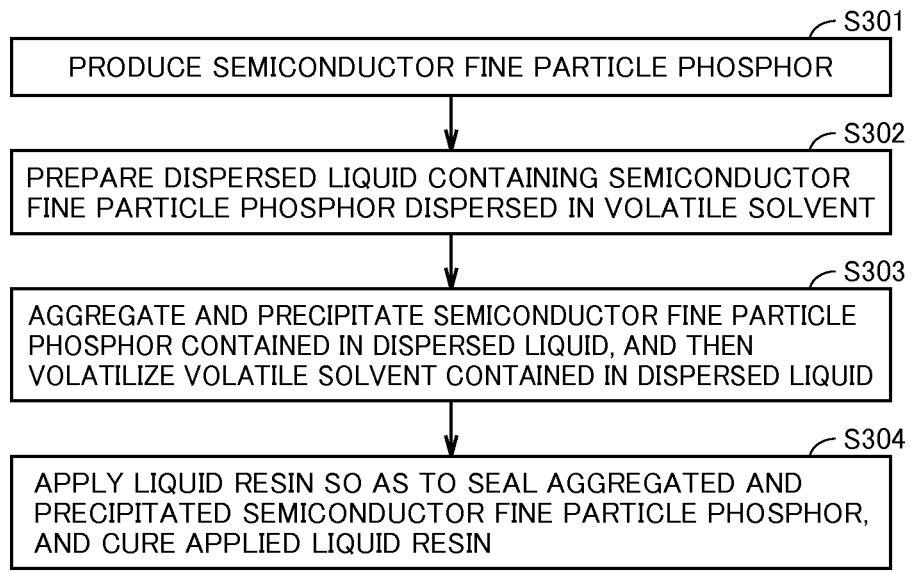
FIG. 11 is a flow chart showing a method for manufacturing the wavelength conversion member in Embodiment 3 of the present invention.

FIG. 9 is a schematic section view of a wavelength conversion member in Embodiment 3 of the present invention, cut along the XZ plane. FIG. 10 is a schematic section view of a wavelength conversion member in the present embodiment, cut along the XY plane. FIG. 11 is a flow chart showing a method for manufacturing the wavelength conversion member in the present embodiment. The section shown in FIG. 10 is a schematic section along the line X-X shown in FIG. 9. Next, referring to these FIG. 9 to FIG. 10, structure and a method for manufacturing the wavelength conversion member in the present embodiment will be described. The similar part as that in Embodiment 1 of the present invention described above is denoted by the same reference numeral in the drawing, and description thereof will not be repeated here.

As shown in FIG. 9, also in a wavelength conversion member 10C in the present embodiment, dispersion concentrations of semiconductor fine particle phosphors 14a, 14b dispersed in light transmissive member 13 are provided with the specific anisotropy as described above, and dispersion concentrations of semiconductor fine particle phosphors 14a, 14b in the Z axial direction of wavelength conversion member 10C are lower than dispersion concentrations of semiconductor fine particle phosphors 14a, 14b in the direction contained in the XY plane.

More concretely, wavelength conversion member 10C has two regions 16a, 16b along the Z axial direction, and of these, in region 16a situated on the side of light input plane 11, semiconductor fine particle phosphors 14a, 14b are dispersed, and in region 16b situated on the side of light output plane 12, semiconductor fine particle phosphors 14a, 14b are not dispersed. In other words, semiconductor fine particle phosphors 14a, 14b are localized on the side of light input plane 11 in light transmissive member 13. As a result, anisotropy in dispersion concentrations of semiconductor fine particle phosphors 14a, 14b as described above is realized.

Here, in wavelength conversion member 10C in the present embodiment, as shown in FIG. 10, those having substantially equal particle sizes are used as semiconductor fine particle phosphors 14a, 14b, and semiconductor fine particle phosphors 14a, 14b are regularly arrayed in the form of hexagonal lattice in the XY plane of region 16a. In wavelength conversion member 10C constituted in this manner, semiconductor fine particle phosphors 14a, 14b are closely packed in the XY in-plane direction, so that it becomes possible to increase the concentrations of semiconductor fine particle phosphors 14a, 14b in the XY in-plane direction as maximum. Therefore, it becomes possible to make difference between concentrations of semiconductor fine particle phosphors 14a, 14b in the Z axial direction and concentrations of semiconductor fine particle phosphors 14a, 14b in the XY in-plane direction large, and it is possible to greatly improve emission efficiency while suppressing reabsorption of light.

In manufacturing wavelength conversion member 10C having such structure, as shown in FIG. 11, first, in step S301, semiconductor fine particle phosphors 14a, 14b are produced. As a method for producing the semiconductor fine particle phosphors, known synthesis methods as described above (for example, liquid phase synthesis method and so on) may be used.

Next, in step S302, by adding and dispersing the semiconductor fine particle phosphors into a volatile solvent, a dispersed liquid containing the semiconductor fine particle phosphors dispersed in the volatile solvent is prepared. As the volatile solvent used herein, for example, organic solvents represented by toluene, hexane, ethanol and so on may be used.

Next, in step S303, the semiconductor fine particle phosphors contained in the dispersed liquid are aggregated and precipitated, and then the volatile solvent contained in the dispersed liquid is volatilized. In this aggregation and precipitation process of the semiconductor fine particle phosphors in step S303, self-organization (also called self arrangement) of the semiconductor fine particle phosphors occurs.

Here, self-organization means that fine particles autonomously form ordered structure when they aggregate for stabilization. More specifically, in a system where fine particles are dispersed, since a proportion of surface area to volume of a fine particle is very high, the dispersed fine particles aggregate so that the surface area of the dispersed fine particles is minimized for stabilizing the surface energy, with the result that a regular array of fine particles arises, and this phenomenon is called self-organization. By this self-organization of the semiconductor fine particle phosphors, a regular array such as a hexagonal lattice form of the semiconductor fine particle phosphors is realized.

Next, in step S304, a liquid resin is applied so as to seal the precipitated and aggregated semiconductor fine particle phosphors (namely, self-organized semiconductor fine particle phosphors), and the applied liquid resin is cured. Here, as the resin for use, the one having light transmissivity after curing, such as silicone resin is used. As a result, regions 16a and 16b shown in FIG. 7 are formed.

In this manner, manufacture of wavelength conversion member 10C in the present embodiment having specific anisotropy in dispersion concentrations of semiconductor fine particle phosphors 14a, 14b as shown in FIG. 9 is completed.

As described in the above, by employing the structure and the method for manufacturing wavelength conversion member 10C in the present embodiment, it is possible to provide a wavelength conversion member having improved emission efficiency in comparison with the conventional example, likewise the Embodiment 1 of the present invention as described above. In particular, by utilizing the self-organization action of the semiconductor fine particle phosphors as described above, it is possible to realize a wavelength conversion member having greatly improved emission efficiency in comparison with the conventional example.

The spatial packing structure of semiconductor fine particle phosphors 14a, 14b in region 16a of wavelength conversion member 10C as described above may be closest packing structure such as hexagonal closest packing structure or cubic closest packing structure, or may be non-closest packing structure other than these. Also, semiconductor fine particle phosphors 14a, 14b may be arrayed in a single layer without having spatial packing structure.

In wavelength conversion member 10C in the present embodiment as described above, the case where semiconductor fine particle phosphors 14a, 14b are localized on the side of light input plane 11 in light transmissive member 13 is exemplified, however, semiconductor fine particle phosphors 14a, 14b may be of course localized on the side of light output plane 12 in light transmissive member 13.

Figure 12:
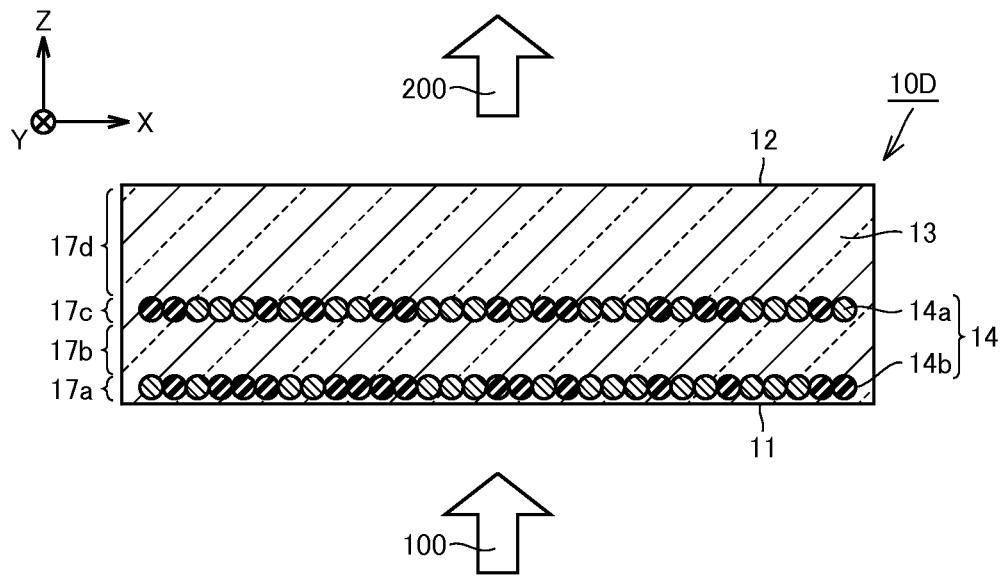
FIG. 12 is a schematic section view of a wavelength conversion member in Embodiment 4 of the present invention, cut along the XZ plane.

FIG. 12 is a schematic section view of a wavelength conversion member in Embodiment 4 of the present invention, cut along the XZ plane. Next, referring to FIG. 12, structure of the wavelength conversion member in the present embodiment will be described. The similar part as that in Embodiment 3 of the present invention described above is denoted by the same reference numeral in the drawing, and description thereof will not be repeated here.

As shown in FIG. 12, also in wavelength conversion member 10D in the present embodiment, dispersion concentrations of semiconductor fine particle phosphors 14a, 14b dispersed in light transmissive member 13 are provided with the specific anisotropy as described above, and dispersion concentrations of semiconductor fine particle phosphors 14a, 14b in the Z axial direction of wavelength conversion member 10C are lower than dispersion concentrations of semiconductor fine particle phosphors 14a, 14b in the direction contained in the XY plane.

More concretely, wavelength conversion member 10D has four regions 17a, 17b, 17c, 17d along the Z axial direction, and among these, in region 17a situated on the side of light input plane 11 and in region 17c situated at one middle position in the Z axial direction, semiconductor fine particle phosphors 14a, 14b are dispersed, and in region 17d situated on the side of light output plane 12 and in region 17b situated at the other middle position in the Z axial direction, semiconductor fine particle phosphors 14a, 14b are not dispersed. As a result, anisotropy in dispersion concentrations of semiconductor fine particle phosphors 14a, 14b as described above is realized.

Here, also in wavelength conversion member 10D in the present embodiment, those having substantially equal particle sizes are used as semiconductor fine particle phosphors 14a, 14b, and semiconductor fine particle phosphors 14a, 14b are regularly arrayed in the form of hexagonal lattice in the XY plane of region 17a and in the XY plane of region 17c. Also in wavelength conversion member 10D constituted in this manner, it becomes possible to make difference between concentrations of semiconductor fine particle phosphors 14a, 14b in the Z axial direction and concentrations of semiconductor fine particle phosphors 14a, 14b in the XY in-plane direction large, and it is possible to greatly improve emission efficiency while suppressing reabsorption of light. A concrete method for manufacturing wavelength conversion member 10D is equivalent to the manufacturing method described in Embodiment 3 of the present invention, and description thereof will be omitted.

Figure 13:
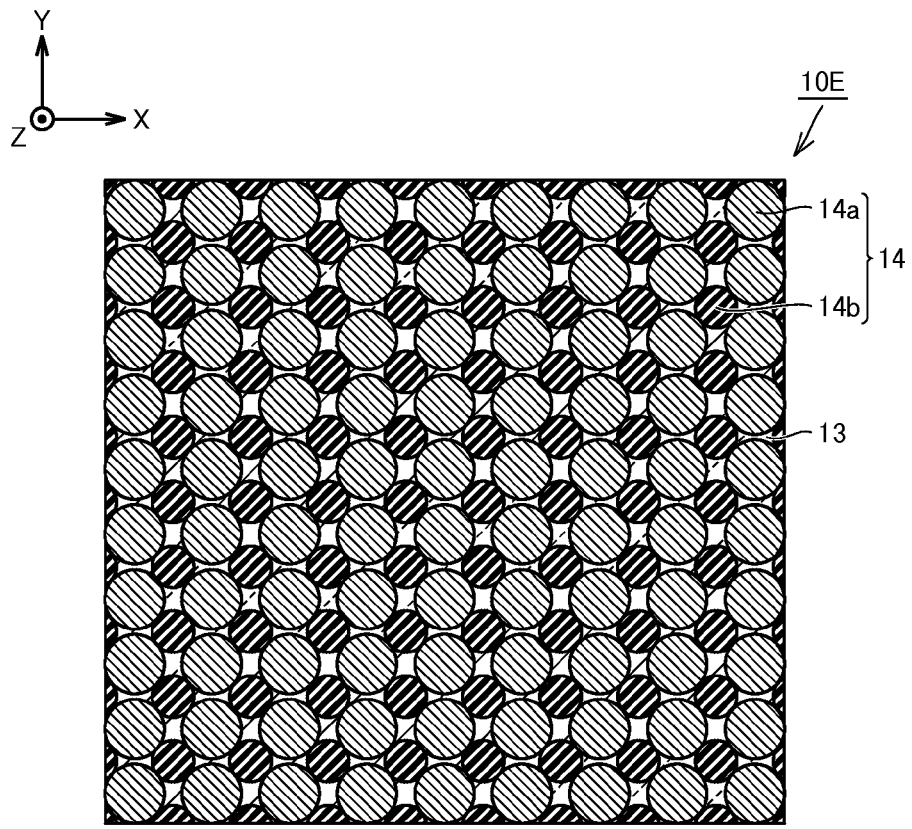
FIG. 13 is a schematic section view of a wavelength conversion member in Embodiment 5 of the present invention, cut along the XY plane.

FIG. 13 is a schematic section view of a wavelength conversion member in Embodiment 5 of the present invention, cut along the XY plane. Next, referring to FIG. 13, structure of the wavelength conversion member in the present embodiment will be described. The similar part as that in Embodiment 3 of the present invention described above is denoted by the same reference numeral in the drawing, and description thereof will not be repeated here.

Wavelength conversion member 10E in the present embodiment is different from wavelength conversion member 10C in Embodiment 3 described above only in array of semiconductor fine particle phosphors 14a, 14b in the XY plane included in region 17a. As shown in FIG. 13, in wavelength conversion member 10E in the present embodiment, semiconductor fine particle phosphors 14a, 14b in the XY plane are regularly arrayed in the form of cubic lattice. Here, whether semiconductor fine particle phosphors 14a, 14b are arrayed in the form of hexagonal lattice or in the form of cubic lattice principally relies on the particle sizes of semiconductor fine particle phosphors 14a, 14b, and is determined based on these particle sizes at the time of self-organization.

Also in wavelength conversion member 10E constituted in this manner, it becomes possible to make difference between concentrations of semiconductor fine particle phosphors 14a, 14b in the Z axial direction and concentrations of semiconductor fine particle phosphors 14a, 14b in the XY in-plane direction large, and it is possible to greatly improve emission efficiency while suppressing reabsorption of light. A concrete method for manufacturing wavelength conversion member 10E is equivalent to the manufacturing method described in Embodiment 3 of the present invention, and description thereof will be omitted.

The spatial packing structure of semiconductor fine particle phosphors 14a, 14b in region 17a of wavelength conversion member 10E as described above may be closest packing structure or non-closest packing structure. Also, semiconductor fine particle phosphors 14a, 14b may be arrayed in a single layer without having spatial packing structure as shown in the drawing.

Figure 14:
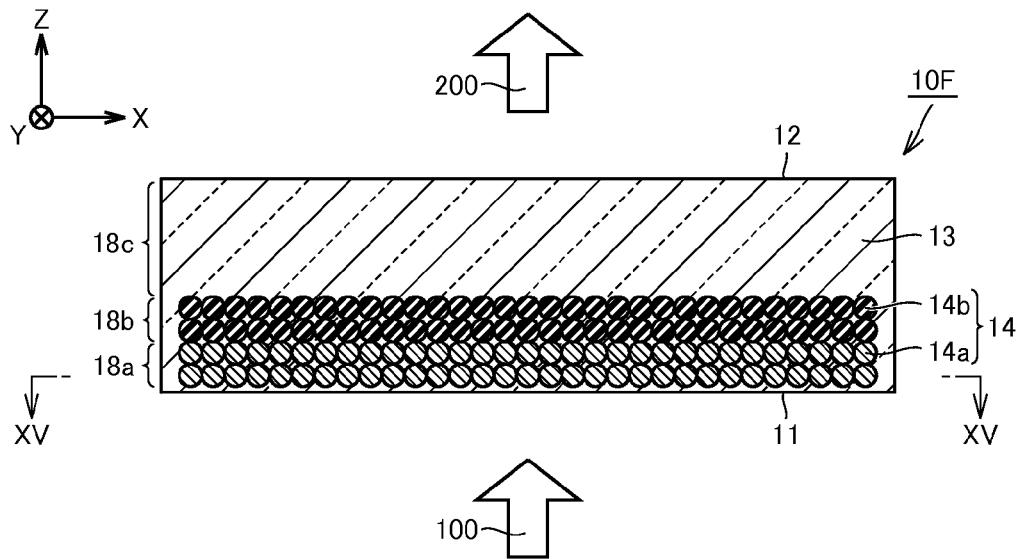
FIG. 14 is a schematic section view of a wavelength conversion member in Embodiment 6 of the present invention, cut along the XZ plane.
Figure 15:
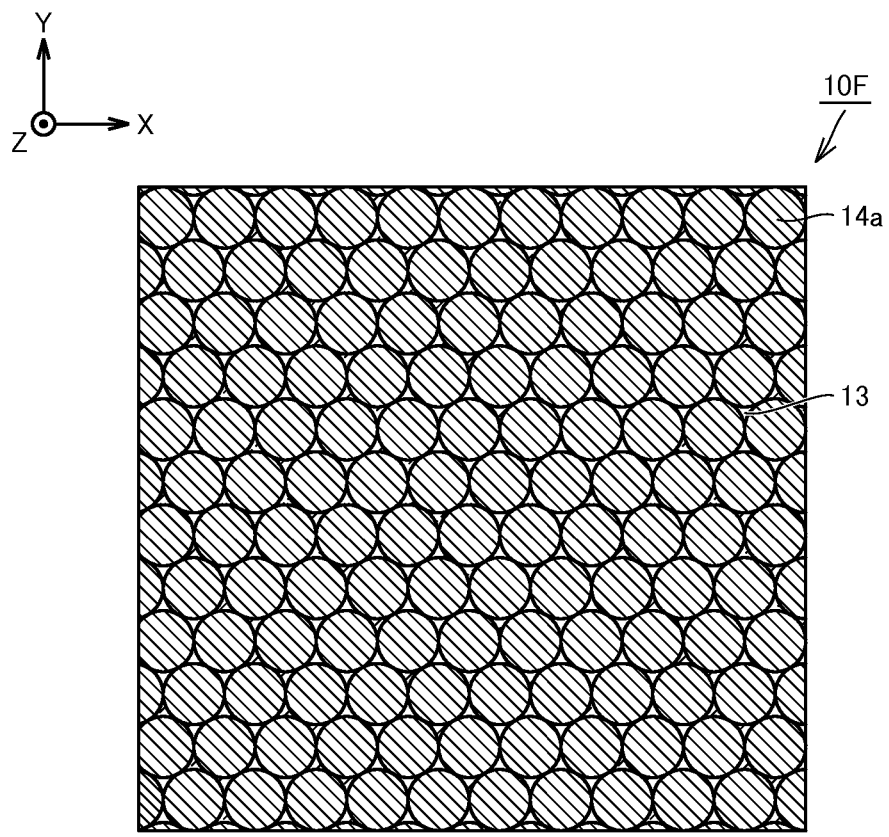
FIG. 15 is a schematic section view of the wavelength conversion member in Embodiment 6 of the present invention, cut along the XY plane.
Figure 16:
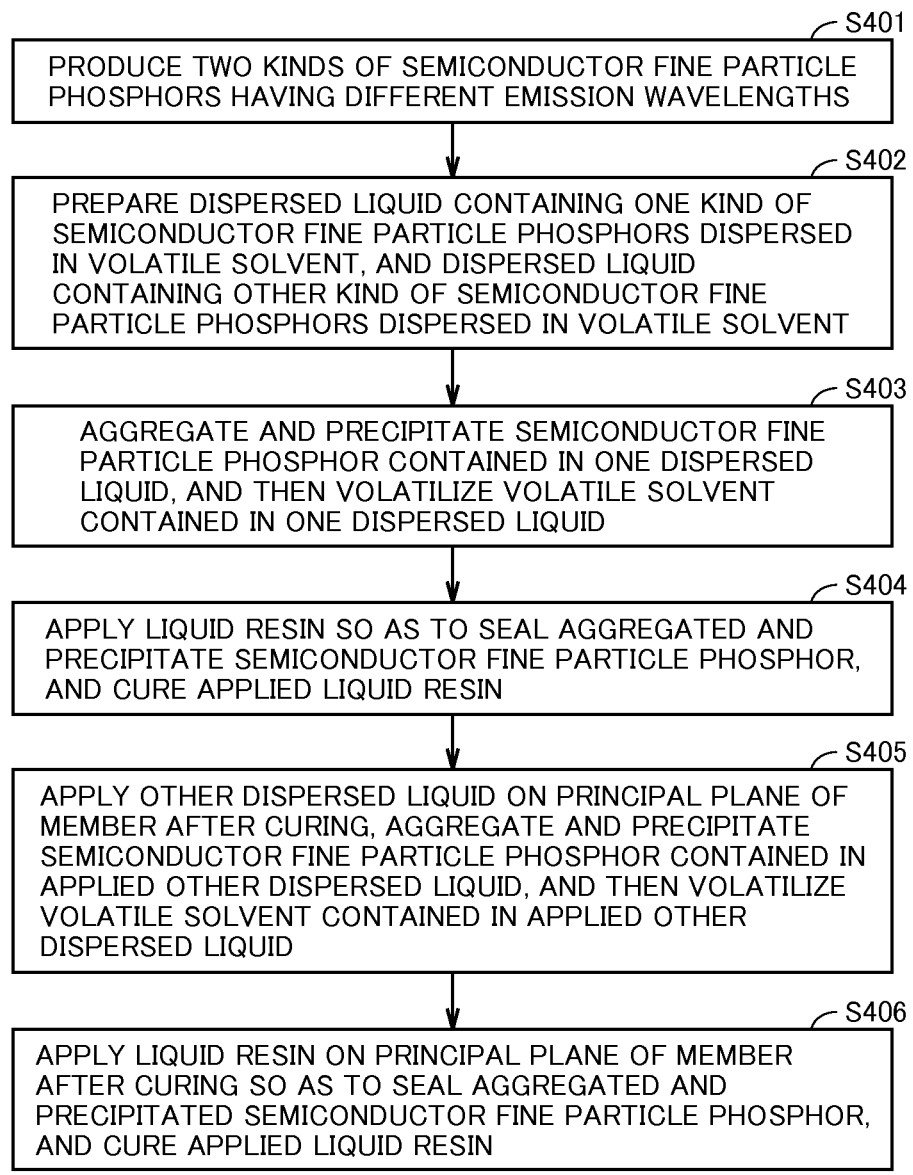
FIG. 16 is a flow chart showing a method for manufacturing the wavelength conversion member in Embodiment 6 of the present invention.

FIG. 14 is a schematic section view of a wavelength conversion member in Embodiment 6 of the present invention, cut along the XZ plane. FIG. 15 is a schematic section view of a wavelength conversion member in the present embodiment, cut along the XY plane. FIG. 16 is a flow chart showing a method for manufacturing the wavelength conversion member in the present embodiment. The section shown in FIG. 15 is a schematic section along the line XV-XV shown in FIG. 14. Next, referring to these FIG. 14 to FIG. 15, structure and a method for manufacturing the wavelength conversion member in the present embodiment will be described. The similar part as that in Embodiment 3 of the present invention described above is denoted by the same reference numeral in the drawing, and description thereof will not be repeated here.

As shown in FIG. 14, also in a wavelength conversion member 10F in the present embodiment, dispersion concentrations of semiconductor fine particle phosphors 14a, 14b dispersed in light transmissive member 13 are provided with the specific anisotropy as described above, and dispersion concentrations of semiconductor fine particle phosphors 14a, 14b in the Z axial direction of wavelength conversion member 10F are lower than dispersion concentrations of semiconductor fine particle phosphors 14a, 14b in the direction contained in the XY plane.

More concretely, in wavelength conversion member 10F in the present embodiment, semiconductor fine particle phosphors 14a, 14b are laminated in the form of layers in the Z axial direction while they are separated by kind. Specifically, wavelength conversion member 10F has three regions 18a, 18b, 18c along the Z axial direction, and among these, in region 18a situated on the side of light input plane 11, only semiconductor fine particle phosphor 14a is dispersed, and in region 18b situated at the middle position in the Z axial direction, only semiconductor fine particle phosphor 14b is dispersed, and in region 18c situated on the side of light output plane 12, any of semiconductor fine particle phosphors 14a, 14b are not dispersed. Therefore, as shown in FIG. 15, in region 18a, only one kind of semiconductor fine particle phosphor 14a is dispersed. Although omitted in the drawing, in region 18b, only one kind, the remaining semiconductor fine particle phosphor 14b is dispersed. As a result, anisotropy in dispersion concentrations of semiconductor fine particle phosphors 14a, 14b as described above is realized.

Here, in wavelength conversion member 10F in the present embodiment, semiconductor fine particle phosphor 14a that emits high wavelength fluorescence is dispersed in the form of layer on the side of light input plane 11 in light transmissive member 13, and semiconductor fine particle phosphor 14b that emits low wavelength fluorescence is dispersed in the form of layer on the side closer to light output plane 12 in light transmissive member 13 than semiconductor fine particle phosphor 14a that emits high wavelength fluorescence.

In this manner, by configuring the arrays of semiconductor fine particle phosphor 14 in the Z axial direction so that emission wavelength of semiconductor fine particle phosphor 14 contained in each layer (each region) decreases from the side of light input plane 11 to the side of light output plane 12 in light transmissive member 13, reabsorption of light is suppressed, and emission efficiency of wavelength conversion member can be further improved.

This is because a semiconductor fine particle phosphor generally has a nature of absorbing light having wavelength shorter than emission wavelength. For example, assuming that there are a red semiconductor fine particle phosphor emitting light of long wavelength, and a green semiconductor fine particle phosphor emitting light of short wavelength, fluorescence of the green semiconductor fine particle phosphor having short emission wavelength is absorbed by the red semiconductor fine particle phosphor, however, fluorescence of the red semiconductor fine particle phosphor having long emission wavelength penetrates the green semiconductor fine particle phosphor without being absorbed thereby. Therefore, by configuring in the manner as described above, reabsorption of light is suppressed.

In manufacturing wavelength conversion member 10F having such structure, as shown in FIG. 16, first, in step S401, two kinds of semiconductor fine particle phosphors having different emission wavelengths are produced. As a method for producing the semiconductor fine particle phosphors, known synthesis methods as described above (for example, liquid phase synthesis method and so on) may be used.

Next, in step S402, by adding and dispersing a semiconductor fine particle phosphor in a volatile solvent, a dispersed liquid containing one kind of the semiconductor fine particle phosphors dispersed in the volatile solvent, and a dispersed liquid containing the other kind of the semiconductor fine particle phosphors dispersed in the volatile solvent are prepared. Here, as the volatile solvent for use, for example, organic solvents represented by toluene and the like may be used.

Next, in step S403, the semiconductor fine particle phosphor contained in one of the dispersed liquids is aggregated and precipitated, and then the volatile solvent contained in the one of the dispersed liquids is volatilized. In this aggregation and precipitation process of the semiconductor fine particle phosphor in step S403, self-organization of the semiconductor fine particle phosphor occurs.

Next, in step S404, a liquid resin is applied so as to seal the precipitated and aggregated semiconductor fine particle phosphor, and the applied liquid resin is cured. Here, as the resin for use, the one having light transmissivity after curing, such as silicone resin is used. As a result, region 18a shown in FIG. 7 is formed.

Next, in step S405, on principal plane of the member after the curing, the other of the dispersed liquids is applied, and the semiconductor fine particle phosphor contained in the applied other dispersed liquid is aggregated and precipitated, and then the volatile solvent contained in the other dispersed liquid is volatilized. In this aggregation and precipitation process of the semiconductor fine particle phosphor in step S405, self-organization of the semiconductor fine particle phosphor occurs.

Next, in step S406, a liquid resin is applied so as to seal the precipitated and aggregated semiconductor fine particle phosphor, and the applied liquid resin is cured. Here, as the resin for use, the one having light transmissivity after curing, such as silicone resin is used. As a result, regions 18b, 18c shown in FIG. 14 are formed.

In this manner, manufacture of wavelength conversion member 10F in the present embodiment having specific anisotropy in dispersion concentrations of semiconductor fine particle phosphors 14a, 14b as shown in FIG. 14 is completed.

As described above, by employing the structure and the method for manufacturing wavelength conversion member 10F in the present embodiment, it is possible to provide a wavelength conversion member having greatly improved emission efficiency in comparison with the conventional example, likewise the case of Embodiment 3 of the present invention as described above. In particular, by employing the arrays of semiconductor fine particle phosphors as described above, it is possible to provide a wavelength conversion member having dramatically improved emission efficiency in comparison with the conventional example.

In wavelength conversion member 10F in the present embodiment as described above, while description is made by taking the case where two kinds of semiconductor fine particle phosphors are separately laminated in the form of layers as an example, three or four or more kinds of semiconductor fine particle phosphors may be separately laminated in the form of layers. Also in such a case, it is preferred that the semiconductor fine particle phosphors are arrayed in the Z axial direction in such a manner that emission wavelength of semiconductor fine particle phosphor contained in each layer decreases from the side of light input plane to the side of light output plane in the light transmissive member.

Figure 17:
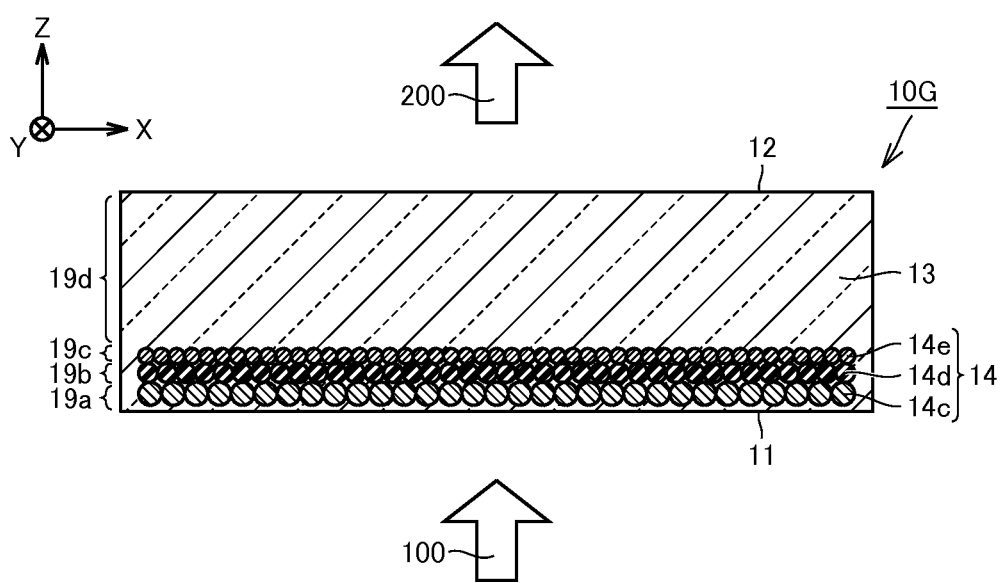
FIG. 17 is a schematic section view of a wavelength conversion member in Embodiment 7 of the present invention, cut along the XZ plane.

FIG. 17 is a schematic section view of a wavelength conversion member in Embodiment 7 of the present invention, cut along the XZ plane. Next, referring to FIG. 17, structure of the wavelength conversion member in the present embodiment will be described. The similar part as that in Embodiment 6 of the present invention described above is denoted by the same reference numeral in the drawing, and description thereof will not be repeated here.

As shown in FIG. 17, also in a wavelength conversion member 10G in the present embodiment, dispersion concentrations of semiconductor fine particle phosphors 14c, 14d, 14e dispersed in light transmissive member 13 are provided with the specific anisotropy as described above, and dispersion concentrations of semiconductor fine particle phosphors 14c, 14d, 14e in the Z axial direction of wavelength conversion member 10G are lower than dispersion concentrations of semiconductor fine particle phosphors 14c, 14d, 14e in the direction contained in the XY plane.

More concretely, in wavelength conversion member 10G in the present embodiment, semiconductor fine particle phosphors 14c, 14d, 14e are laminated in the form of layers in the Z axial direction while they are separated by kind. Specifically, wavelength conversion member 10G has four regions 19a, 19b, 19c, 19d along the Z axial direction, and among these, in region 19a situated on the side of light input plane 11, only semiconductor fine particle phosphor 14c is dispersed, and in region 19b situated at one middle position in the Z axial direction, only semiconductor fine particle phosphor 14d is dispersed, and in region 19c situated at the other middle position in the Z axial direction, only semiconductor fine particle phosphor 14e is dispersed, and in region 19d situated on the side of light output plane 12, none of semiconductor fine particle phosphors 14c, 14d, 14e is dispersed. As a result, anisotropy in dispersion concentrations of semiconductor fine particle phosphors 14c, 14d, 14e as described above is realized.

Here, in wavelength conversion member 10G in the present embodiment, the three kinds of semiconductor fine particle phosphors 14c, 14d, 14e as described above have different particle sizes, and semiconductor fine particle phosphor 14c having the largest particle size is dispersed in the form of layer on the side of light input plane 11 in light transmissive member 13, and semiconductor fine particle phosphor 14d having a smaller particle size than semiconductor fine particle phosphor 14c is dispersed in the form of layer on the side closer to light output plane 12 than semiconductor fine particle phosphor 14c in light transmissive member 13, and semiconductor fine particle phosphor 14e having a smaller particle size than semiconductor fine particle phosphor 14d is dispersed in the form of layer on the side closer to light output plane 12 than semiconductor fine particle phosphor 14d in light transmissive member 13.

In this manner, by configuring the arrays of semiconductor fine particle phosphor 14 in the Z axial direction so that particle size of semiconductor fine particle phosphor 14 contained in each layer (each region) decreases from the side of light input plane 11 to the side of light output plane 12 in light transmissive member 13, reabsorption of light is suppressed, and emission efficiency of wavelength conversion member can be further improved. This is because in general, the semiconductor fine particle phosphor having larger particle size has longer emission wavelength, and reabsorption of light is suppressed by arranging the semiconductor fine particle phosphor having a larger particle size, or having a longer emission wavelength on the side of light input plane 11.

As described above, by employing the structure and the method for manufacturing wavelength conversion member 10G in the present embodiment, it is possible to provide a wavelength conversion member having greatly improved emission efficiency in comparison with the conventional example, likewise the Embodiment 6 of the present invention as described above. In particular, by employing the arrangement of semiconductor fine particle phosphor as described above, it is possible to provide a wavelength conversion member having dramatically improved emission efficiency in comparison with the conventional example. A concrete method for manufacturing wavelength conversion member 10G is equivalent to the manufacturing method described in Embodiment 6 of the present invention, and description thereof will be omitted.

In wavelength conversion member 10G in the present embodiment as described above, while description is made by taking the case where three kinds of semiconductor fine particle phosphors are separately laminated in the form of layers as an example, two or four or more kinds of semiconductor fine particle phosphors may be separately laminated in the form of layers. Also in such a case, it is preferred that the semiconductor fine particle phosphors are arrayed in the Z axial direction in such a manner that particle size of semiconductor fine particle phosphor contained in each layer decreases from the side of light input plane to the side of light output plane in the light transmissive member.

In Embodiments 1 to 7 of the present invention described above, description is made while taking wavelength conversion members 10A to 10G containing at least two kinds of semiconductor fine particle phosphors as an example, however, a wavelength conversion member containing only one kind of semiconductor fine particle phosphor is of course possible, and the present invention is applicable to such a case.

In Embodiments 1 to 7 of the present invention described above, description is made while taking the constitution where dispersion concentration of semiconductor fine particle phosphor in the Z axial direction in the wavelength conversion member is lower than dispersion concentration of semiconductor fine particle phosphor in the XY in-plane direction as an example, however, when the wavelength conversion member is manufactured by regularly arraying the semiconductor fine particle phosphor by utilizing self-organization, the wavelength conversion member does not necessarily have anisotropy in dispersion concentration of semiconductor fine particle phosphor as described above. In other words, in such a case, dispersion concentration of semiconductor fine particle phosphor is substantially uniform over the entirety inside the wavelength conversion member, however, instead, by making the size of the wavelength conversion member in the XY in-plane direction sufficiently larger than the thickness of the wavelength conversion member in the Z axial direction, it is possible to realize a wavelength conversion member having high emission efficiency capable of preventing reabsorption of fluorescence.

By the way, as an index for evaluating emission efficiency of a wavelength conversion member, internal quantum efficiency (IQE) and external quantum efficiency (EQE) are known. Internal quantum efficiency (IQE) is an index of conversion efficiency indicating to what degree the wavelength converted light is emitted, of the light quantity absorbed by the wavelength converting member. Here, internal quantum efficiency (IQE) is represented by a value obtained by dividing light quantity of the wavelength converted light by light quantity of the absorbed light. On the other hand, external quantum efficiency (EQE) is an index of conversion efficiency indicating to what degree the wavelength converted light is emitted, of the light quantity inputted into the wavelength conversion member. External quantum efficiency (EQE) is represented by a product of internal quantum efficiency (IQE) and absorptance of input light.

Here, internal quantum efficiency (IQE) of wavelength conversion members 10A to 10G in Embodiments 1 to 7 of the present invention described above is preferably greater than or equal to 50%, more preferably greater than or equal to 70%, and further preferably greater than or equal to 90%. External quantum efficiency (EQE) of wavelength conversion members 10A to 10G in Embodiments 1 to 7 of the present invention described above is preferably greater than or equal to 40%, more preferably greater than or equal to 60%, and further preferably greater than or equal to 80%. A wavelength conversion member having high internal quantum efficiency (IQE) and external quantum efficiency (EQE) is very advantageous in that it is able to convert light with little loss. As a method for measuring internal quantum efficiency (IQE) and external quantum efficiency (EQE) of a wavelength conversion member, measurement of total flux using an integrating sphere is exemplified.

As one index for evaluating performance of a wavelength conversion member, absorptance is known. The absorptance may assume any value in wavelength conversion members 10A to 10G in Embodiments 1 to 7 of the present invention described above. However, from the view point of enhancing external quantum efficiency (EQE), higher absorptance is preferred. As a method for measuring absorptance of a wavelength conversion member, a method using a spectrophotometer and a method using an integrating sphere are exemplified.

Figure 18:
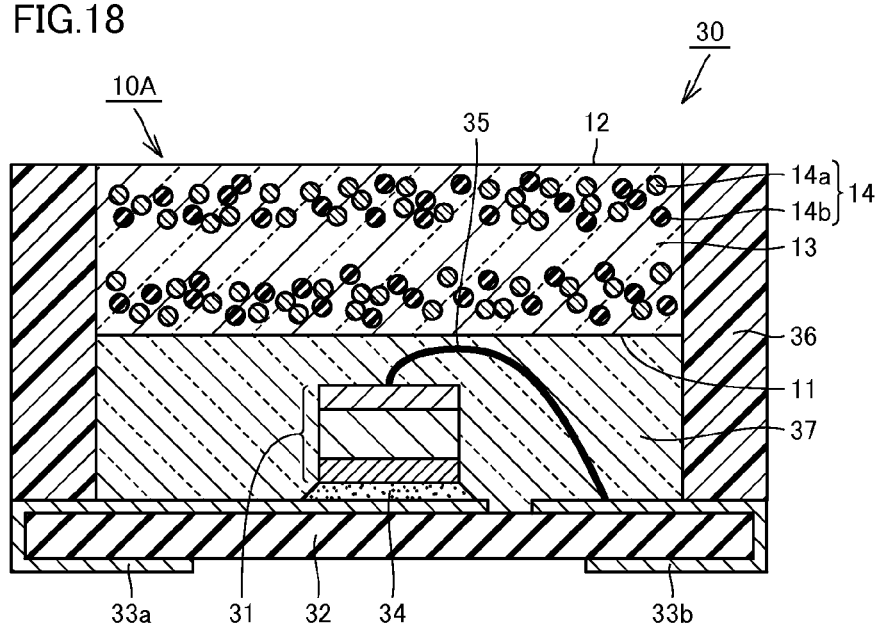
FIG. 18 is a schematic section view of a light emitting device in Embodiment 8 of the present invention.

FIG. 18 is a schematic section view of a light emitting device in Embodiment 8 of the present invention. Next, referring to FIG. 18, structure of the light emitting device in the present embodiment will be described.

The light emitting device in the present embodiment has a structure combining a semiconductor light emitting diode element (hereinafter, also simply referred to as LED) as a light emitting element, and any one of wavelength conversion members 10A to 10G of Embodiments 1 to 7 of the present invention as described above. That is, the light emitting device in the present embodiment has a wavelength conversion member having specific anisotropy in dispersion concentrations of semiconductor fine particle phosphors as described above. Here, description for the anisotropy in dispersion concentration is omitted because it is redundant. In a light emitting device 30 shown in FIG. 18, the one including wavelength conversion member 10A in Embodiment 1 of the present invention as described above is exemplified.

As shown in FIG. 18, light emitting device 30 mainly has a LED 31, a printed wiring board 32, a frame 36, a sealing resin layer 37, and wavelength conversion member 10A.

Printed wiring board 32 is a member that is to be a base, and is provided with a pair of electrodes 33a, 33b so that they reach the front and back faces. LED 31 is formed of a semiconductor chip having a connecting electrode on the front and back surfaces, and is mounted on principal plane of printed wiring board 32 by joining the back surface electrode with one electrode 33a provided on printed wiring board 32 with a conductive layer 34 interposed therebetween. Here, as conductive layer 34, a wax material such as a solder, a conductive adhesive, a conductive paste and the like may be used. The front side electrode of LED 31 is connected with other electrode 33b provided on printed wiring board 32 with a metal wire 35 interposed therebetween.

Frame 36 is provided to stand on printed wiring board 32 in such a manner that it surrounds LED 31. Wavelength conversion member 10A is fixed to an upper part of frame 36, and light input plane 11 thereof is opposed to LED 31. The space defined by printed wiring board 32, frame 36 and wavelength conversion member 10A is packed with sealing resin layer 37, and LED 31 is sealed by sealing resin layer 37.

Here, LED 31 included in light emitting device 30 in the present embodiment is a semiconductor light emitting diode element as described above. The semiconductor light emitting diode element is a light emitting element utilizing the property that light is emitted when an electron and a hole recombine, and has a semiconductor active layer, a p-type electrode layer, and a n-type electrode layer and has such a structure that the semiconductor active layer is sandwiched between the p-type electrode layer and the n-type electrode layer. Here, the p-type electrode layer is electrically connected with the front side electrode as described above and connected with an external circuit, and the n-type electrode layer is electrically connected with the back side electrode as described above and connected with an external circuit.

As a semiconductor substrate material of the semiconductor light emitting diode element, those conventionally known having a general composition may be used. In light emitting device 30 in the present embodiment, as LED 31, for example, a GaN-based semiconductor light emitting element, a ZnSe-based semiconductor light emitting element, a SiC-based semiconductor light emitting element and so on are preferably used. In particular, the GaN-based semiconductor light emitting element is particularly preferably used for the reason that emission efficiency is high and a light emitting device having high practicality can be realized.

As LED 31 included in light emitting device 30 in the present embodiment, a semiconductor light emitting diode element having a peak wavelength of emission spectrum within the wavelength region of 420 nm to 480 nm is particularly preferably used, and a semiconductor light emitting diode element having a peak wavelength of emission spectrum within the wavelength region of 350 to 420 nm may also be used. The semiconductor light emitting diode element having a peak wavelength of emission spectrum within the wavelength region of 420 nm to 480 nm is able to directly use the light emission of the semiconductor light emitting diode element as a blue component of light emission of the light emitting device. Therefore, a blue phosphor is no longer needed, and wavelength conversion loss by the phosphor is eliminated, leading the feature that emission efficiency of the light emitting device is improved and the device configuration is simplified. Since the semiconductor light emitting diode element having a peak wavelength of emission spectrum within the wavelength region of 350 to 420 nm generally has higher emission efficiency than the semiconductor light emitting diode element within the wavelength region of 420 to 480 nm, by using the semiconductor light emitting diode element, it is possible to improve the emission efficiency of the light emitting device. Further, in particular, the semiconductor light emitting diode element having a peak wavelength of emission spectrum within the wavelength region of 440 to 460 nm has a merit of having high wavelength consistency with a blue color filter used in the later-described image display device, and thus it is particularly preferably used from the view point of realizing both color reproducibility and emission efficiency of image display device when the light emitting device is intended for such use.

On the other hand, as the wavelength conversion member included in light emitting device 30 in the present embodiment, from the view point of color rendition, the one containing two or more kinds of semiconductor fine particle phosphors is preferably used, and from the view point of emission efficiency, the one containing four or less kinds of semiconductor fine particle phosphors is preferred. Therefore, as the wavelength conversion member, the one containing two or more and four or less kinds of semiconductor fine particle phosphors is particularly preferably used. However, from the view point of facility of manufacture, the wavelength conversion member preferably contains less kinds of semiconductor fine particle phosphors.

More specifically, when only one kind of semiconductor fine particle phosphor is contained, only part of wavelength region of visible light can be reproduced, so that the problem of deterioration in color rendition arises. However, on the other hand, reabsorption of fluorescence between semiconductor fine particle phosphors does not occur, so that emission efficiency is greatly improved. Also, when only one kind of semiconductor fine particle phosphor is contained, chromaticity adjustment by adjustment of quantity of the semiconductor fine particle phosphor can be readily conducted, and hence manufacture can be easily conducted. On the other hand, when four or more kinds of semiconductor fine particle phosphors are contained, the problem that manufacture becomes difficult, and the problem that reabsorption of fluorescence is more likely to occur and deterioration in emission efficiency becomes significant arise although color rendition is improved.

As a particularly preferred combination of LED 31 and a wavelength conversion member in light emitting device 30 in the present embodiment, combination of blue LED and one kind of phosphor (for example, yellow phosphor) can be recited. By employing this combination, it is possible to obtain the effect of realizing a light emitting device having high emission efficiency.

As other preferred combination, combination of blue LED and two kinds of phosphors (for example, green phosphor and red phosphor) can be recited. By employing this combination, it is possible to obtain the effect of realizing a light emitting device having high color rendition and high emission efficiency.

As other preferred combination, combination of ultraviolet LED and three kinds of phosphors (for example, blue phosphor, green phosphor and red phosphor) can be recited. By employing this combination, ultraviolet LED having high emission efficiency may be used, so that it is possible to obtain the effect of realizing a light emitting device having high emission efficiency.

In light emitting device 30 in the present embodiment as described above, excitation light outputted from LED 31 is inputted from light input plane 11 of the wavelength conversion member, and part of the light inputted from light input plane 11 penetrates light transmissive member 13 and is outputted from light output plane 12, and part of the light inputted from light input plane 11 is absorbed by semiconductor fine particle phosphor 14 and emitted as fluorescence after wavelength conversion, and outputted from light output plane 12, and these lights outputted from light output plane 12 are mixed and radiated outside as wavelength converted light. At this time, by the action of anisotropy in dispersion concentrations in the wavelength conversion member as described above, emission efficiency of the wavelength converted light outputted from light output plane 12 can be improved. Therefore, by light emitting device 30 in the present embodiment, it is possible to realize a light emitting device having higher emission efficiency than a conventional light emitting device.

The emission spectrum of output light of light emitting device 30 in the present embodiment preferably contains light of blue wavelength ranging from 420 nm to 480 nm, light of green wavelength ranging from 500 nm to 550 nm, and light of red wavelength ranging from 580 nm to 650 nm. Also when light emitting device 30 in the present embodiment is applied to a later-described image display device, by designing to be able to output light having wavelength characteristics consistent with a color filter as will be described later, it is possible to realize an image display device having high color reproducibility and high emission efficiency.

Figure 19:
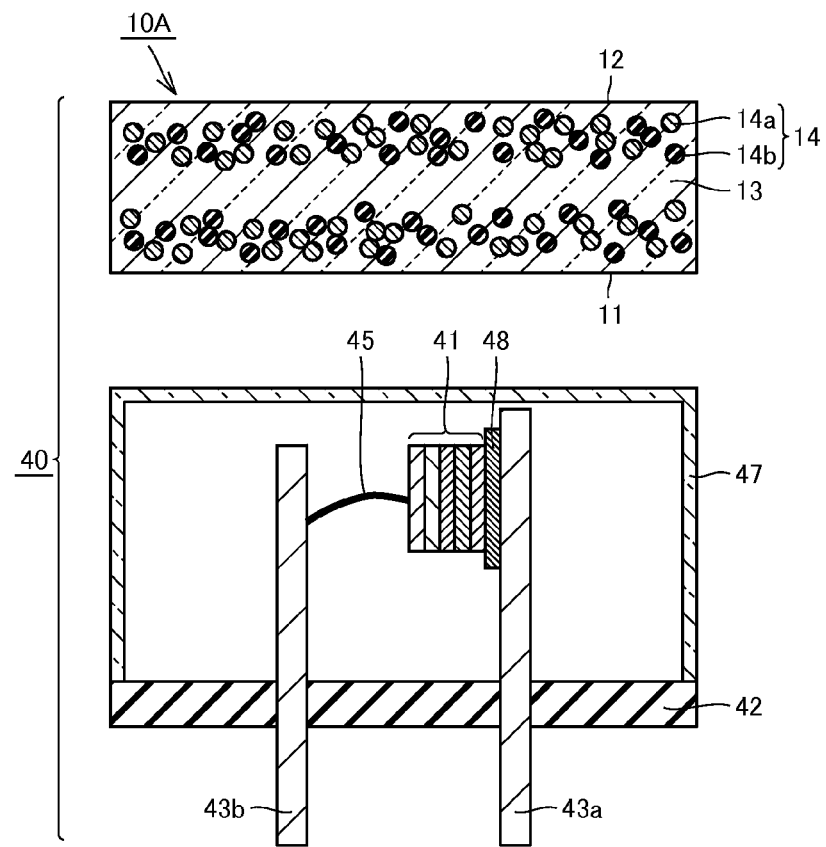
FIG. 19 is a schematic section view of a light emitting device in Embodiment 9 of the present invention.

FIG. 19 is a schematic section view of a light emitting device in Embodiment 9 of the present invention. Next, referring to FIG. 19, structure of the light emitting device in the present embodiment will be described.

The light emitting device in the present embodiment has a structure combining a semiconductor light emitting laser diode element (hereinafter, also referred to simply as LD (Laser Diode)) as a light emitting element, and any one of wavelength conversion members 10A to 10G of Embodiments 1 to 7 of the present invention as described above. That is, the light emitting device in the present embodiment has a wavelength conversion member having specific anisotropy in dispersion concentrations of semiconductor fine particle phosphors as described above. Here, description for the anisotropy in dispersion concentration is omitted because it is redundant. In a light emitting device 40 shown in FIG. 19, the one including wavelength conversion member 10A in Embodiment 1 of the present invention as described above is exemplified.

As shown in FIG. 19, light emitting device 40 mainly has a LD 41, a heat sink stem 42, a window cap 47, and wavelength conversion member 10A.

Heat sink stem 42 is a member that is to be a base, and is provided with a pair of terminal pins 43a, 43b at its predetermined positions. LD 41 is formed of a semiconductor chip having a connecting electrode on the front and back surfaces, and is mounted on heat sink stem 42 by joining the back surface electrode with one terminal pin 43a provided on heat sink stem 42 with a Si submount 48 interposed therebetween. Here, for joining LD 41 and Si submount 48, brazing using a solder or the like is preferably used, and for joining of Si submount 48 and terminal pin 43a, a conductive paste such as silver paste is preferably used. Also, front side electrode of LD 41 is connected with other terminal pin 43b provided on heat sink stem 42 with a metal wire 45 interposed therebetween.

Window cap 47 is formed from a box-like member having a glass window for outputting laser light outside, and is connected with heat sink stem 42 so as to cover LD 41. Wavelength conversion member 10A is disposed at a predetermined distance from window cap 47, and light input plane 11 thereof is opposed to LD 41. As a result, wavelength conversion member 10A is irradiated with laser light outputted from LD 41.

Here, LD 41 included in light emitting device 40 in the present embodiment is a semiconductor light emitting laser diode element as described above. The semiconductor light emitting laser diode element is a light emitting element utilizing the property that light is emitted when an electron and a hole recombine, and has a semiconductor active layer, a p-type semiconductor layer, a n-type semiconductor layer, a p-type electrode layer and a n-type electrode layer, and has such a structure that the semiconductor active layer is sandwiched between the p-type semiconductor layer and the n-type semiconductor layer, and this is further sandwiched between the p-type electrode layer and the n-type electrode layer. Here, the p-type electrode layer is electrically connected with the front side electrode as described above and connected with an external circuit, and the n-type electrode layer is electrically connected with the back side electrode as described above and connected with an external circuit.

As a semiconductor substrate material of the semiconductor light emitting laser diode element, the one that is conventionally known and has a general composition may be used, and in light emitting device 40 in the present embodiment, as LD 41, for example, a GaN-based semiconductor light emitting element, a ZnSe-based semiconductor light emitting element, a SiC-based semiconductor light emitting element and the like are preferably used. In particular, the GaN-based semiconductor light emitting element is particularly preferably used for the reason that emission efficiency is high and a light emitting device having high practicality can be realized.

As LD 41 included in light emitting device 40 in the present embodiment, a semiconductor light emitting laser diode element having a peak wavelength of emission spectrum within the wavelength region of 420 nm to 480 nm is particularly preferably used, and a semiconductor light emitting laser diode element having a peak wavelength of emission spectrum within the wavelength region of 350 to 420 nm may also be used. The semiconductor light emitting laser diode element having a peak wavelength of emission spectrum within the wavelength region of 420 nm to 480 nm is able to directly use the light emission of the semiconductor light emitting laser diode element as a blue component of light emission of the light emitting device. Therefore, a blue phosphor is no longer needed, and wavelength conversion loss by the phosphor is eliminated, leading the feature that emission efficiency of the light emitting device is improved and the device configuration is simplified. Since the semiconductor light emitting laser diode element having a peak wavelength of emission spectrum within the wavelength region of 350 to 420 nm generally has higher emission efficiency than the semiconductor light emitting laser diode element within the wavelength region of 420 to 480 nm, by using the semiconductor light emitting laser diode element, it is possible to improve the emission efficiency of the light emitting device. Further, in particular, the semiconductor light emitting laser diode element having a peak wavelength of emission spectrum within the wavelength region of 440 to 460 nm has a merit of having high wavelength consistency with a blue color filter used in the later-described image display device, and thus it is particularly preferably used from the view point of realizing both color reproducibility and emission efficiency of the image display device when the light emitting device is intended for such use.

On the other hand, as the wavelength conversion member included in light emitting device 40 in the present embodiment, from the view point of color rendition, the one containing two or more kinds of semiconductor fine particle phosphors is preferably used, and from the view point of emission efficiency, the one containing four or less kinds of semiconductor fine particle phosphors is preferred. Therefore, as the wavelength conversion member, the one containing two or more and four or less kinds of semiconductor fine particle phosphors is particularly preferably used. However, from the view point of facility of manufacture, the wavelength conversion member preferably contains lesser kinds of semiconductor fine particle phosphors.

More specifically, when only one kind of semiconductor fine particle phosphor is contained, only part of wavelength region of visible light can be reproduced, so that the problem of deterioration in color rendition arises. However, on the other hand, reabsorption of fluorescence between semiconductor fine particle phosphors does not occur, so that emission efficiency is greatly improved. Also, when only one kind of semiconductor fine particle phosphor is contained, chromaticity adjustment by adjustment of quantity of the semiconductor fine particle phosphor can be readily conducted, and hence manufacture can be easily conducted. On the other hand, when four or more kinds of semiconductor fine particle phosphors are contained, the problem that manufacture becomes difficult, and the problem that reabsorption of fluorescence is more likely to occur and deterioration in emission efficiency becomes significant arise although color rendition is improved.

As a particularly preferred combination of LD 41 and a wavelength conversion member in light emitting device 40 in the present embodiment, combination of blue LD and one kind of phosphor (for example, yellow phosphor) can be recited. By employing this combination, it is possible to obtain the effect of realizing a light emitting device having high emission efficiency.

As other preferred combination, combination of blue LD and two kinds of phosphors (for example, green phosphor and red phosphor) can be recited. By employing this combination, it is possible to obtain the effect of realizing a light emitting device having high color rendition and high emission efficiency.

As other preferred combination, combination of ultraviolet LD and three kinds of phosphors (for example, blue phosphor, green phosphor and red phosphor) can be recited. By employing this combination, ultraviolet LD having high emission efficiency may be used, so that it is possible to obtain the effect of realizing a light emitting device having high emission efficiency.

In light emitting device 40 in the present embodiment as described above, excitation light outputted from LD 41 is inputted from light input plane 11 of the wavelength conversion member, and part of the light inputted from light input plane 11 penetrates light transmissive member 13 and is outputted from light output plane 12, and part of the light inputted from light input plane 11 is absorbed by semiconductor fine particle phosphor 14 and emitted as fluorescence after wavelength conversion, and outputted from light output plane 12, and these lights outputted from light output plane 12 are mixed and radiated outside as wavelength converted light. At this time, by the action of anisotropy in dispersion concentrations in the wavelength conversion member as described above, emission efficiency of the wavelength converted light outputted from light output plane 12 can be improved. Therefore, by light emitting device 40 in the present embodiment, it is possible to realize a light emitting device having higher emission efficiency than a conventional light emitting device.

The emission spectrum of output light of light emitting device 40 in the present embodiment preferably contains light of blue wavelength ranging from 420 nm to 480 nm, light of green wavelength ranging from 500 nm to 550 nm, and light of red wavelength ranging from 580 nm to 650 nm. Also when light emitting device 40 in the present embodiment is applied to a later-described image display device, by designing to be able to output light having wavelength characteristics consistent with a color filter as will be described later, it is possible to realize an image display device having high color reproducibility and high emission efficiency.

Figure 20:
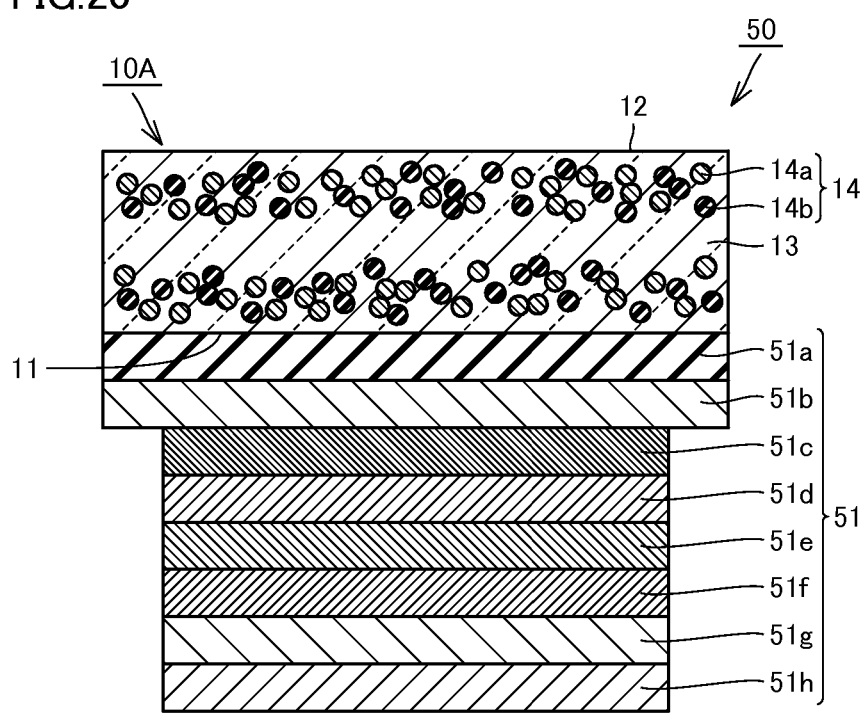
FIG. 20 is a schematic section view of a light emitting device in Embodiment 10 of the present invention.

FIG. 20 is a schematic section view of a light emitting device in Embodiment 10 of the present invention. Next, referring to FIG. 20, structure of the light emitting device in the present embodiment will be described.

The light emitting device in the present embodiment has a structure combining an organic electroluminescence element (hereinafter, also referred to simply as EL (Electroluminescence)) as a light emitting element, and any one of wavelength conversion members 10A to 10G of Embodiments 1 to 7 of the present invention as described above. That is, the light emitting device in the present embodiment has a wavelength conversion member having specific anisotropy in dispersion concentrations of semiconductor fine particle phosphors as described above. Here, description for the anisotropy in dispersion concentration is omitted because it is redundant. In a light emitting device 50 shown in FIG. 20, the one including wavelength conversion member 10A in Embodiment 1 of the present invention as described above is exemplified.

As shown in FIG. 20, light emitting device 50 mainly has an EL 51 and wavelength conversion member 10A.

EL 51 includes a substrate 51$a$, an anode part 51$b$ disposed on one principal plane of substrate 51$a$, and a hole injection layer 51$c$, a hole transport layer 51$d$, a light emitting layer 51$e$, an electron transport layer 51$f$, an electron injection layer 51$g$, and a cathode part 51$h$ sequentially laminated on anode part 51$b$. On the other hand, wavelength conversion member 10A is provided on the other principal plane of substrate 51$a$, and light input plane 11 thereof is opposed to the side of substrate 51$a$.

Here, EL 51 included in light emitting device 50 in the present embodiment is an organic electroluminescence element as described above. The organic electroluminescence element is a light emitting element utilizing the fact that upon application of a voltage, light emitting layer 51$e$ receives a hole from hole transport layer 51$d$ while receiving an electron from electron transport layer 51$f$, and the hole and the electron recombine in light emitting layer 51$e$ to emit light.

Light emitting layer 51e contains a host material, and preferably further contains a dopant formed of a phosphorescence emitting material. The host material is preferably a charge transport material (collective term for electron transporting material and hole transporting material), and is further preferably contains a hole transporting material and an electron transporting material.

Preferably, energy level of the lowest excited multiplet state of the host material is larger than energy level of the lowest excited multiplet state of the dopant material. By co-evaporation of the host material and the dopant material, it is possible to preferably form a light emitting layer in which the host material is doped with the dopant material.

Concrete examples of the host material include those having a pyrene backbone, those having a carbazole backbone, those having a diarylamine backbone, those having a pyridine backbone, those having a pyrazine backbone, those having a triazine backbone and those having arylsilane backbone.

Generally, the phosphorescence emitting material contained in light emitting layer 51e is preferably a complex containing a transition metal atom or a lanthanoid atom. The phosphorescence emitting material may be used singly or in combination of two or more kinds.

As the transition metal atom, ruthenium, rhodium, palladium, tungsten, rhenium, osmium, iridium and platinum are preferably recited and rhenium, iridium and platinum are more preferably recited without particularly limited to these.

As a lanthanoid atom, lanthanum, cerium, praseodymium, neodymium, samarium, europium, gadolinium, terbium, dysprosium, holmium, erbium, thulium, ytterbium, and lutecium are recited. Among these lanthanoid atoms, neodymium, europium and gadolinium are particularly preferred.

As concrete examples of the phosphorescence emitting material satisfying the above requirement, FIrpic: bis[2-(4,6-difluorophenyl)pyridinato]picolinatoiridium (III), FIr6: bis [2-(4',6'-difluorophenyl)pyridinato-N,C2']tetrakis(1-pyrazolyl)borate, Ir(ppy)3: Tris-phenylpyridinato iridium (III) and so on are exemplified.

Hole injection layer 51c and hole transport layer 51d are layers having a function of receiving a hole from the anode or the side of the anode and transporting it to the side of the cathode. Preferably, hole injection layer 51c and hole transport layer 51d are the layers concretely containing, as a hole transporting material, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine compound, a porphyrin compound, an organic silane derivative, carbon and the like.

Electron injection layer 51g and electron transport layer 51f are layers having a function of receiving an electron from the cathode or the side of the cathode and transporting it to the side of the anode. Preferably, electron injection layer 51g and electron transport layer 51f are layers, concretely containing, as an electron transporting material, a triazole derivative, an oxazole derivative, an oxadiazole derivative, an imidazole derivative, a fluorenone derivative, an anthraquinodimethane derivative, an anthrone derivative, a diphenylquinone derivative, a thiopyrazine oxide derivative, a carbodiimide derivative, a fluorenylidene methane derivative, a distyrylpyrazine derivative, an aromatic tetracarboxylic anhydride such as naphthalene or perylene, a phthalocyanine derivative, a metal complex of a 8-quinolinol derivative, metal phthalocyanine, various metal complexes represented by metal complexes having benzoxazole or benzothiazole as a ligand, an organic silane derivative or the like. Among these, a layer containing, as an electron transporting material, an aromatic heterocyclic compound having at least one hetero atom in the molecule is preferred. The aromatic heterocyclic compound is a hetero compound having aromaticity, and pyridine, pyrazine, pyrimidine, pyridazine, triazine, pyrazole, imidazole, benzimidazole, triazole, thiazole, benzothiazole, isothiazole, benzisothiazole, thiadiazole or condensed rings thereof are recited.

As for anode part 51b, the shape, structure, size and the like thereof are not particularly limited as far as it ordinarily has the function as an electrode that supplies hole injection layer 51c with a hole, and it may be appropriately selected from known electrode materials according to the use, purpose and the like of the organic electroluminescence element. The material of anode part 51b is preferably a transparent material. In this case, it is possible to take out light emission of light emitting layer 51e from the side of the anode part without any loss.

As a material forming anode part 51b, for example, metals, alloys, metal oxides, conductive compounds or mixtures thereof may be preferably used, and a material having a work function of greater than or equal to 4.0 eV is particularly preferred. Concrete examples of the material of anode part 51b include conductive metal oxides such as tin oxide doped with antimony, fluorine or the like (ATO, FTO), tin oxide, zinc oxide, indium oxide, indium tin oxide (ITO), and indium zinc oxide (IZO), metals such as gold, silver, chromium and nickel, mixtures or laminates of these metals and conductive metal oxides, inorganic conductive substances such as copper iodide and copper sulfide, organic conductive materials such as polyaniline, polythiophene and polypyrrole, and laminates of these and ITO. Among these, conductive metal oxides are particularly preferred, and from the view point of productivity, high conductivity, transparency and the like, ITO is particularly preferred.

Also, a thin film transistor (TFT: Thin Film Transistor) may be built inside anode part 51b. This is particularly preferred when an image display device is fabricated using an organic electroluminescence element because ON/OFF operation can be controlled using the thin film transistor in this case.

As for cathode part 51h, the shape, structure, size and the like thereof are not particularly limited as far as it ordinarily has the function as an electrode that supplies a electron injection layer with an electron, and it may be appropriately selected from known electrode materials according to the use, purpose and the like of the organic electroluminescence element.

As a material forming cathode part 51h, for example, metals, alloys, metal oxides, conductive compounds or mixtures thereof may be preferably used, and a material having a work function of less than or equal to 4.5 eV is particularly preferred. Concrete examples of the material of cathode part 51h include alkaline metals (for example, Li, Na, K, Cs and so on), alkaline earth metals (for example, Mg, Ca and so on), gold, silver, lead, aluminum, sodium-potassium alloy, lithium-aluminum alloy, magnesium-silver alloy, indium, and rare earth metals such as ytterbium. These may be used singly, however, it is preferred to use two or more kinds from the view point realizing both stability and electron injection property.

Preferably, substrate 51a has a function as a supporting base of the organic electroluminescence element, and does not scatter or attenuate the light emitted from light emitting layer 51e. Concrete examples of the material forming substrate 51a include inorganic materials such as yttrium-stabilized zirconia (YSZ) and glass, and organic materials including polyesters such as polyethylene terephthalate, polybutylene phthalate and polyethylene naphthalate, polystyrene, polycarbonate, polyethersulfone, polyarylate, polyimide, polycycloolefin, norbornene resin, and poly(chlorotrifluoroethylene).

As EL 51 included in light emitting device 50 in the present embodiment, an organic electroluminescence element having an emission wavelength of less than or equal to 520 nm is preferably used. This is because in light emitting device 50, semiconductor fine particle phosphors emitting green to red light can be efficiency excited. Also, as EL 51 included in light emitting device 50 in the present embodiment, an organic electroluminescence element having an emission wavelength of greater than or equal to 420 nm is preferably used. When emission wavelength of the organic electroluminescence element falls within the above range, light emission of the organic electroluminescence element can be directly used, and the device configuration is simplified and manufacture of the light emitting device is facilitated. Further, in particular, the organic electroluminescence element having a peak wavelength of emission spectrum within the wavelength region of 440 to 460 nm has a merit of having high wavelength consistency with a blue color filter used in the later-described image display device, and thus it is particularly preferably used from the view point of realizing both color reproducibility and emission efficiency of the image display device when the light emitting device is intended for such use.

On the other hand, as the wavelength conversion member included in light emitting device 50 in the present embodiment, from the view point of color rendition, the one containing two or more kinds of semiconductor fine particle phosphors is preferably used, and from the view point of emission efficiency, the one containing four or less kinds of semiconductor fine particle phosphors is preferred. Therefore, as the wavelength conversion member, the one containing two or more and four or less kinds of semiconductor fine particle phosphors is particularly preferably used. However, from the view point of facility of manufacture, the wavelength conversion member preferably contains lesser kinds of semiconductor fine particle phosphors.

More specifically, when only one kind of semiconductor fine particle phosphor is contained, only part of wavelength region of visible light can be reproduced, so that the problem of deterioration in color rendition arises. However, on the other hand, reabsorption of fluorescence between semiconductor fine particle phosphors does not occur, so that emission efficiency is greatly improved. Also, when only one kind of semiconductor fine particle phosphor is contained, chromaticity adjustment by adjustment of quantity of the semiconductor fine particle phosphor can be readily conducted, and hence manufacture can be easily conducted. On the other hand, when four or more kinds of semiconductor fine particle phosphors are contained, the problem that manufacture becomes difficult, and the problem that reabsorption of fluorescence is more likely to occur and deterioration in emission efficiency becomes significant arise although color rendition is improved.

As a particularly preferred combination of EL 41 and a wavelength conversion member in light emitting device 50 in the present embodiment, combination of blue EL and one kind of phosphor (for example, yellow phosphor), and combination of blue EL and two kinds of phosphors (for example, green phosphor and red phosphor) can be recited. By employing these combinations, it is possible to obtain the effect of easily realizing a surface-emitting light emitting device.

In light emitting device 50 in the present embodiment as described above, excitation light outputted from EL 51 is inputted from light input plane 11 of the wavelength conversion member, and part of the light inputted from light input plane 11 penetrates light transmissive member 13 and is outputted from light output plane 12, and part of the light inputted from light input plane 11 is absorbed by semiconductor fine particle phosphor 14 and emitted as fluorescence after wavelength conversion, and outputted from light output plane 12, and these lights outputted from light output plane 12 are mixed and radiated outside as wavelength converted light. At this time, by the action of anisotropy in dispersion concentrations in the wavelength conversion member as described above, emission efficiency of the wavelength converted light outputted from light output plane 12 can be improved. Therefore, by light emitting device 50 in the present embodiment, it is possible to realize a light emitting device having higher emission efficiency than a conventional light emitting device.

The emission spectrum of output light of light emitting device 50 in the present embodiment preferably contains light of blue wavelength ranging from 420 nm to 480 nm, light of green wavelength ranging from 500 nm to 550 nm, and light of red wavelength ranging from 580 nm to 650 nm. Also when light emitting device 50 in the present embodiment is applied to a later-described image display device, by designing to be able to output light having wavelength characteristics consistent with a color filter as will be described later, it is possible to realize an image display device having high color reproducibility and high emission efficiency.

In Embodiments 8 to 10 of the present invention as described above, while description has been made by taking light emitting device 30 configured by combination of a semiconductor light emitting diode element and a wavelength conversion member, light emitting device 40 configured by combination of a semiconductor light emitting laser diode element and a wavelength conversion member, and light emitting device 50 configured by combination of an organic electroluminescence element and a wavelength conversion member as examples, as a light emitting element that can be combined with wavelength conversion members 10A to 10G in Embodiments 1 to 7 of the present invention as described above, an inorganic electroluminescence element, and discharge lamps such as a xenon lamp and a fluorescent lamp can be recited as well.

When a light emitting device is configured by combining wavelength conversion members 10A to 10G in Embodiments 1 to 7 of the present invention as described above with a semiconductor light emitting diode element or a semiconductor light emitting laser diode element or an organic electroluminescence element, various structures other than the structures concretely exemplified in Embodiments 8 to 10 of the present invention as described above may be employed. That is, any light emitting devices having wavelength conversion members 10A to 10G in Embodiments 1 to 7 of the present invention as described above can be a light emitting device having higher emission efficiency in comparison with the conventional example regardless of the structure.

By the way, as an index for evaluating hue of a light emitting device, color rendition index is known. Color rendition index is a value quantitatively evaluating a degree of color deviation of emission spectrum in the light emitting device based on reference light defined by JIS (Japanese Industrial Standards). For averagely evaluating visibility of an object, average color rendition index (Ra) is generally used. Here, average color rendition index is an average value of color rendition index in several test colors. As a method of determining color rendition index of a light emitting device, a method for measuring emission spectrum of a light emitting device is exemplified.

As an index for evaluating lightness of a light emitting device, emission efficiency is known. Emission efficiency is a value represented by a ratio of light quantity of outputted light to inputted electric energy, and represented in a unit of 1 m/W. When emission efficiency is high, it is possible to illuminate lightly with a small electric power, and hence, it is important to increase the emission efficiency as much as possible in manufacturing the a light emitting device. As a method for measuring emission efficiency of a light emitting device, a method using a total luminous flux measuring device and so on are recited.

Figure 21:
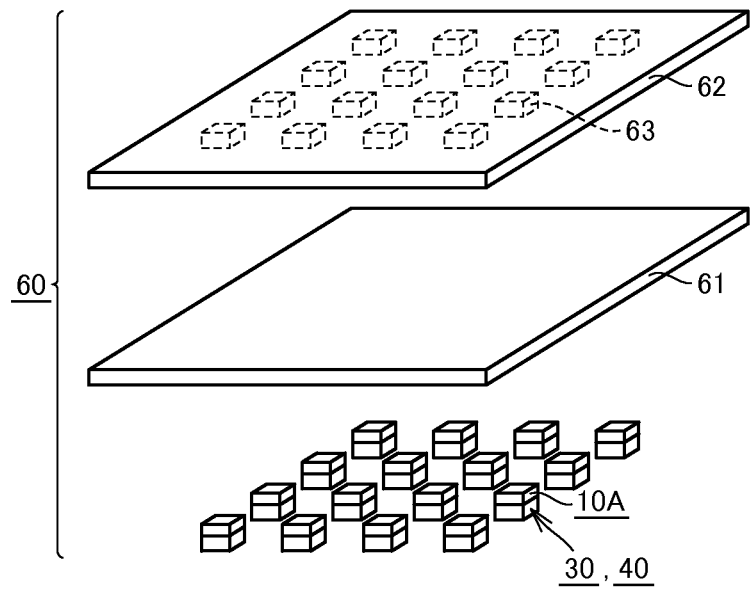
FIG. 21 is an exploded perspective view of an image display device in Embodiment 11 of the present invention.
Figure 22:
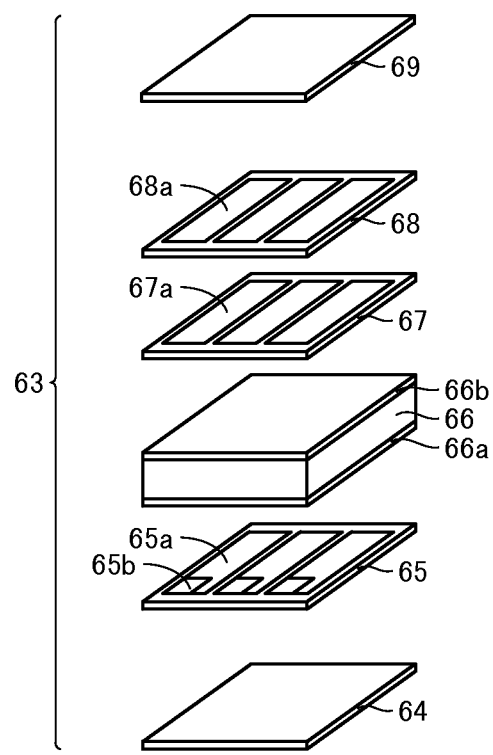
FIG. 22 is an enlarged exploded perspective view of a light conversion part of the image display device in Embodiment 11 of the present invention.
Figure 23:
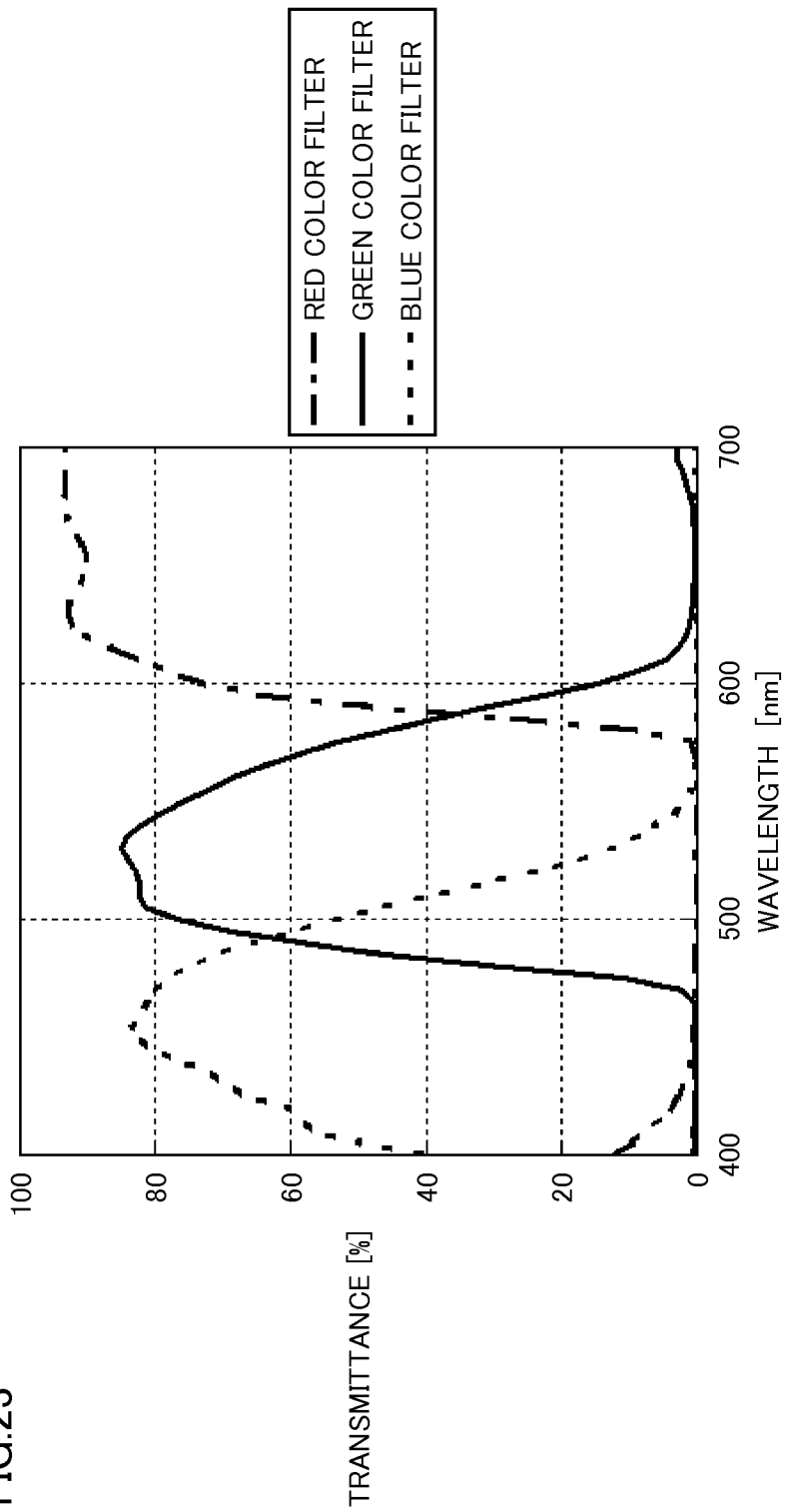
FIG. 23 is a graph showing transmission spectrums of color filters shown in FIG. 22.

FIG. 21 is an exploded perspective view of an image display device in Embodiment 11 of the present invention. FIG. 22 is an enlarged exploded perspective view of a light conversion part shown in FIG. 21. FIG. 23 is a graph showing a transmission spectrum of a color filter shown in FIG. 22, and the vertical axis represents transmittance [%], and the horizontal axis represents wavelength [nm]. Next, referring to these FIG. 21 to FIG. 30, structure of the image display device in the present embodiment will be described.

The image display device in the present embodiment has a structure combining any one of light emitting devices 30, 40 in Embodiments 8 and 9 of the present invention as described above, and an image display part. Therefore, the image display device in the present embodiment has any one of wavelength conversion members 10A to 10G in Embodiments 1 to 7 of the present invention as described above in light emitting devices 30, 40. In other words, the image display device in the present embodiment includes either a semiconductor light emitting diode element or a semiconductor light emitting laser diode element, and a wavelength conversion member having specific anisotropy in dispersion concentrations of semiconductor fine particle phosphors as described above. Here, description for the anisotropy in dispersion concentration is omitted because it is redundant. In an image display device 60 shown in FIG. 21 and FIG. 22, the one including wavelength conversion member 10A in Embodiment 1 of the present invention as described above is exemplified.

As shown in FIG. 21, image display device 60 in the present embodiment mainly has an image display part 62 and an irradiation part. Image display part 62 is a part capable of displaying image, and has a plurality of light conversion parts 63 in the form of arrays shown in FIG. 22. On the other hand, the irradiation part is a part that irradiates image display part 62 with light from behind, and includes a plurality of light emitting devices 30, 40 arranged in the form of arrays, serving as a light source, and a light guide plate 61 disposed between light emitting devices 30, 40 and image display part 62. Each of the plurality of light emitting devices 30, 40 has wavelength conversion member 10A on the principal plane on the side of image display part 62.

Light guide plate 61 has a function of alleviating unevenness of in-plane brightness of light that is outputted from the plurality of light emitting devices 30, 40 arranged in the form of arrays, and irradiates image display part 62, and by interposing light guide plate 61 between light emitting devices 30, 40 and image display part 62, in-plane intensity of light irradiating image display part 62 is uniformized, and unevenness of brightness of displayed image can be reduced. As light guide plate 61, for example, a plate-like member formed of acryl resin having unevenness may be used, and in-plane intensity of light is uniformized by diffusion of the light by the unevenness.

Light conversion part 63 provided in image display part 62 is a part having a function of allowing output of only the specific wavelength when it receives light input, and in particular, light conversion part 63 provided in image display device 60 in the present embodiment has an ability of transmitting only the light having a specific wavelength of the input light. The ability of transmitting only the light having a specific wavelength of the input light of light conversion part 63 is exerted by a color filter as will be described later, included in light conversion part 63.

As shown in FIG. 22, light conversion part 63 is made up of a lower polarization plate 64, a lower transparent conductive film 65, an orientation film 66a, a liquid crystal layer 66, an orientation film 66b, an upper transparent conductive film 67, a color filter 68 and an upper polarization plate 69 laminated in this order. Among these, lower transparent conductive film 65 is provided with respectively a plurality of (three in the depicted example) lower electrodes 65a and TFTs 65b, and also upper transparent conductive film 67 is provided with a plurality of upper electrodes 67a in correspondence with lower electrodes 65a. Color filter 68 is divided into a plurality of regions corresponding to lower electrodes 65a and upper electrodes 67a, and in these regions, filter parts 68a that transmit light of different wavelengths are disposed. Light conversion part 63 having the structure as described above is also called a liquid crystal display part.

Here, as color filter 68, the one having transmission spectrums as shown in FIG. 23, for example, is particularly preferably used. In other words, as color filter 68, the one having three filter parts 68a including a red color filter, a green color filter and a blue color filter is preferably used. Each filter part 68a is formed of, for example, a dye, a pigment or the like. By using such color filters, it becomes possible to reproduce most of color tones occurring in nature in image display part 62, and an image display device having excellent color reproducibility can be realized. As color filter 68, any color filters including three-color color filter having different transmission spectrums, two-color, four-color or five or more-color color filters may be used besides the three-color color filter having the transmission spectrums shown in FIG. 23.

In image display device 60 in the present embodiment, the one that outputs white light is preferably used as light emitting device 30, 40, and the white light outputted from light emitting device 30, 40 penetrates light guide plate 61 and irradiates light conversion part 63 of image display part 62. In light conversion part 63, by ON/OFF operation of TFT 65b, orientation of liquid crystal in liquid crystal layer 66 is controlled, and as a result, quantity of light transmitting from lower polarization plate 64 to upper polarization plate 69 through each filter part 68a included in color filter 68 is controlled. As a result, image is displayed in image display part 62.

In image display device 60 in the present embodiment as described above, since light emitting device 30, 40 has a wavelength conversion member having anisotropy in dispersion concentration as described above, emission efficiency of the wavelength converted light outputted from light emitting device 30, 40 is improved. Therefore, by image display device 60 having the constitution as described above, it is possible to obtain an image display device realizing high emission efficiency (screen brightness) and excellent color reproducibility.

Figure 24:
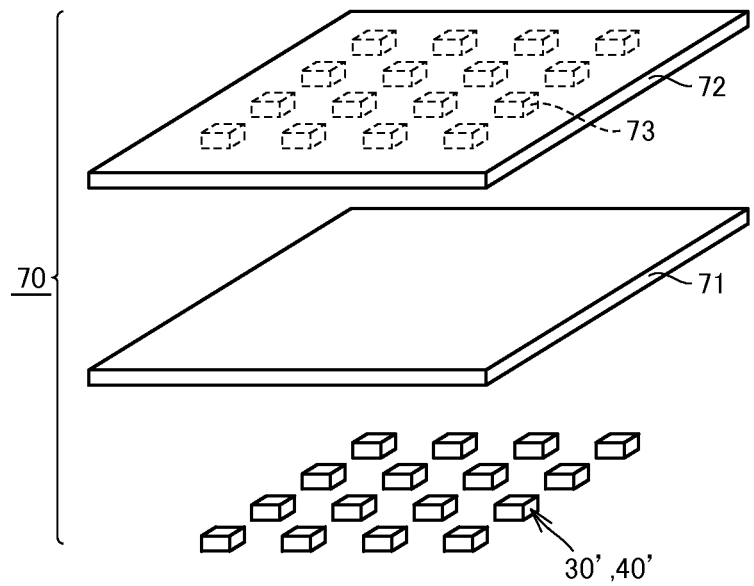
FIG. 24 is an exploded perspective view of an image display device in Embodiment 12 of the present invention.
Figure 25:
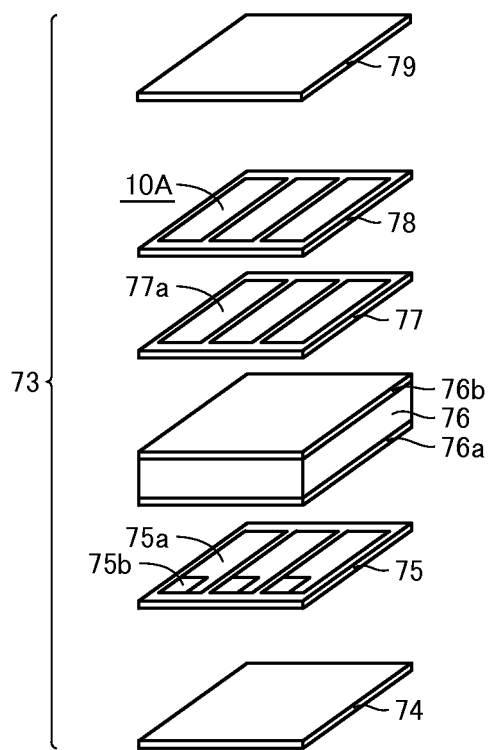
FIG. 25 is an enlarged exploded perspective view of a light conversion part of the image display device in Embodiment 12 of the present invention.

FIG. 24 is an exploded perspective view of an image display device in Embodiment 12 of the present invention. FIG. 25 is an enlarged exploded perspective view of a light conversion part shown in FIG. 24. Next, referring to these FIG. 24 and FIG. 25, structure of the image display device in the present embodiment will be described.

The image display device in the present embodiment has a structure combining a light emitting device 30' including a semiconductor light emitting diode element as a light emitting element or a light emitting device 40' including a semiconductor light emitting laser diode element as a light emitting element, and an image display part including any one of wavelength conversion members 10A to 10G in Embodiments 1 to 7 of the present invention as described above. In other words, the image display device in the present embodiment includes either a semiconductor light emitting diode element or a semiconductor light emitting laser diode element, and a wavelength conversion member having specific anisotropy in dispersion concentrations of semiconductor fine particle phosphors as described above. Here, description for the anisotropy in dispersion concentration is omitted because it is redundant. In image display device 70 shown in FIG. 24 and FIG. 25, the one including wavelength conversion member 10A in Embodiment 1 of the present invention as described above is exemplified.

As shown in FIG. 24, image display device 70 in the present embodiment mainly has an image display part 72 and an irradiation part. Image display part 72 is a part capable of displaying image, and has a plurality of light conversion parts 73 in the form of arrays shown in FIG. 25. On the other hand, the irradiation part is a part that irradiates image display part 72 with light from behind, and includes a plurality of light emitting devices 30', 40' arranged in the form of arrays, serving as a light source, and a light guide plate 71 disposed between light emitting devices 30', 40' and image display part 72. Light emitting devices 30', 40' may be light emitting devices 30, 40 as in Embodiments 8 and 9 of the present invention as described above including wavelength conversion members 10A to 10G in Embodiments 1 to 7 of the present invention as described above, or may be a conventional light emitting device not including wavelength conversion members 10A to 10G in Embodiments 1 to 7 of the present invention as described above.

Light guide plate 71 has a function of alleviating unevenness of in-plane brightness of light that is outputted from the plurality of light emitting devices 30', 40' arranged in the form of arrays, and irradiates image display part 72, and by interposing light guide plate 71 between light emitting devices 30', 40' and image display part 72, in-plane intensity of light irradiating image display part 72 is uniformized, and unevenness of brightness of displayed image can be reduced. As light guide plate 71, for example, a plate-like member formed of acryl resin having unevenness may be used, and in-plane intensity of light is uniformized by diffusion of the light by the unevenness.

Light conversion part 73 provided in image display part 72 is a part having a function of allowing output of only the light having a specific wavelength when it receives light input, and in particular, light conversion part 73 provided in image display device 70 in the present embodiment has an ability of outputting the light having a wavelength different from that of the input light. The ability of outputting the light having a wavelength different from that of the input light of light conversion part 73 is exerted by wavelength conversion member 10A included in light conversion part 73.

As shown in FIG. 24, light conversion part 73 is made up of a lower polarization plate 74, a lower transparent conductive film 75, an orientation film 76a, a liquid crystal layer 76, an orientation film 76b, an upper transparent conductive film 77, a wavelength conversion plate 78 and an upper polarization plate 79 laminated in this order. Among these, lower transparent conductive film 75 is provided with respectively a plurality of (three in the depicted example) lower electrodes 75a and TFTs 75b, and also upper transparent conductive film 77 is provided with a plurality of upper electrodes 77a in correspondence with lower electrodes 75a. Wavelength conversion plate 78 is divided into a plurality of regions corresponding to lower electrodes 75a and upper electrodes 77a, and in these regions, wavelength conversion members 10A that transmit light of different wavelength regions are disposed. Light conversion part 73 having the structure as described above is also called a liquid crystal display part.

Here, as wavelength conversion plate 78, for example, the one including a wavelength conversion member that converts wavelength of input light and outputs blue light, a wavelength conversion member that converts wavelength of input light and outputs green light, and a wavelength conversion member that converts wavelength of input light and outputs red light is preferably used. Each of these wavelength conversion members can be formed by appropriately adjusting the kind, concentration and the like of semiconductor fine particle phosphors used in the wavelength conversion member. By using such wavelength conversion plate 78, it becomes possible to reproduce most of color tones occurring in nature in image display part 72, and an image display device having excellent color reproducibility can be realized. As wavelength conversion plate 78, any other kinds may be used besides the one that outputs light of three colors.

In image display device 70 in the present embodiment, the light outputted from light emitting device 30', 40' penetrates light guide plate 71 and irradiates light conversion part 73 of image display part 72. In light conversion part 73, by ON/OFF operation of TFT 75b, orientation of liquid crystal in liquid crystal layer 76 is controlled, and as a result, quantity of light transmitting from lower polarization plate 74 to upper polarization plate 79 through each wavelength conversion member 10A included in wavelength conversion plate 78 is controlled. As a result, image is displayed in image display part 72.

In image display device 70 in the present embodiment as described above, since light conversion part 73 of image display part 72 has a wavelength conversion member having anisotropy in dispersion concentration as described above, emission efficiency of the wavelength converted light outputted from image display part 72 is improved. Therefore, by image display device 70 having the constitution as described above, it is possible to obtain an image display device realizing high emission efficiency (screen brightness) and excellent color reproducibility.

Figure 26:
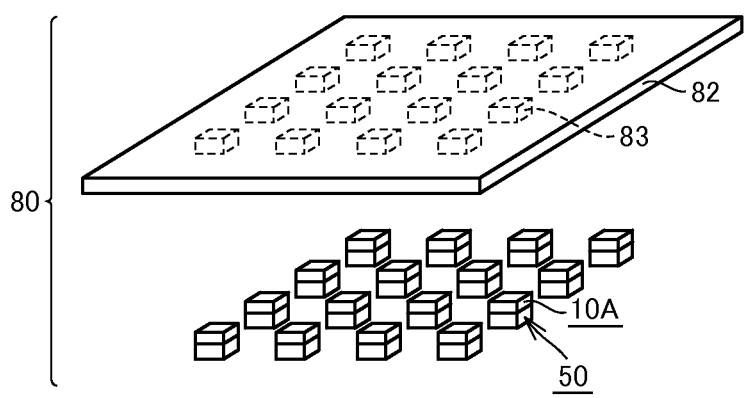
FIG. 26 is an exploded perspective view of an image display device in Embodiment 13 of the present invention.
Figure 27:
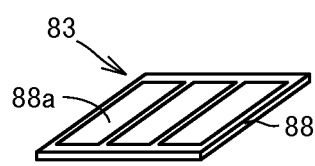
FIG. 27 is an enlarged exploded perspective view of a light conversion part of the image display device in Embodiment 13 of the present invention.

FIG. 26 is an exploded perspective view of an image display device in Embodiment 13 of the present invention. FIG. 27 is an enlarged exploded perspective view of a light conversion part shown in FIG. 26. Next, referring to these FIG. 26 and FIG. 27, structure of the image display device in the present embodiment will be described.

The image display device in the present embodiment has a structure combining light emitting device 50 in Embodiment 10 of the present invention as described above, and an image display part. Therefore, the image display device in the present embodiment has any one of wavelength conversion members 10A to 10G in Embodiments 1 to 7 of the present invention as described above in light emitting device 50. In other words, the image display device in the present embodiment includes an organic electroluminescence element, and a wavelength conversion member having specific anisotropy in dispersion concentrations of semiconductor fine particle phosphors as described above. Here, description for the anisotropy in dispersion concentration is omitted because it is redundant. In image display device 80 shown in FIG. 26 and FIG. 27, the one including wavelength conversion member 10A in Embodiment 1 of the present invention as described above is exemplified.

As shown in FIG. 26, image display device 80 in the present embodiment mainly has an image display part 82 and an irradiation part. Image display part 82 is a part capable of displaying image, and has a plurality of light conversion parts 83 in the form of arrays shown in FIG. 27. On the other hand, the irradiation part is a part that irradiates image display part 82 with light from behind, and includes a plurality of light emitting devices 50 arranged in the form of arrays, serving as a light source. Each of the plurality of light emitting devices 50 has wavelength conversion member 10A on its principal plane on the side of image display part 82.

Light conversion part 83 provided in image display part 82 has a function of allowing output of only the light having a specific wavelength when it receives light input, and in particular, light conversion part 83 provided in image display device 80 in the present embodiment has a property of transmitting light having a specific wavelength of the input light. The function of transmitting light having a specific wavelength of the input light of light conversion part 83 is exerted by a color filter as will be described later, included in light conversion part 83.

As shown in FIG. 27, light conversion part 83 is formed of a color filter 88. Color filter 88 is divided into a plurality of regions, and in these regions, filter parts 88a transmitting light of different wavelength regions are disposed.

Here, as color filter 88, for example, the one having transmission spectrums as shown in FIG. 23 as described above is particularly preferably used. In other words, as color filter 88, the one having three filter parts 88a including a red color filter, a green color filter and a blue color filter is preferably used. Each filter part 88a is formed of, for example, a dye, a pigment or the like. By using such color filters, it becomes possible to reproduce most of color tones occurring in nature in image display part 82, and an image display device having excellent color reproducibility can be realized. As color filter 88, any color filters including three-color color filter having different transmission spectrums, two-color, four-color or five or more-color color filters may be used besides the three-color color filter having the transmission spectrums shown in FIG. 23.

In image display device 80 in the present embodiment, the one that outputs white light is preferably used as light emitting device 50, and the white light outputted from light emitting device 50 irradiates light conversion part 83 of image display part 82. Inside light emitting device 50, a TFT that is not shown in the drawing is provided, and by ON/OFF operation of the TFT, quantity of light transmission through each filter part 88a included in color filter 88 is controlled. As a result, image is displayed in image display part 82.

In image display device 80 in the present embodiment as described above, since light emitting device 50 has a wavelength conversion member having anisotropy in dispersion concentration as described above, emission efficiency of the wavelength converted light outputted from light emitting device 50 is improved. Therefore, by employing image display device 80 having the constitution as described above, it is possible to obtain an image display device realizing high emission efficiency (screen brightness) and excellent color reproducibility.

In image display device 80 in the present embodiment, the constitution not arranging a light guide plate is employed. This is because light of the irradiation part can be configured to be able to irradiate the entire face of image display part 82 without arranging a light guide plate. However, light guide plate may of course be provided in case of necessity.

Figure 28:
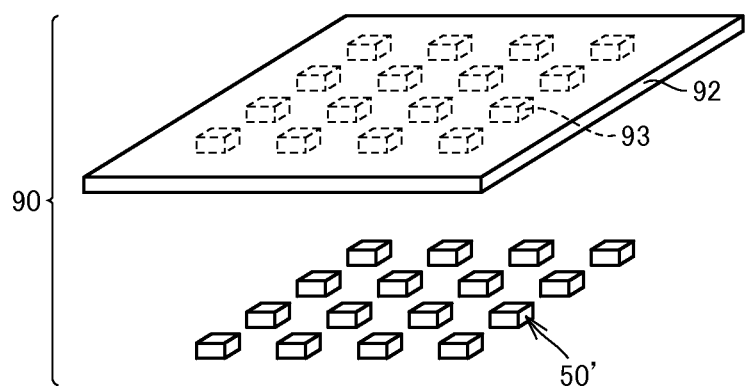
FIG. 28 is an exploded perspective view of an image display device in Embodiment 14 of the present invention.
Figure 29:
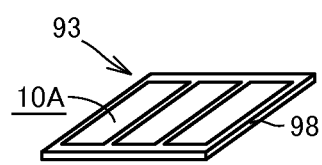
FIG. 29 is an enlarged exploded perspective view of a light conversion part of the image display device in Embodiment 14 of the present invention.

FIG. 28 is an exploded perspective view of an image display device in Embodiment 14 of the present invention. FIG. 29 is an enlarged exploded perspective view of a light conversion part shown in FIG. 28. Next, referring to these FIG. 28 and FIG. 29, structure of the image display device in the present embodiment will be described.

The image display device in the present embodiment has a structure combining a light emitting device 50' including an organic electroluminescence element as a light emitting element, and an image display part including any one of wavelength conversion members 10A to 10G in Embodiments 1 to 7 of the present invention as described above. In other words, the image display device in the present embodiment includes an organic electroluminescence element, and a wavelength conversion member having specific anisotropy in dispersion concentrations of semiconductor fine particle phosphors as described above. Here, description for the anisotropy in dispersion concentration is omitted because it is redundant. In image display device 90 shown in FIG. 28 and FIG. 29, the one including wavelength conversion member 10A in Embodiment 1 of the present invention as described above is exemplified.

As shown in FIG. 28, image display device 90 in the present embodiment mainly has an image display part 92 and an irradiation part. Image display part 92 is a part capable of displaying image, and has a plurality of light conversion parts 93 in the form of arrays shown in FIG. 29. On the other hand, the irradiation part is a part that irradiates image display part 92 with light from behind, and includes a plurality of light emitting devices 50' arranged in the form of arrays, serving as a light source. Light emitting device 50' may be light emitting device 50 as in Embodiment 10 of the present invention described above, including wavelength conversion members 10A to 10G in Embodiments 1 to 7 of the present invention as described above, or may be a conventional light emitting device not including wavelength conversion members 10A to 10G in Embodiments 1 to 7 of the present invention as described above.

Light conversion part 93 provided in image display part 92 is a part having a function of allowing output of only the light having a specific wavelength when it receives light input, and in particular, light conversion part 93 provided in image display device 90 in the present embodiment has a property of outputting light having a wavelength different from that of input light. The function of outputting light having a wavelength different from that of input light of light conversion part 93 is exerted by wavelength conversion member 10A included in light conversion part 93.

As shown in FIG. 29, light conversion part 93 is formed of a wavelength conversion plate 98. Wavelength conversion plate 98 is divided into a plurality of regions, and in these regions, wavelength conversion members 10A outputting light of different wavelength regions are disposed.

Here, as wavelength conversion plate 98, for example, the one having a wavelength conversion member that converts wavelength of input light and outputs blue light, a wavelength conversion member that converts wavelength of input light and outputs green light, and a wavelength conversion member that converts wavelength of input light and outputs red light is preferably used. Each of these wavelength conversion members can be formed by appropriately adjusting the kind, concentration and the like of semiconductor fine particle phosphors used in the wavelength conversion member. By using such wavelength conversion plate 98, it becomes possible to reproduce most of color tones occurring in nature in image display part 92, and an image display device having excellent color reproducibility can be realized. As wavelength conversion plate 98, any other kinds may be used besides the one that outputs light of three colors.

In image display device 90 in the present embodiment, the light outputted from light emitting device 50' irradiates light conversion part 93 of image display part 92. Inside light emitting device 50', a TFT that is not shown in the drawing is provided, and by ON/OFF operation of the TFT, quantity of light transmission through each wavelength conversion member 10A included in wavelength conversion plate 98 is controlled. As a result, image is displayed in image display part 92.

In image display device 90 in the present embodiment as described above, since light conversion part 93 of image display part 92 has a wavelength conversion member having anisotropy in dispersion concentration as described above, emission efficiency of the wavelength converted light outputted from image display part 92 is improved. Therefore, by image display device 90 having the constitution as described above, it is possible to obtain an image display device realizing high emission efficiency (screen brightness) and excellent color reproducibility.

In image display device 90 in the present embodiment, the constitution not arranging a light guide plate is employed. This is because light of the irradiation part can be configured to be able to irradiate the entire face of image display part 92 without arranging a light guide plate. However, light guide plate may of course be provided in case of necessity.

In Embodiments 11 to 14 of the present invention as described above, description has been made while taking a so-called liquid crystal display device and an organic EL display device as examples, however, it is of course possible to provide other image display devices with wavelength conversion members 10A to 10G in Embodiments 1 to 7 of the present invention as described above. When wavelength conversion members 10A to 10G in Embodiments 1 to 7 of the present invention as described above are applied to the liquid crystal display device or organic EL display device as described above, various structures other than the structures concretely exemplified in Embodiments 11 to 14 of the present invention as described above can be employed. That is, any image display devices having wavelength conversion members 10A to 10G in Embodiments 1 to 7 of the present invention as described above can realize an image display device having higher emission efficiency and more excellent color reproducibility in comparison with the conventional example regardless of the structure.

By the way, as an index of performance of an image display device, color reproducibility is recited. Color reproducibility indicates size of color gamut that can be displayed in the image display device, and is represented by using NTSC ratio. NTSC ratio is an index represented by an area ratio between area of a triangle obtained by connecting respective chromaticity coordinates (u', v') in CIE1976 chromaticity chart defined by NTSC (National Television System Committee) of red, green and blue (red (0.498, 0.519), green (0.076, 0.576), blue (0.152, 0.196)) to area of a triangle obtained by connecting respective chromaticity coordinates of red, green and blue of chromaticity coordinates (u', v') in CIE1976 chromaticity chart.

As other index of performance of an image display device, screen lightness is recited. Screen lightness indicates intensity of light emitted from the image display device. Here, screen lightness is an index represented by screen brightness when white display is made by fully opening RGB pixels in the image display device.

Figure 54:
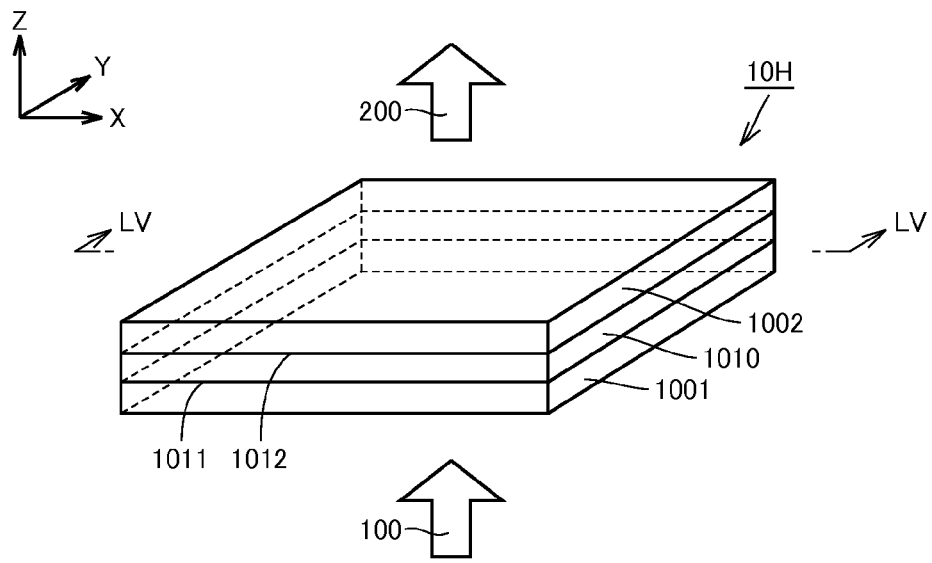
FIG. 54 is a schematic perspective view of a wavelength conversion member in Embodiment 15 of the present invention.
Figure 55:
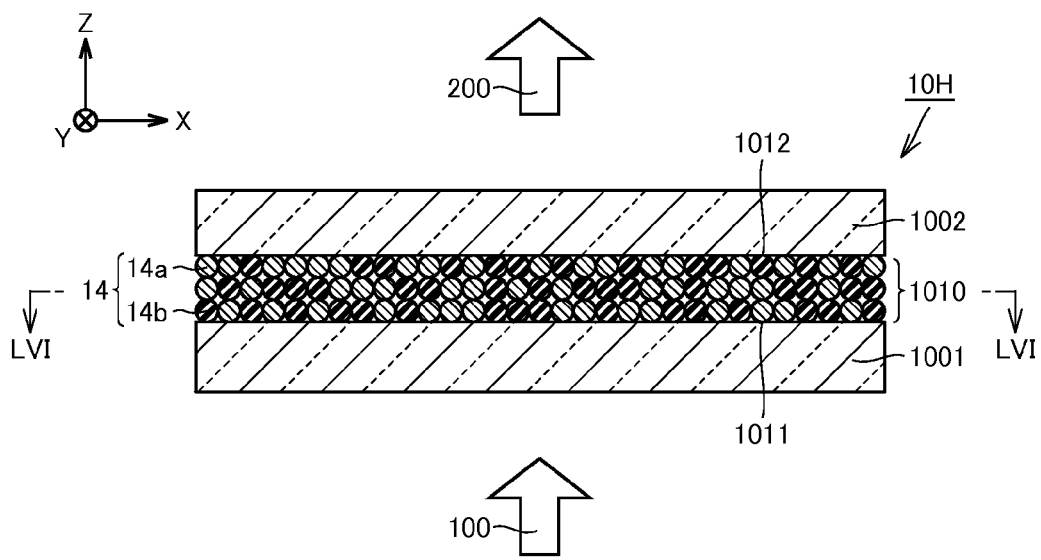
FIG. 55 is a schematic section view of the wavelength conversion member in Embodiment 15 of the present invention, cut along the XZ plane.
Figure 56:
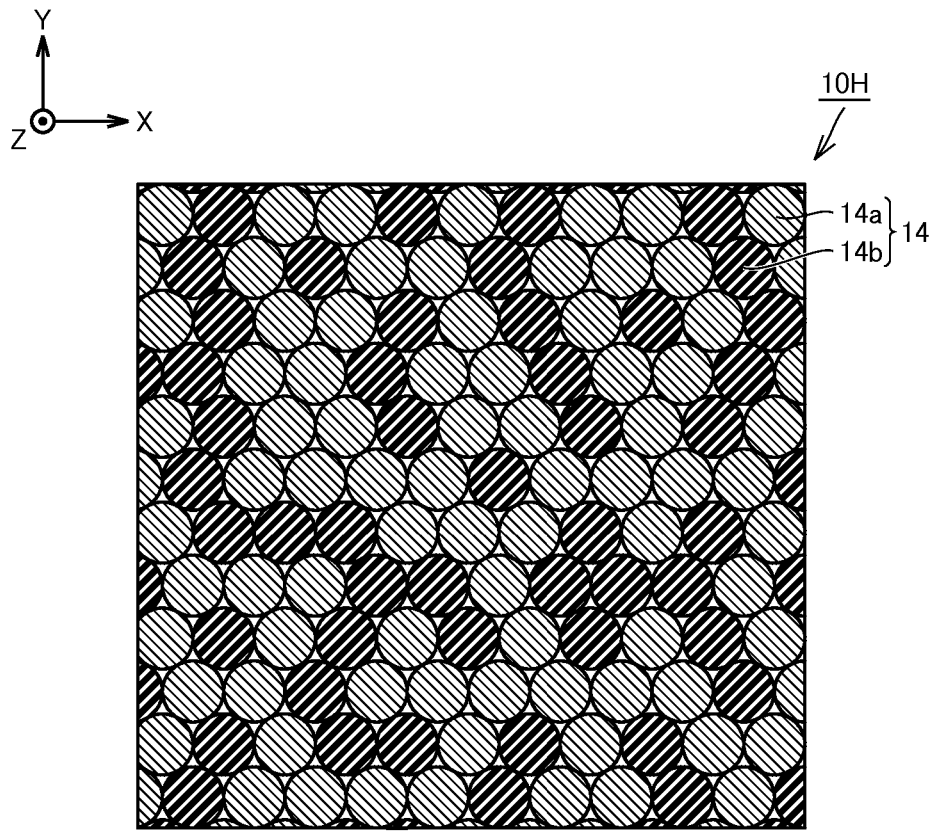
FIG. 56 is a schematic section view of a wavelength conversion layer of the wavelength conversion member in Embodiment 15 of the present invention, cut along the XY plane.

FIG. 54 is a schematic perspective view of a wavelength conversion member in Embodiment 15 of the present invention. FIG. 55 is a schematic section view of the wavelength conversion member in the present embodiment, cut along the XZ plane. FIG. 56 is a schematic section view of the wavelength conversion layer of the wavelength conversion member in the present embodiment, cut along the XY plane. The section shown in FIG. 55 is a schematic section view along the line LV-LV shown in FIG. 54. The section shown in FIG. 56 is a schematic section view along the line LVI-LVI shown in FIG. 55. First, with reference to these FIG. 54 to FIG. 56, structure of the wavelength conversion member in the present embodiment will be described. The similar part as that in Embodiment 1 of the present invention described above is denoted by the same reference numeral in the drawing, and description thereof will not be repeated here.

As shown in FIG. 54, wavelength conversion member 10H in the present embodiment is formed from a member in the shape of a substantially rectangular parallelepiped having a predetermined thickness, and has a function of absorbing at least part of input light and outputting light having a wavelength that is different from the wavelength of the absorbed light. Wavelength conversion member 10H is formed of a laminate of a wavelength conversion layer 1010, a first light transmissive member 1001 and a second light transmissive member 1002, and wavelength conversion layer 1010 is sandwiched by first light transmissive member 1001 and second light transmissive member 1002.

Wavelength conversion layer 1010 has its one principal plane as a light input plane 1011, and its other principal plane as a light output plane 1012. Light input plane 1011 of wavelength conversion layer 1010 is covered with first light transmissive member 1001 as described above, and light output plane 1012 of wavelength conversion layer 1010 is covered with second light transmissive member 1002 as described above.

Here, first light transmissive member 1001 and second light transmissive member 1002 are included in wavelength conversion member 10H for the purpose of protecting wavelength conversion layer 1010 that is comparatively fragile, and is constituted, for example, by a substrate formed of a light transmissive resin material such as silicone resin, epoxy resin, acryl resin, fluorine resin, polycarbonate resin, polyimide resin or urea resin, or a substrate formed of a light transmissive inorganic material such as aluminum oxide, silicon oxide or yttria. Typically, first light transmissive member 1001 and second light transmissive member 1002 are constituted, for example, by a glass substrate. When wavelength conversion layer 1010 of wavelength conversion member 10H has sufficient mechanical strength, these first light transmissive member 1001 and second light transmissive member 1002 need not be provided specifically.

Light input plane 1011 of wavelength conversion member 10H is irradiated with excitation light 100 outputted from light emitting element through first light transmissive member 1001. Excitation light 100 irradiating light input plane 1011 is introduced into wavelength conversion layer 1010 of wavelength conversion member 10H, and wavelength of part of the introduced light is converted in wavelength conversion layer 1010. From light output plane 1012 of wavelength conversion member 10H, light containing the light after wavelength conversion as described above is outputted outside as wavelength converted light 200 through second light transmissive member 1002.

Here, as shown in FIG. 54, defining the light axes of excitation light 100 and wavelength converted light 200 in the Z axial direction of translational three axes (X axis, Y axis, Z axis) that are orthogonal one another, both light input plane 1011 and light output plane 1012 as described above are configured on the XY plane that is orthogonal to the Z axis.

While wavelength conversion member 10H depicted in the drawing has a flattened plate-like profile, the shape of the wavelength conversion member is not limited to this shape, and may be of any profiles including a rectangular parallelepiped shape, a disc-like shape, a cylindrical shape and a prism-like shape other than the plate-like shape.

As shown in FIG. 55 and FIG. 56, wavelength conversion layer 1010 of wavelength conversion member 10H is constituted by an aggregate of semiconductor fine particle phosphor 14. Specifically, wavelength conversion member 10H in the present embodiment does not have light transmissive member 13 for sealing semiconductor fine particle phosphor 14 as shown in Embodiment 1 of the present invention as described above. Semiconductor fine particle phosphor 14 absorbs excitation light 100 introduced into wavelength conversion layer 1010, converts the wavelength thereof and emits light of different wavelength, and is mainly formed of semiconductor microcrystalline particles. As semiconductor fine particle phosphor 14, those similar to those in Embodiment 1 of the present invention as described above may be used.

As shown in FIG. 55 and FIG. 56, in wavelength conversion member 10H in the present embodiment, two kinds of semiconductor fine particle phosphors 14a, 14b are contained as semiconductor fine particle phosphor 14. Semiconductor fine particle phosphor 14a converts wavelength of absorbed excitation light 100 and emits long wavelength fluorescence, and semiconductor fine particle phosphor 14b converts wavelength of absorbed excitation light 100 and emits short wavelength fluorescence. Both of these semiconductor fine particle phosphor 14a emitting long wavelength fluorescence and semiconductor fine particle phosphor 14b emitting short wavelength fluorescence are contained in the aggregate constituting wavelength conversion layer 1010.

Here, in wavelength conversion member 10H in the present embodiment, wavelength conversion layer 1010 is constituted only by an aggregate of semiconductor fine particle phosphors 14a, 14b, and specific anisotropy is provided in the number of particles of semiconductor fine particle phosphors 14a, 14b contained in the aggregate. That is, in wavelength conversion member 10H in the present embodiment, quantity of semiconductor fine particle phosphors 14, 14b contained in the aggregate constituting wavelength conversion layer 1010 is made different depending on the direction. More specifically, as shown in FIG. 55, the number of particles of semiconductor fine particle phosphors 14a, 14b in the direction that is parallel to the light traveling direction which is the direction connecting light input plane 11 and light output plane 12 in wavelength conversion member 10H (namely, Z axial direction) is smaller than the number of particles of semiconductor fine particle phosphors 14a, 14b in the direction that is orthogonal to the light traveling direction (namely, direction contained in the XY plane).

In wavelength conversion member 10H in the present embodiment, as shown in FIG. 56, those having substantially equivalent particle sizes are used as semiconductor fine particle phosphors 14a, 14b, and in the XY plane of wavelength conversion layer 1010, semiconductor fine particle phosphors 14a, 14b are regularly arrayed in the form of hexagonal lattice, and as shown in FIG. 55, semiconductor fine particle phosphors 14a, 14b are laminated plurally along the Z axial direction. In wavelength conversion member 10H constituted in this manner, since semiconductor fine particle phosphors 14a, 14b are in a closely packed condition in the XY in-plane direction, it is possible to increase the number of particles of semiconductor fine particle phosphors 14a, 14b in the XY in-plane direction to maximum, and it is possible to arbitrarily control the quantity of laminated semiconductor fine particle phosphors 14a, 14b along the Z axial direction, and thus thickness thereof can be freely set. Therefore, it becomes possible to make the number of particles of semiconductor fine particle phosphors 14a, 14b in the Z axial direction significantly differ from the number of particles of semiconductor fine particle phosphors 14a, 14b in the XY in-plane direction, and to greatly improve the emission efficiency while suppressing reabsorption of light. Also, the number of semiconductor fine particle phosphors 14a, 14b along the Z axial direction may be one without laminating semiconductor fine particle phosphors 14a, 14b along the Z axial direction.

With the constitution as described above, also in wavelength conversion member 10H in the present embodiment, it is possible to realize high emission efficiency by improving absorptance of excitation light by semiconductor fine particle phosphor and suppressing occurrence of concentration quenching in comparison with a conventional wavelength conversion member. Since the specific mechanism thereof is similar to the mechanism described in Embodiment 1 of the present invention as described above, description thereof will not be repeated here.

Also in wavelength conversion member 10H in the present embodiment as described above, by appropriately adjusting the kind, number, concentration of semiconductor fine particle phosphor 14 to be contained, the kind of excitation light 100 inputted into wavelength conversion member 10H (as for the number (particle number) of semiconductor fine particle phosphor 14, provision of anisotropy should be sufficiently considered), light quantity and spectrum of wavelength converted light 200 outputted from wavelength conversion member 10H can be freely adjusted.

Figure 57:
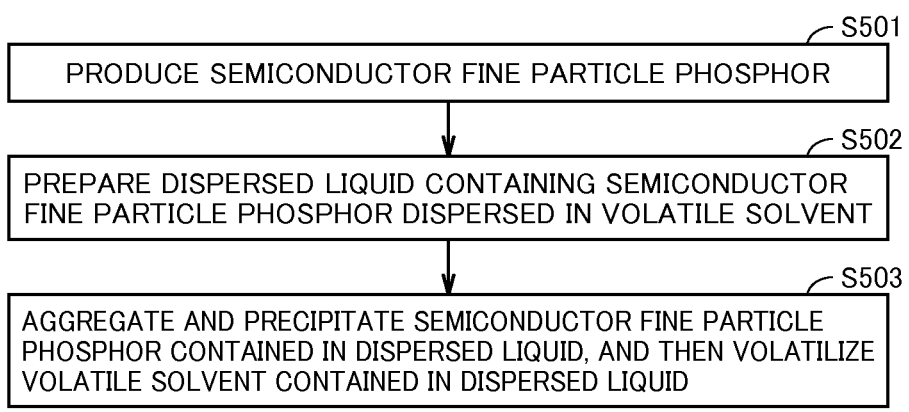
FIG. 57 is a flow chart showing a method for manufacturing the wavelength conversion member in Embodiment 15 of the present invention.

FIG. 57 is a flow chart of a method for manufacturing a wavelength conversion member in the present embodiment. Next, referring to FIG. 57, a method for manufacturing the wavelength conversion member in the present embodiment will be described.

For manufacturing wavelength conversion member 10H having the structure as described above, as shown in FIG. 57, first in step S501, semiconductor fine particle phosphors 14a, 14b are produced. As a method for producing the semiconductor fine particle phosphors, known synthesis methods as described above (for example, liquid phase synthesis method and so on) may be used.

Next, in step S502, by adding and dispersing the semiconductor fine particle phosphor into a volatile solvent, a dispersed liquid containing semiconductor fine particle phosphors dispersed in the volatile solvent is prepared. Here, as the volatile solvent for use, organic solvents represented, for example, by toluene, hexane, ethanol and so on may be used.

Next, in step S503, the semiconductor fine particle phosphors contained in the dispersed liquid are aggregated and precipitated, and then the volatile solvent contained in the dispersed liquid is volatilized, to produce an aggregate of the semiconductor fine particle phosphors. In this aggregation and precipitation process of the semiconductor fine particle phosphor in step S503, self-organization of semiconductor fine particle phosphor occurs, and regular arrays of semiconductor fine particle phosphor in the form of hexagonal lattice as described above is realized. At this time, by adjusting the quantity of semiconductor fine particle phosphors contained in the dispersed liquid, it is possible to set the thickness of the aggregate at a desired one.

Then, first light transmissive member 1001 and second light transmissive member 1002 are provided in such a manner that they sandwich the aggregate obtained in step S503 as is necessary. Semiconductor fine particle phosphors 14a, 14b may be deposited in advance on the principal plane of first light transmissive member 1001.

In this manner, manufacture of wavelength conversion member 10H in the present embodiment having specific anisotropy in the number of particles of semiconductor fine particle phosphors 14a, 14b as shown in FIG. 55 and FIG. 56 is completed.

As described in the above, by employing the structure and the method for manufacturing wavelength conversion member 10H in the present embodiment, it is possible to provide a wavelength conversion member having improved emission efficiency in comparison with the conventional example, likewise the Embodiment 1 of the present invention as described above.

Likewise wavelength conversion member 10A in Embodiment 1 of the present invention as described above, wavelength conversion member 10H in the present embodiment may also be preferably incorporated into a light emitting device or an image display device. Concrete constitutions of the light emitting device or the image display device in such a case are equivalent to those in Embodiments 8 to 14 of the present invention as described above, and hence description thereof will be omitted. However, by including wavelength conversion member 10H in the present embodiment in a light emitting device or an image display device, it is possible to provide a light emitting device having higher emission efficiency compared with a conventional example, and an image display device realizing higher emission efficiency (screen brightness) and more excellent color reproducibility compared with a conventional example, as is the case with Embodiments 8 to 14 of the present invention as described above.

In the following, test contents and test results for evaluation of a wavelength conversion member, a light emitting device and an image display device to which the present invention is applied, and a wavelength conversion member, a light emitting device and an image display device to which the present invention is not applied that are actually manufactured experimentally will be described in detail.

Here, Examples A1 to A18 shown below are wavelength conversion members to which the present invention is applied, and Comparative Examples A1 to A10 are wavelength conversion members to which the present invention is not applied. Examples B1 to B13 shown below are light emitting devices to which the present invention is applied, and Comparative Examples B1 to B8 are light emitting devices to which the present invention is not applied. Examples C1 to C11 shown below are image display devices to which the present invention is applied, and Comparative Examples C1 to C10 are image display devices to which the present invention is not applied.

Prior to describing Examples and Comparative Examples, a concrete method for synthesizing a semiconductor fine particle phosphor used in these Examples and Comparative Examples will be described. In Examples and Comparative Examples, an InP/ZnS semiconductor fine particle phosphor is mainly used as a semiconductor fine particle phosphor.

First, a synthesis method for an InP microcrystalline particle to be used for forming a core part of an InP/ZnS semiconductor fine particle phosphor will be described.

First, in a dry nitrogen atmosphere in a glove box, 200 mL of trioctyl phosphine and 17.3 g of trioctyl phosphine oxide were weighed, and stirred by mixing for 10 minutes, to obtain mixed solvent A.

Then, mixed solvent A in the glove box was added and mixed with 2.2 g (10.0 mmol) of indium trichloride which is a III-group metal element material and 2.5 g (10.0 mmol) of Tris-trimethylsilylphosphine which is a V-group element material of semiconductor fine particle, and then stirred at 20° C. for 10 minutes to obtain material solution B.

Then, by heating material solution B under stirring in a pressure vessel in a nitrogen atmosphere for 72 hours, the materials contained in material solution B were composed to obtain composite solution C. Then, composite solution C after completion of composition reaction was allowed to cool to room temperature by natural heat dissipation, and composite solution C was collected in a dry nitrogen atmosphere.

By subjecting composite solution C to a classification process including respectively 10 times repetitions of the operation of precipitating the semiconductor fine particle phosphor by adding 200 mL of dehydrated methanol which is a poor solvent to composite solution C, the operation of depositing the semiconductor fine particle phosphor by centrifugation at 4000 rpm for 10 minutes, and the operation of redissolving the semiconductor fine particle phosphor by adding dehydrated toluene, dehydrated toluene solution D containing semiconductor fine particle phosphor having a specific particle size was obtained. Then, by evaporating the dehydrated toluene solvent from dehydrated toluene solution D, solid powder E was collected.

A diffraction peak of solid powder E was observed by powder X-ray diffraction, and a diffraction peak was observed at the position of InP. This demonstrates that solid powder E is InP crystal. Here, for the observation, a powder X-ray diffraction measuring device Ultima IV available from Rigaku Corporation was used.

Further, solid powder E was directly observed under a transmission electron microscope, and particle size of 20 particles were measured, and by calculating average particle size from an average value of respective values of the particle sizes, average particle size of InP crystal was determined. Here, for this observation, a transmission electron microscope JEM-2100 available from JEOL Ltd. was used.

Next, a synthesis method for covering surface of an InP microcrystalline particle which is to be a core part of the InP/ZnS semiconductor fine particle phosphor with ZnS which is to be a shell part will be described.

First, in a dry nitrogen atmosphere in a glove box, an InP core part, 200 mL of trioctyl phosphine and 17.3 g of trioctyl phosphine oxide were weighed, and stirred for 10 minutes by mixing to obtain mixed solvent F.

Then, in the condition that mixed solvent F was stirred in a flask under heating to shell growth temperature, 1.2 g (10.0 mmol) of zinc diethyl which is a II-group metal element material for a semiconductor fine particle shell part and 4.0 g (10.0 mmol) of trioctyl phosphine sulfide which is a VI-group element material of a semiconductor fine particle shell part are individually gradually added dropwise over 8 hours, to obtain composite solution G.

Composite solution G was subjected to a classification process in a manner similar to that of the process for the core part, and dehydrated toluene solution H containing a semiconductor fine particle phosphor having a specific particle size was obtained. Then, by evaporating the dehydrated toluene solvent from dehydrated toluene solution H, solid powder I was collected.

By direct observation of solid powder I under a transmission electron microscope, an InP/ZnS semiconductor fine particle phosphor having a core/shell structure wherein surface of the InP core part was covered with the ZnS shell was observed. By this observation, it was demonstrated that the InP/ZnS semiconductor fine particle phosphor synthesized in this synthesis method had a particle size of the core part of 2.1 nm to 3.8 nm, and a particle size distribution of the core part of 6% to 40%. Here, for this observation, a transmission electron microscope JEM-2100 available from JEOL Ltd. was used.

Also, by measuring dehydrated toluene solution H, optical characteristics of the InP/ZnS semiconductor fine particle phosphor were measured. Emission peak wavelength was 430 nm to 720 nm, and emission half band width was 35 nm to 90 nm. Emission efficiency reached to 70.9% at maximum. Here, for measurement of emission characteristics of the InP/ZnS semiconductor fine particle phosphor, a fluorescent spectrophotometer FluoroMax-4 available from JOBIN YVON was used, and for measurement of absorption spectrum of the InP/ZnS semiconductor fine particle phosphor, a spectrophotometer U-4100 available from Hitachi High-Technologies Corporation. was used.

It was also demonstrated that particle size and particle size distribution and optical characteristics of the core part change depending on the synthesis condition and classification condition.

Figure 31:
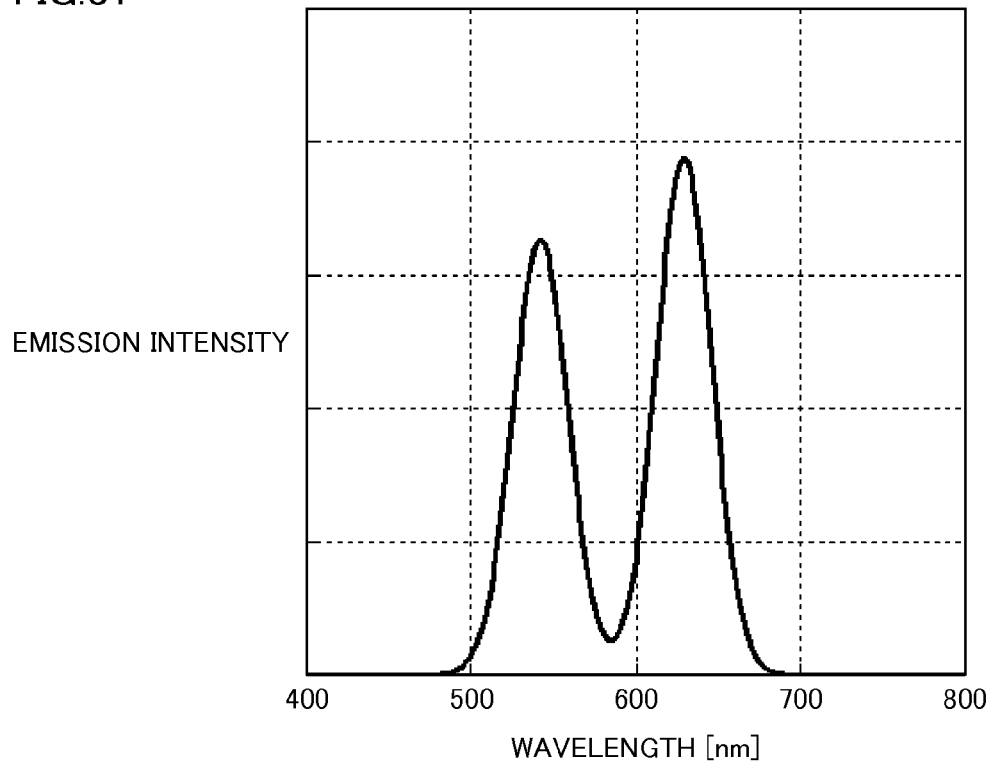
FIG. 31 is a graph showing emission spectrum of the wavelength conversion member according to Example A1.

FIG. 30 is a table collectively showing compositions, manufacturing methods, optical characteristics and the like of wavelength conversion members according to Examples A1 to A18 and Comparative Examples A1 to A10. FIG. 31 is a graph showing emission spectrum of the wavelength conversion member according to Example A1. In FIG. 31, the horizontal axis represents wavelength [nm], and the vertical axis represents emission intensity. For measurement of internal quantum efficiency (IQE), absorptance and external quantum efficiency (EQE) of wavelength conversion members shown in FIG. 30, an emission measurement system MCPD-7000 available from OTSUKA ELECTRONICS CO., LTD. was used.

First, concrete methods for manufacturing wavelength conversion members according to Examples and Comparative Examples will be described. A wavelength conversion member according to Example is a wavelength conversion member having specific anisotropy in dispersion concentration of semiconductor fine particle phosphor as described above, and a wavelength conversion member according to Comparative Example is a wavelength conversion member not having specific anisotropy in dispersion concentration of semiconductor fine particle phosphor as described above. In manufacture of a wavelength conversion member according to Example, amounts of various kinds of semiconductor fine particle phosphors and an amount of the light transmissive member were adjusted so that about 90% of excitation light at 450 nm is absorbed, and emission intensities of the semiconductor fine particle phosphors are in comparable levels.

In Example A1, as shown in FIG. 30, a wavelength conversion member constituted by a InP/ZnS red semiconductor fine particle phosphor, an InP/ZnS green semiconductor fine particle phosphor, and silicone resin SCR-1015 was manufactured according to the manufacturing method shown in FIG. 16 as described above.

First, 0.29 mg of an InP/ZnS red semiconductor fine particle phosphor was dispersed in a toluene solvent. This dispersed liquid was applied on a slide glass, and the toluene solvent was volatilized. Then 5.38 mg of an InP/ZnS green semiconductor fine particle phosphor was dispersed in a toluene solvent, and this dispersed liquid was further applied on the slide glass, and the toluene solvent was volatilized.

Then, 512.0 mg of silicone resin A liquid and 506.7 mg of silicone resin B liquid were weighed and mixed. The silicone resin mixture was applied on the slide glass, and cured by heating at 80° C. for 1 hour and at 150° C. for 5 hours. Then, by removing the slide glass, the wavelength conversion member according to Example A1 was obtained.

The wavelength conversion member according to Example A1 was directly observed under TEM, and it was demonstrated that as shown in FIG. 30, the semiconductor fine particle phosphors are arrayed in the form of hexagonal lattice in the XY plane (see FIG. 15), and the semiconductor fine particle phosphors are arrayed in the form of layers by kind in the Z axial direction (see FIG. 14).

When the wavelength conversion member according to Example A1 was exited with blue light having a wavelength of 450 nm, an emission spectrum as shown in FIG. 31 was observed.

Also, as shown in FIG. 30, when the wavelength conversion member according to Example A1 was exited with blue light having a wavelength of 450 nm, it was demonstrated that IQE was 59.6% and EQE was 53.8%, and absorptance of the wavelength conversion member according to Example A1 with respect to blue light having a wavelength of 450 nm was 90.3%.

In Examples A2 to A4, as shown in FIG. 30, likewise the case of Example A1 as described above, a wavelength conversion member constituted by an InP/ZnS red semiconductor fine particle phosphor, an InP/ZnS green semiconductor fine particle phosphor, and silicone resin SCR-1015 was manufactured according to the manufacturing method shown in FIG. 16 as described above. Here, difference from Example A1 lies in the contained amounts of the InP/ZnS red semiconductor fine particle phosphor and the InP/ZnS green semiconductor fine particle phosphor. The compositions, manufacturing methods, optical characteristics and the like of wavelength conversion members according to Examples A2 to A4 are shown in FIG. 30.

In Examples A5 to A8, as shown in FIG. 30, likewise the cases of Examples A1 to A4 as described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above. Here, difference from Examples A1 to A4 lies in the order of laminating the semiconductor fine particle phosphors. To be more specific, in Examples A5 to A8, first, a dispersed liquid containing an InP/ZnS green semiconductor fine particle phosphor was applied on a slide glass, and then a dispersed liquid containing an InP/ZnS red semiconductor fine particle phosphor was further applied on the slide glass. The compositions, manufacturing methods, optical characteristics and the like of wavelength conversion members according to Examples A5 to A8 are shown in FIG. 30.

In Example A9, as shown in FIG. 30, a wavelength conversion member constituted by an InP/ZnS yellow semiconductor fine particle phosphor and silicone resin SCR-1015 was manufactured according to the manufacturing method shown in FIG. 16 as described above. Here, difference from Example A1 lies in the number of kinds of semiconductor fine particle phosphors. The composition, manufacturing method, optical characteristic and the like of the wavelength conversion member according to Example A9 are shown in FIG. 30.

In Example A10, as shown in FIG. 30, a wavelength conversion member constituted by an InP/ZnS red semiconductor fine particle phosphor, an InP/ZnS green semiconductor fine particle phosphor, an InP/ZnS yellow semiconductor fine particle phosphor and silicone resin SCR-1015 was manufactured according to the manufacturing method shown in FIG. 16 as described above. Here, difference from Example A1 lies in the number of kinds of semiconductor fine particle phosphors. The composition, manufacturing method, optical characteristic and the like of the wavelength conversion member according to Example A10 are shown in FIG. 30.

In Example A11, as shown in FIG. 30, a wavelength conversion member constituted by an InP/ZnS red semiconductor fine particle phosphor, an InP/ZnS green semiconductor fine particle phosphor, an InP/ZnS yellow semiconductor fine particle phosphor, an InP/ZnS blue semiconductor fine particle phosphor and silicone resin SCR-1015 was manufactured according to the manufacturing method shown in FIG. 16 as described above. Here, difference from Example A1 lies in the number of kinds of semiconductor fine particle phosphors. The composition, manufacturing method, optical characteristic and the like of the wavelength conversion member according to Example A11 are shown in FIG. 30.

In Examples A12 to A14, as shown in FIG. 30, likewise the case of Example A1 as described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above. Here, difference from Example A1 lies in the contained amounts of the InP/ZnS red semiconductor fine particle phosphor and the InP/ZnS green semiconductor fine particle phosphor, and in Examples A12 to A14, film thickness of the wavelength conversion member in the part where these semiconductor fine particle phosphors are dispersed is varied by varying these contained amounts much widely than Examples A2 to A4 as described above. The compositions, manufacturing methods, optical characteristics and the like of wavelength conversion members according to Examples A12 to A14 are shown in FIG. 30.

In Example A15, as shown in FIG. 30, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 11 as described above.

First, 0.29 mg of an InP/ZnS red semiconductor fine particle phosphor and 5.40 mg of an InP/ZnS green semiconductor fine particle phosphor were mixed, and then these were dispersed in a toluene solvent. This dispersed liquid was applied on a slide glass, and the toluene solvent was volatilized.

Then, 512.2 mg of silicone resin A liquid and 497.4 mg of silicone resin B liquid were weighed and mixed. The silicone resin mixture was applied on the slide glass, and cured by heating at 80° C. for 1 hour and at 150° C. for 5 hours. Then, by removing the slide glass, the wavelength conversion member according to Example A15 was obtained.

The wavelength conversion member according to Example A15 was directly observed under TEM, and it was demonstrated that as shown in FIG. 30, the semiconductor fine particle phosphors are arrayed in the form of hexagonal lattice in the XY plane (see FIG. 10), and the semiconductor fine particle phosphors are arrayed in the form of layers in the Z axial direction (see FIG. 9).

Also, as shown in FIG. 30, when the wavelength conversion member according to Example A15 was exited with blue light having a wavelength of 450 nm, it was demonstrated that IQE was 49.0% and EQE was 45.2%, and absorptance of the wavelength conversion member according to Example A12 with respect to blue light having a wavelength of 450 nm was 92.4%.

In Examples A16 to A18, as shown in FIG. 30, likewise the case of Example A15 described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 11 as described above. Here, difference from Example A15 lies in mainly the contained amounts of the InP/ZnS red semiconductor fine particle phosphor and the InP/ZnS green semiconductor fine particle phosphor. The compositions, manufacturing methods, optical characteristics and the like of wavelength conversion members according to Examples A16 to A18 are shown in FIG. 30.

In Comparative Example A1, as shown in FIG. 30, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above.

First, 0.29 mg of an InP/ZnS red semiconductor fine particle phosphor and 5.48 mg of an InP/ZnS green semiconductor fine particle phosphor were mixed. Then, 501.6 mg of silicone resin A liquid and 511.2 mg of silicone resin B liquid were weighed and mixed.

In the silicone resin mixture, the semiconductor fine particle phosphors after mixing were mixed and dispersed, and the resultant dispersion was applied on the slide glass, and cured by heating at 80° C. for 1 hour and at 150° C. for 5 hours. Then, by removing the slide glass, the wavelength conversion member according to Comparative Example A1 was obtained.

The wavelength conversion member according to Comparative Example A1 was directly observed under TEM, and it was demonstrated that as shown in FIG. 30, the semiconductor fine particle phosphors are randomly dispersed in the XY plane (see FIG. 51) and the semiconductor fine particle phosphors are randomly dispersed in the Z axial direction (see FIG. 50).

Also, as shown in FIG. 30, when the wavelength conversion member according to Comparative Example A1 was exited with blue light having a wavelength of 450 nm, it was demonstrated that IQE was 33.5% and EQE was 30.3%, and absorptance of the wavelength conversion member according to Comparative Example A1 with respect to blue light having a wavelength of 450 nm was 90.3%.

In Comparative Examples A2 to A4, as shown in FIG. 30, likewise the case of Comparative Example A1 as described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above. Here, difference from Comparative Example A1 lies in the contained amounts of the InP/ZnS red semiconductor fine particle phosphor and the InP/ZnS green semiconductor fine particle phosphor. The compositions, manufacturing methods, optical characteristics and the like of wavelength conversion members according to Comparative Examples A2 to A4 are shown in FIG. 30.

In Comparative Examples A5 to A7, as shown in FIG. 30, a wavelength conversion member constituted by an InP/ZnS yellow semiconductor fine particle phosphor and silicone resin SCR-1015 was manufactured according to the manufacturing method shown in FIG. 53 as described above. Here, difference from Comparative Example A1 lies in the number of kinds of semiconductor fine particle phosphors. The compositions, manufacturing methods, optical characteristics and the like of the wavelength conversion member according to Comparative Example A5 are shown in FIG. 30.

In Comparative Example A6, as shown in FIG. 30, a wavelength conversion member constituted by an InP/ZnS red semiconductor fine particle phosphor, an InP/ZnS green semiconductor fine particle phosphor, an InP/ZnS yellow semiconductor fine particle phosphor and silicone resin SCR-1015 was manufactured according to the manufacturing method shown in FIG. 53 as described above. Here, difference from Comparative Example A1 lies in the number of kinds of semiconductor fine particle phosphors. The compositions, manufacturing methods, optical characteristics and the like of the wavelength conversion member according to Comparative Example A6 are shown in FIG. 30.

In Comparative Example A7, as shown in FIG. 30, a wavelength conversion member constituted by an InP/ZnS red semiconductor fine particle phosphor, an InP/ZnS green semiconductor fine particle phosphor, an InP/ZnS yellow semiconductor fine particle phosphor, an InP/ZnS blue semiconductor fine particle phosphor and silicone resin SCR-1015 was manufactured according to the manufacturing method shown in FIG. 53 as described above. Here, difference from Comparative Example A1 lies in the number of kinds of semiconductor fine particle phosphors. The compositions, manufacturing methods, optical characteristics and the like of the wavelength conversion member according to Comparative Example A7 are shown in FIG. 30.

In Comparative Examples A8 to A10, as shown in FIG. 30, likewise the case of Comparative Example A1 as described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above. Here, difference from Comparative Example A1 lies in the contained amounts of the InP/ZnS red semiconductor fine particle phosphor and the InP/ZnS green semiconductor fine particle phosphor, and in Comparative Examples A8 to A10, film thickness of the wavelength conversion member in the part where these semiconductor fine particle phosphors are dispersed is varied by varying these contained amounts much widely than Comparative Examples A2 to A4 as described above. The compositions, manufacturing methods, optical characteristics and the like of wavelength conversion members according to Comparative Examples A8 to A10 are shown in FIG. 30.

First, influence of difference in the method for manufacturing a wavelength conversion member on the dispersed state of semiconductor fine particle phosphor will be discussed. For this discussion, Example A1, Example A15 and Comparative Example A1 are referred.

Example A1, Example A15 and Comparative Example A1 are substantially comparable in contained amounts of semiconductor fine particle phosphors and in a contained amount of silicone resin. However, due to the difference in the manufacturing method as described above, difference as shown in FIG. 30 arose in the dispersed state of semiconductor fine particle phosphor in a wavelength conversion member.

As shown in FIG. 30, in contrast to Example A1 and Example A15 where the semiconductor fine particle phosphors are regularly arrayed in the XY plane, the semiconductor fine particle phosphors are randomly located in the XY plane in Comparative Example A1. This is attributed to the fact that in Example A1 and Example A15, the semiconductor fine particle phosphors were applied on a slide in the condition that they were dispersed in a volatile solvent, and then the volatile solvent was volatilized. More specifically, as the volatilization of the volatile solvent proceeds, the volatile solvent would cover the slide in a thickness of several nanometers to several tens nanometers, and at this time, the semiconductor fine particle phosphors would be regularly arrayed in the form of layers by self-organization. It was also demonstrated that in both of the wavelength conversion members according to Example A1 and Example A15, as shown in FIG. 14 and FIG. 9, the semiconductor fine particle phosphors were localized on either side of the wavelength conversion member.

While the detailed description is omitted herein, it was also demonstrated that when a wavelength conversion member was manufactured by other manufacturing method, the one containing the semiconductor fine particle phosphors present in the middle of or in the entire wavelength conversion member could be manufactured. In respect of the facilitation of manufacture and compatibility to mass production, it is determined that the manufacturing methods as shown in FIG. 16 and FIG. 11 employed in the Example A1 and Example A15 as described above are suited.

Also, in Example A1 and Example A15, it was demonstrated that the InP/ZnS semiconductor fine particle phosphors were arrayed in the form of hexagonal lattice in the XY plane. On the other hand, when a wavelength conversion member having similar structure as Example A1 was manufactured by using a red light emitting CdSe/ZnS semiconductor fine particle phosphor (particle size 5.2 nm) and a green light emitting CdSe/ZnS semiconductor fine particle phosphor (particle size 2.3 nm), it was demonstrated that these CdSe/ZnS semiconductor fine particle phosphors are arrayed in the form of cubic lattice (see FIG. 13). This is attributable to the influence of difference in particle size between the semiconductor fine particle phosphors when the plural kinds of semiconductor fine particle phosphors are mixed and packed. In other words, higher stability would be realized by arrays in the form of hexagonal lattice when difference in particle size between different kinds of semiconductor fine particle phosphor is small.

Next, influence of difference in the dispersed state of semiconductor fine particle phosphor on the emission efficiency of the wavelength conversion member will be discussed. For this discussion, Example A1, Example A15 and Comparative Example A1 are referred.

Example A1, Example A15 and Comparative Example A1 are substantially comparable in contained amounts of semiconductor fine particle phosphors and in a contained amount of silicone resin. However, as shown in FIG. 30, internal quantum efficiencies (IQE) of the wavelength conversion members according to Example A1, Example A15 and Comparative Example A1 were 59.6%, 49.0%, and 33.5%, respectively. As evidenced by this, it was demonstrated that in both of the wavelength conversion members according to Example A1 and Example A15, higher internal quantum efficiency (IQE) was obtained in comparison with the wavelength conversion member according to Comparative Example A1.

These results mean that by providing dispersion concentration of semiconductor fine particle phosphor with specific anisotropy as described above, it is possible to improve the emission efficiency of the wavelength conversion member. That is, it is determined that by packing the semiconductor fine particle phosphors at high density in the XY plane, thereby increasing dispersion concentration of semiconductor fine particle phosphor in the XY in-plane direction, while decreasing concentration of semiconductor fine particle phosphor in the Z axial direction, reabsorption of fluorescence is suppressed and the emission efficiency of the wavelength conversion member is improved.

Further, as shown in FIG. 30, in the wavelength conversion members according to Example A1 and Example A15, absorptance of excitation light is improved and also external quantum efficiency (EQE) is improved in comparison with the wavelength conversion member according to Comparative Example A1. This is attributable to the fact that in the wavelength conversion members according to Example A1 and Example A15, dispersion concentration of semiconductor fine particle phosphor in the XY plane is increased in comparison with the wavelength conversion member according to Comparative Example A1.

Figure 32:
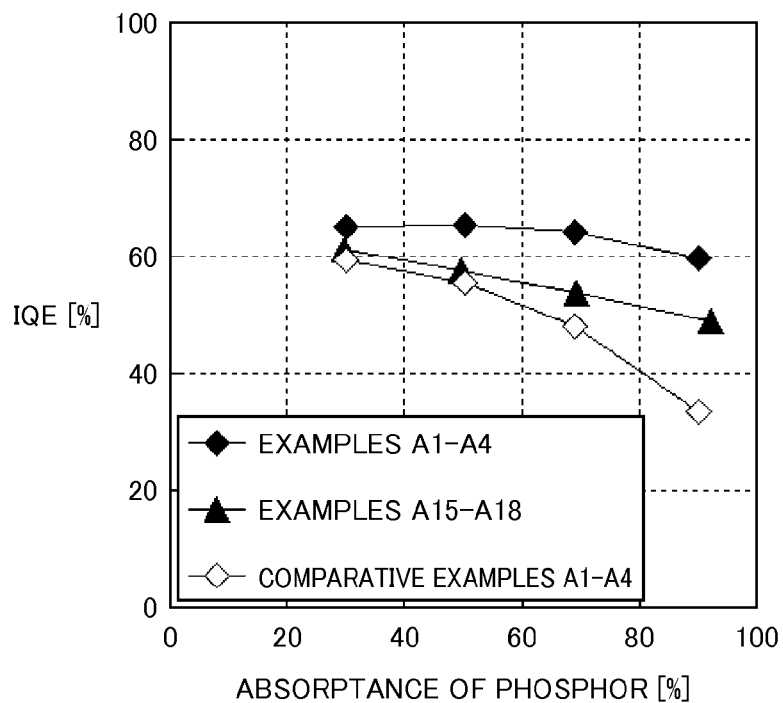
FIG. 32 is a graph showing correlations between absorptance of the semiconductor fine particle phosphor with respect to blue light of 450 nm and internal quantum efficiency (IQE) of the wavelength conversion member in Examples A1 to A4, Examples A15 to A18 and Comparative Examples A1 to A4.

Next, influence of difference in the dispersed state of semiconductor fine particle phosphor on the emission efficiency of the wavelength conversion member will be discussed. For this discussion, Examples A1 to A4, Examples A15 to A18 and Comparative Examples A1 to A4 are referred. FIG. 32 is a graph showing correlation between absorptance of semiconductor fine particle phosphor with respect to blue light at 450 nm and internal quantum efficiency (IQE) of the wavelength conversion member in Examples A1 to A4, Examples A15 to A18 and Comparative Examples A1 to A4. In FIG. 32, the horizontal axis represents absorptance [%] with respect to blue light at 450 nm of semiconductor fine particle phosphor, and the vertical axis represents internal quantum efficiency (IQE) [%] of the wavelength conversion member.

As shown in FIG. 32, when Examples A1 to A4, Examples A15 to A18, and Comparative Examples A1 to A4 having different dispersed states of semiconductor fine particle phosphors are compared, the tendency that internal quantum efficiency (IQE) of the wavelength conversion member decreases as the absorptance of excitation light of semiconductor fine particle phosphor increases is observed in every case. This is attributable to the fact that when concentration of semiconductor fine particle phosphor is increased for increasing absorptance of the semiconductor fine particle phosphors, reabsorption of fluorescence by concentration quenching increases and the loss increases.

However, as shown in FIG. 32, it is demonstrated that the rate of decrease in internal quantum efficiency (IQE) with respect to increase in concentration of semiconductor fine particle phosphor is smaller in Examples A15 to A18 than in Comparative Examples A1 to A4. This is attributable to the fact that reabsorption of fluorescence can be relatively suppressed because concentration of semiconductor fine particle phosphor in the XY plane is improved.

As shown in FIG. 32, it is also demonstrated that the rate of decrease in internal quantum efficiency (IQE) with respect to increase in concentration of semiconductor fine particle phosphor is further smaller in Examples A1 to A4 than in Examples A15 to A18. This is attributable to the fact that reabsorption of fluorescence can be further suppressed because the semiconductor fine particle phosphors are laminated in the form of layers while they are separated by kind in the Z axial direction.

These results mean that by increasing dispersion concentration of semiconductor fine particle phosphor in the XY in-plane direction by closely packing the semiconductor fine particle phosphors in the XY plane, and decreasing concentration of semiconductor fine particle phosphor in the Z axial direction, and laminating semiconductor fine particle phosphors in the form of layers while they are separated by kind in the Z axial direction, it is possible to suppress reabsorption of fluorescence and improve the emission efficiency of the wavelength conversion member.

Figure 33:
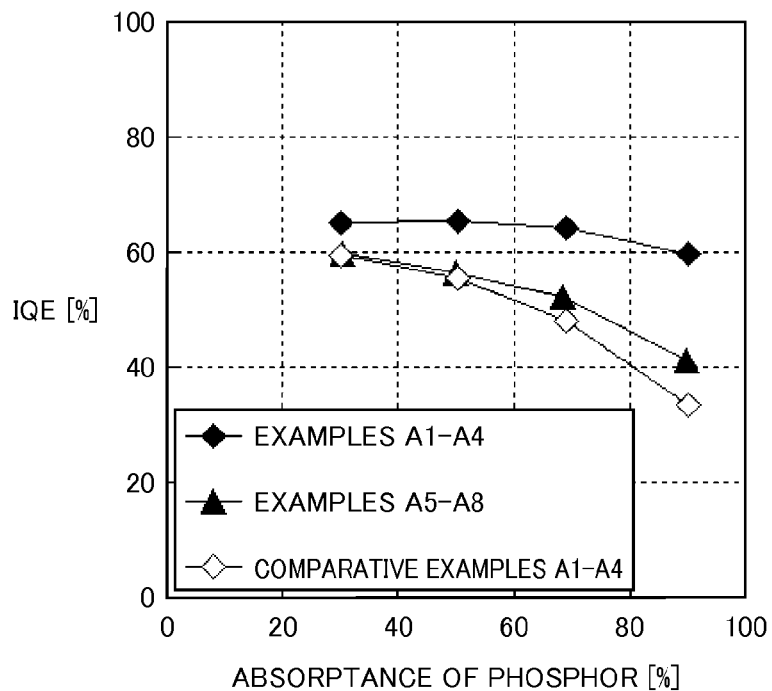
FIG. 33 is a graph showing correlations between absorptance of the semiconductor fine particle phosphor with respect to blue light of 450 nm and internal quantum efficiency (IQE) of the wavelength conversion member in Examples A1 to A4, Examples A5 to A8 and Comparative Examples A1 to A4.

Next, in laminating the semiconductor fine particle phosphors in the form of layers by kind based on emission wavelength and particle size, influence of difference in the order of lamination on the emission efficiency of the wavelength conversion member will be discussed. For this discussion, Examples A1 to A4, Examples A5 to A8 and Comparative Examples A1 to A4 are referred. FIG. 33 is a graph showing correlation between absorptance of semiconductor fine particle phosphor with respect to blue light at 450 nm and internal quantum efficiency (IQE) of the wavelength conversion member in Examples A1 to A4, Examples A5 to A8 and Comparative Examples A1 to A4. In FIG. 33, the horizontal axis represents absorptance [%] with respect to blue light at 450 nm of semiconductor fine particle phosphor, and the vertical axis represents internal quantum efficiency (IQE) [%] of the wavelength conversion member.

As shown in FIG. 33, when Examples A1 to A4, Examples A5 to A8, and Comparative Examples A1 to A4 having different dispersed states of semiconductor fine particle phosphors or different orders of lamination are compared, the tendency that internal quantum efficiency (IQE) of the wavelength conversion member decreases as the absorptance of excitation light of semiconductor fine particle phosphor increases is observed in every case. This is attributable to the fact that when concentration of semiconductor fine particle phosphor is increased for increasing absorptance of the semiconductor fine particle phosphors, reabsorption of fluorescence by concentration quenching increases and the loss increases.

However, as shown in FIG. 33, it is demonstrated that the rate of decrease in internal quantum efficiency (IQE) with respect to increase in concentration of semiconductor fine particle phosphor is smaller in Examples A5 to A8 than in Comparative Examples A1 to A4. This is attributable to the fact that reabsorption of fluorescence can be relatively suppressed because concentration of semiconductor fine particle phosphor in the XY plane is improved.

As shown in FIG. 33, it is also demonstrated that the rate of decrease in internal quantum efficiency (IQE) with respect to increase in concentration of semiconductor fine particle phosphor is further smaller in Examples A1 to A4 than in Examples A5 to A8. This is attributable to the fact that reabsorption of fluorescence can be further suppressed because the semiconductor fine particle phosphors are laminated in the form of layers while they are separated by kind in the Z axial direction and the semiconductor fine particle phosphor of the kind having long emission wavelength and large particle size is disposed on the side of light input plane of the wavelength conversion member. More specifically, it is attributable to the fact that in Examples A1 to A4, since the green semiconductor fine particle phosphor is disposed on the side closer to light output plane in the wavelength conversion member than the red semiconductor fine particle phosphor, fluorescence emitted by the green semiconductor fine particle phosphor is not reabsorbed by the red semiconductor fine particle phosphor and light loss is difficult to occur, while on the contrary, in Examples A5 to A8, since the red semiconductor fine particle phosphor is disposed on the side closer to the light output plane in the wavelength conversion member than the green semiconductor fine particle phosphor, fluorescence emitted by the red semiconductor fine particle phosphor is reabsorbed by the green semiconductor fine particle phosphor and light loss is easy to occur.

These results mean that by increasing dispersion concentration of semiconductor fine particle phosphor in the XY in-plane direction by closely packing the semiconductor fine particle phosphors in the XY plane, and decreasing concentration of semiconductor fine particle phosphor in the Z axial direction, and laminating semiconductor fine particle phosphors in the form of layers based on emission wavelength and particle size while they are separated by kind in the Z axial direction, it is possible to suppress reabsorption of fluorescence and improve the emission efficiency of the wavelength conversion member.

Figure 34:
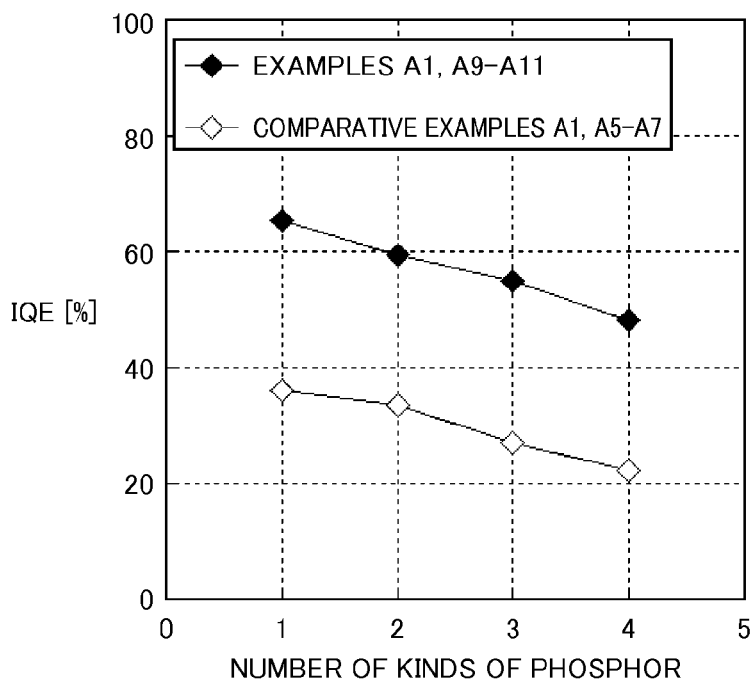
FIG. 34 is a graph showing correlations between the number of kinds of semiconductor fine particle phosphor and internal quantum efficiency (IQE) of the wavelength conversion member in Examples A1, A9 to A11 and Comparative Examples A1, A5 to A7.

Next, influence of difference in the number of kinds of semiconductor fine particle phosphors on emission efficiency of the wavelength conversion member will be discussed. For this discussion, Examples A1, A9 to A11 and Comparative Examples A1, A5 to A7 are referred. FIG. 34 is a graph showing correlation between number of kinds of semiconductor fine particle phosphors and internal quantum efficiency (IQE) of the wavelength conversion member in Examples A1, A9 to A11 and Comparative Examples A1, A5 to A7. In FIG. 34, the horizontal axis represents number of kinds of semiconductor fine particle phosphors, and the vertical axis represents internal quantum efficiency (IQE) [%] of the wavelength conversion member.

As shown in FIG. 34, when Examples A1, A9 to A11 and Comparative Examples A1, A5 to A7 having different dispersed states of semiconductor fine particle phosphors are compared, a tendency that internal quantum efficiency (IQE) of the wavelength conversion member decreases as the number of kinds of semiconductor fine particle phosphors contained in the wavelength conversion member increases is observed in every case. This is attributable to the fact that as the number of kinds of semiconductor fine particle phosphors increases, the rate of occurrence of reabsorption of fluorescence increases. Therefore, it is demonstrated that a smaller number of kinds of semiconductor fine particle phosphors is preferred from these points.

Next, influence of difference in the dispersion state of semiconductor fine particle phosphors on thinning of the wavelength conversion member will be discussed. For this discussion, Examples A1, A12 to A14 and Comparative Examples A1, A8 to A10 are referred. FIG. 35 is a table showing the results of various experimental manufactures in Examples A1, A12 to A14 and Comparative Examples A1, A8 to A10.

As shown in FIG. 35, in wavelength conversion members according to Examples A1, A12 to A14 having specific anisotropy in dispersion concentration of semiconductor fine particle phosphor, it was demonstrated that even when film thickness of the wavelength conversion member in the part where semiconductor fine particle phosphors are dispersed is thinned to 30.4 µm, excitation light having a wavelength of 450 nm is absorbed at an absorptance of 90.3%. However, in the wavelength conversion members according to Comparative Examples A1, A8 to A10 not having specific anisotropy in dispersion concentration of semiconductor fine particle phosphor as described above, film thickness of the wavelength conversion member in the part where semiconductor fine particle phosphors are dispersed could be thinned to 73.6 µm at minimum.

These results mean that by increasing dispersion concentration of semiconductor fine particle phosphor in the XY in-plane direction by closely packing the semiconductor fine particle phosphors in the XY plane, and decreasing concentration of semiconductor fine particle phosphor in the Z axial direction, it is possible to thin the wavelength conversion member while keeping absorptance of excitation light high.

Here, as shown in FIG. 35, by providing a wavelength conversion member having specific anisotropy in dispersion concentration of semiconductor fine particle phosphor as described above, it is possible to increase absorbance per 1 µm along the traveling direction of excitation light up to 0.02 or higher (the absorbance is 0.024 in Example A13, and the absorbance is 0.033 in Example A14). This value is very excellent value in comparison with that in a conventional wavelength conversion member when compatibility of improvement in emission efficiency and thinning of the wavelength conversion member is considered, and is a value that can be first realized when the manufacturing method for a wavelength conversion member in the embodiment of the present invention as described above is employed.

Further, as shown in FIG. 35, by providing a wavelength conversion member having specific anisotropy in dispersion concentration of semiconductor fine particle phosphor as described above, it is possible to realize a wavelength conversion member having a thickness along the traveling direction of excitation light of greater than or equal to 0.5 nm and less than or equal to 50 µm (in Example A13, the thickness is 42.2 µm, and in Example A14, the thickness is 30.4 µm), and absorbing greater than or equal to 90% of inputted excitation light (in Example A13, absorptance is 90.4%, and in Example A14, absorptance is 90.3%) and converting wavelength thereof. By employing the manufacturing method for a wavelength conversion member in the embodiment of the present invention as described above, it is theoretically possible to decrease the thickness of the wavelength conversion member to about 0.5 nm in consideration of particle sizes of semiconductor fine particle phosphors. Therefore, by the wavelength conversion member in the condition as described above, it becomes possible to obtain maximal compatibility of improvement in emission efficiency and thinning of the wavelength conversion member.

In the above, the test results of the cases where an InP/ZnS semiconductor fine particle phosphor is used as a semiconductor fine particle phosphor contained in the wavelength conversion member have been described by taking Examples A1 to A18 and Comparative Examples A1 to A10 as examples, however, it is experimentally demonstrated that a similar tendency is observed even when other kinds of semiconductor fine particle phosphors are used. That is, it is demonstrated by the present inventors that as a result of evaluation using the wavelength conversion members experimentally manufactured using various kinds of semiconductor fine particle phosphors, influence of difference in the dispersed state of semiconductor fine particle phosphors on emission efficiency of the wavelength conversion member is similar to that in the case of the wavelength conversion member using the InP/ZnS semiconductor fine particle phosphors as described above.

Figure 36:
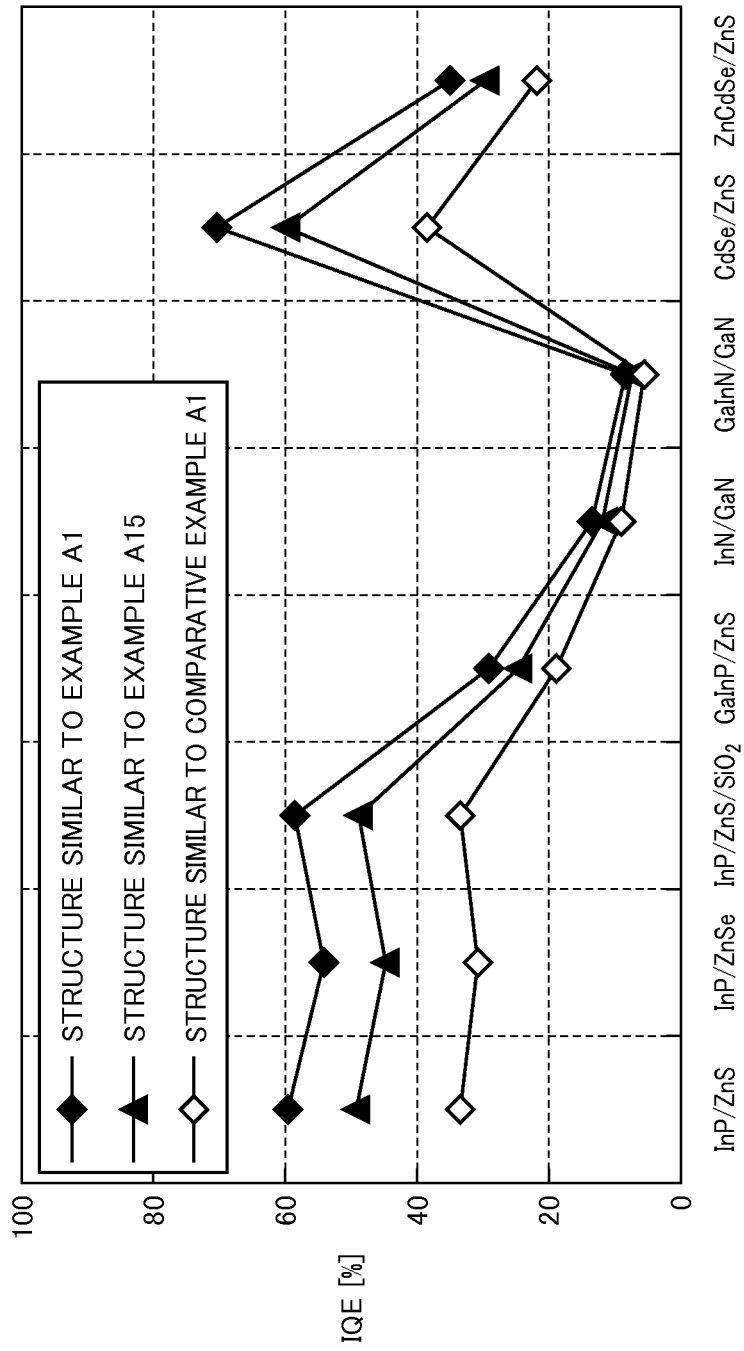
FIG. 36 is a graph showing correlations between absorptance of semiconductor fine particle phosphor with respect to blue light of 450 nm and internal quantum efficiency (IQE) of the wavelength conversion member in wavelength conversion members produced by using various semiconductor fine particle phosphors.

FIG. 36 is a graph showing internal quantum efficiency (IQE) of a wavelength conversion member when blue light at 450 nm of the semiconductor fine particle phosphor is used in the wavelength conversion member manufactured by using the various kinds of semiconductor fine particle phosphors. In FIG. 36, the horizontal axis represents the kind of semiconductor fine particle phosphor and the vertical axis represents internal quantum efficiency (IQE) [%] of the wavelength conversion member.

As shown in FIG. 36, it is demonstrated that emission efficiency of the wavelength conversion member is improved not only in the case where the InP/ZnS semiconductor fine particle phosphor is used as an semiconductor fine particle phosphor, but also in the cases where an InP/ZnSe semiconductor fine particle phosphor, an InP/ZnS/SiO$_2$ semiconductor fine particle phosphor, a Ga$_{0.5}$In$_{0.5}$P/ZnS semiconductor fine particle phosphor, an InN/GaN semiconductor fine particle phosphor, a Ga$_{0.4}$In$_{0.6}$N/GaN semiconductor fine particle phosphor, a CdSe/ZnS semiconductor fine particle phosphor, or a ZnCdSe/ZnS semiconductor fine particle phosphor is used.

Figure 38:
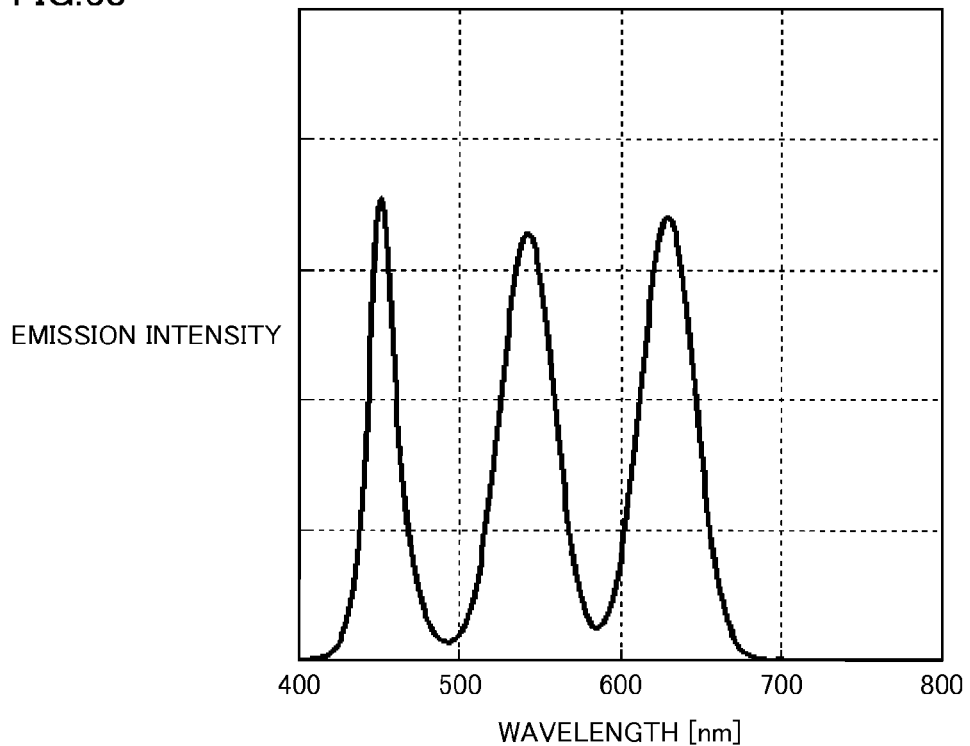
FIG. 38 is a graph showing emission spectrum of the light emitting device according to Example B1.

FIG. 37 is a table collectively showing compositions and manufacturing methods of wavelength conversion members of light emitting devices according to Examples B1 to B13 and Comparative Examples B1 to B8, optical characteristics of the light emitting devices and so on. FIG. 38 is a graph showing emission spectrum of the light emitting device according to Example B1. In FIG. 38, the horizontal axis represents wavelength [nm], and the vertical axis represents emission intensity. For measurement of emission efficiency, color rendition index Ra, color temperature Tcp and chromaticity coordinate (u', v') of the light emitting device shown in FIG. 37, an emission measurement system MCPD-7000 available from OTSUKA ELECTRONICS CO., LTD. was used.

First, a concrete method for manufacturing a wavelength conversion member included in light emitting devices in Example and Comparative Example will be described. A light emitting device according to Example includes as a wavelength conversion member, a wavelength conversion member having specific anisotropy in dispersion concentration of semiconductor fine particle phosphor as described above, and a light emitting device according to Comparative Example includes as a wavelength conversion member, a wavelength conversion member not having specific anisotropy in dispersion concentration of semiconductor fine particle phosphor as described above. In a wavelength conversion member included in a light emitting device according to Example, amounts of various kinds of semiconductor fine particle phosphors and an amount of the light transmissive member were adjusted so that about 90% of excitation light at 450 nm is absorbed, and emission intensities of the semiconductor fine particle phosphors are in comparable levels.

In Example B1, as shown in FIG. 37, a wavelength conversion member constituted by an InP/ZnS red semiconductor fine particle phosphor, an InP/ZnS green semiconductor fine particle phosphor, and silicone resin SCR-1015 was manufactured according to the manufacturing method shown in FIG. 16 as described above, and the manufactured wavelength conversion member was combined with a blue LED having an InGaN semiconductor active layer having a peak wavelength of emission spectrum of 450 nm, to manufacture a light emitting device as shown in FIG. 18.

First, 1.32 mg of an InP/ZnS red semiconductor fine particle phosphor was dispersed in a toluene solvent. This dispersed liquid was applied on the blue LED, and the toluene solvent was volatilized. Then, 5.76 mg of an InP/ZnS green semiconductor fine particle phosphor was dispersed in a toluene solvent, and this dispersed liquid was further applied on the blue LED, and the toluene solvent was volatilized.

Then, 512.0 mg of silicone resin A liquid and 490.9 mg of silicone resin B liquid were weighed and mixed. The silicone resin mixture was applied on the blue LED, and cured by heating at 80° C. for 1 hour and at 150° C. for 5 hours, to obtain the light emitting device according to Example B1.

The wavelength conversion member included in the light emitting device according to Example B1 was directly observed under TEM, and it was demonstrated that as shown in FIG. 37, the semiconductor fine particle phosphors are arrayed in the form of hexagonal lattice in the XY plane (see FIG. 15), and the semiconductor fine particle phosphors are arrayed in the form of layers by kind in the Z axial direction (see FIG. 14).

The light emitting device according to Example B1 was caused to emit light, and an emission spectrum as shown in FIG. 38 was observed.

As shown in FIG. 37, it was demonstrated that in the light emitting device according to Example B1, emission efficiency was 53.5 lm/W, color rendition index Ra was 70.0, color temperature was 4934K, and chromaticity coordinate (u', v') was (0.203, 0.500).

In Example B2, as shown in FIG. 37, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 11 as described above, and the manufactured wavelength conversion member was combined with a blue LED having an InGaN semiconductor active layer having a peak wavelength of emission spectrum of 450 nm, to manufacture a light emitting device as shown in FIG. 18.

First, 1.13 mg of an InP/ZnS red semiconductor fine particle phosphor and 7.70 mg of an InP/ZnS green semiconductor fine particle phosphor were mixed, and then these were dispersed in a toluene solvent. This dispersed liquid was applied on the blue LED, and the toluene solvent was volatilized.

Then, 490.0 mg of silicone resin A liquid and 492.7 mg of silicone resin B liquid were weighed, and mixed. The silicone resin mixture was applied on the blue LED, and cured by heating at 80° C. for 1 hour and at 150° C. for 5 hours, to obtain the light emitting device according to Example B2.

The wavelength conversion member included in the light emitting device according to Example B2 was directly observed under TEM, and it was demonstrated that as shown in FIG. 37, the semiconductor fine particle phosphors are arrayed in the form of hexagonal lattice in the XY plane (see FIG. 10), and the semiconductor fine particle phosphors are arrayed in the form of layers in the Z axial direction (see FIG. 9).

As shown in FIG. 37, it was demonstrated that in the light emitting device according to Example B2, emission efficiency was 35.8 lm/W, color rendition index Ra was 68.8, color temperature was 4914 K, and chromaticity coordinate (u', v') was (0.210, 0.490).

In Example B3, as shown in FIG. 37, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue LED having an InGaN semiconductor active layer having a peak wavelength of emission spectrum of 450 nm, to manufacture a light emitting device as shown in FIG. 18. Here, difference from Example B1 lies in the order of lamination of the semiconductor fine particle phosphors. To be more specific, in Example B3, the dispersed liquid containing the InP/ZnS green semiconductor fine particle phosphor was first applied on a blue LED, and then the dispersed liquid containing the InP/ZnS red semiconductor fine particle phosphor was further applied on the blue LED. The composition, manufacturing method, optical characteristic and the like of the wavelength conversion member of the light emitting device according to Example B3 are shown in FIG. 37.

In Example B4, as shown in FIG. 37, a wavelength conversion member constituted by an InP/ZnS yellow semiconductor fine particle phosphor and silicone resin SCR-1015 was manufactured according to the manufacturing method shown in FIG. 16 as described above, and the manufactured wavelength conversion member was combined with a blue LED having an InGaN semiconductor active layer having a peak wavelength of emission spectrum of 450 nm, to manufacture a light emitting device as shown in FIG. 18. Here, difference from Example B1 lies in the number of kinds of semiconductor fine particle phosphors. The composition, manufacturing method and the like of the wavelength conversion member of the light emitting device according to Example B4, and optical characteristic and the like of the light emitting device are shown in FIG. 37.

In Example B5, as shown in FIG. 37, a wavelength conversion member constituted by an InP/ZnS red semiconductor fine particle phosphor, an InP/ZnS green semiconductor fine particle phosphor, an InP/ZnS yellow semiconductor fine particle phosphor and silicone resin SCR-1015 was manufactured according to the manufacturing method shown in FIG. 16 as described above, and the manufactured wavelength conversion member was combined with a blue LED having an InGaN semiconductor active layer having a peak wavelength of emission spectrum of 450 nm, to manufacture a light emitting device as shown in FIG. 18. Here, difference from Example B1 lies in the number of kinds of semiconductor fine particle phosphors. The composition, manufacturing method and the like of the wavelength conversion member of the light emitting device according to Example B5, and optical characteristic and the like of the light emitting device are shown in FIG. 37.

In Example B6, as shown in FIG. 37, a wavelength conversion member constituted by an InP/ZnS red semiconductor fine particle phosphor, an InP/ZnS green semiconductor fine particle phosphor, an InP/ZnS yellow semiconductor fine particle phosphor, an InP/ZnS blue semiconductor fine particle phosphor and silicone resin SCR-1015 was manufactured according to the manufacturing method shown in FIG. 16 as described above, and the manufactured wavelength conversion member was combined with a blue LED having an InGaN semiconductor active layer having a peak wavelength of emission spectrum of 450 nm, to manufacture a light emitting device as shown in FIG. 18. Here, difference from Example B1 lies in the number of kinds of semiconductor fine particle phosphors. The composition, manufacturing method and the like of the wavelength conversion member of the light emitting device according to Example B6, and optical characteristic and the like of the light emitting device are shown in FIG. 37.

In Examples B7 to B9, as shown in FIG. 37, likewise the case of Example B1, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue LED having an InGaN semiconductor active layer having a peak wavelength of emission spectrum of 450 nm, to manufacture a light emitting device as shown in FIG. 18. Here, difference from Example B1 lies in the contained amounts of the InP/ZnS red semiconductor fine particle phosphor and the InP/ZnS green semiconductor fine particle phosphor, and in Examples B7 to B9, film thickness of the wavelength conversion member in the part where these semiconductor fine particle phosphors are dispersed is varied by varying these contained amounts much widely. The composition, manufacturing method and the like of the wavelength conversion member of the light emitting device according to Examples B7 to B9, and optical characteristic and the like of the light emitting device are shown in FIG. 37.

In Example B10, as shown in FIG. 37, a wavelength conversion member constituted by an InP/ZnS red semiconductor fine particle phosphor, an InP/ZnS green semiconductor fine particle phosphor, an InP/ZnS blue semiconductor fine particle phosphor and silicone resin SCR-1015 was manufactured according to the manufacturing method shown in FIG. 16 as described above, and the manufactured wavelength conversion member was combined with a blue violet LED having an InGaN semiconductor active layer having a peak wavelength of emission spectrum of 405 nm, to manufacture a light emitting device as shown in FIG. 18. Here, difference from Example B1 lies in the number of kinds of semiconductor fine particle phosphors and the kind of the light emitting element. The composition, manufacturing method and the like of the wavelength conversion member of the light emitting device according to Example B10, and optical characteristic and the like of the light emitting device are shown in FIG. 37.

In Example B11, as shown in FIG. 37, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue LD having an InGaN semiconductor active layer having a peak wavelength of emission spectrum of 450 nm, to manufacture a light emitting device as shown in FIG. 19. Here, difference from Example B1 lies in the kind of the light emitting element. The composition, manufacturing method and the like of the wavelength conversion member of the light emitting device according to Example B11, and optical characteristic and the like of the light emitting device are shown in FIG. 37.

In Example B12, as shown in FIG. 37, a wavelength conversion member constituted by an InP/ZnS red semiconductor fine particle phosphor, an InP/ZnS green semiconductor fine particle phosphor, an InP/ZnS blue semiconductor fine particle phosphor and silicone resin SCR-1015 was manufactured according to the manufacturing method shown in FIG. 16 as described above, and the manufactured wavelength conversion member was combined with a blue violet LD having an InGaN semiconductor active layer having a peak wavelength of emission spectrum of 405 nm, to manufacture a light emitting device as shown in FIG. 19. Here, difference from Example B1 lies in the number of kinds of semiconductor fine particle phosphors and the kind of the light emitting element. The composition, manufacturing method and the like of the wavelength conversion member of the light emitting device according to Example B12, and optical characteristic and the like of the light emitting device are shown in FIG. 37.

In Example B13, as shown in FIG. 37, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue EL having a FIrpic light emitting layer having a peak wavelength of emission spectrum of 480 nm, to manufacture a light emitting device as shown in FIG. 20. Here, difference from Example B1 lies in the kind of the light emitting element. The composition, manufacturing method and the like of the wavelength conversion member of the light emitting device according to Example B13, and optical characteristic and the like of the light emitting device are shown in FIG. 37.

In Comparative Example B1, as shown in FIG. 37, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above, and the manufactured wavelength conversion member was combined with a blue LED having an InGaN semiconductor active layer having a peak wavelength of emission spectrum of 450 nm, to manufacture a light emitting device as shown in FIG. 18.

First, 0.92 mg of an InP/ZnS red semiconductor fine particle phosphor and 9.65 mg of an InP/ZnS green semiconductor fine particle phosphor were mixed. Then 508.5 mg of silicone resin A liquid and 497.1 mg of silicone resin B liquid were weighed and mixed.

The silicone resin mixture was mixed and dispersed with the semiconductor fine particle phosphor mixture, and applied on a blue LED, and cured by heating at 80° C. for 1 hour and at 150° C. for 5 hours, to obtain the light emitting device according to Comparative Example B1.

The wavelength conversion member included in the light emitting device according to Comparative Example A1 was directly observed under TEM, and it was demonstrated that as shown in FIG. 30, the semiconductor fine particle phosphors are dispersed randomly in the XY plane (see FIG. 51), and the semiconductor fine particle phosphors are dispersed randomly in the Z axial direction (see FIG. 50).

As shown in FIG. 37, it was demonstrated that in the light emitting device according to Comparative Example B1, emission efficiency was 27.1 lm/W, color rendition index Ra was 68.5, color temperature was 4974K, and chromaticity coordinate (u', v') was (0.210, 0.487).

In Comparative Examples B2 to B4, as shown in FIG. 37, likewise the case of Comparative Example B1 as described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above, and the manufactured wavelength conversion member was combined with a blue LED having an InGaN semiconductor active layer having a peak wavelength of emission spectrum of 450 nm, to manufacture a light emitting device as shown in FIG. 18. Here, difference from Comparative Example B1 lies in the contained amounts of the InP/ZnS red semiconductor fine particle phosphor and the InP/ZnS green semiconductor fine particle phosphor, and film thickness of the wavelength conversion member in the part where these semiconductor fine particle phosphors are dispersed is varied by varying these contained amounts widely. The composition, manufacturing method and the like of the wavelength conversion member of the light emitting device according to Comparative Examples B2 to B4, and optical characteristic and the like of the light emitting device are shown in FIG. 37.

In Comparative Examples B5, as shown in FIG. 37, a wavelength conversion member constituted by an InP/ZnS red semiconductor fine particle phosphor, an InP/ZnS green semiconductor fine particle phosphor, an InP/ZnS blue semiconductor fine particle phosphor and silicone resin SCR-1015 was manufactured according to the manufacturing method shown in FIG. 53 as described above, and the manufactured wavelength conversion member was combined with a blue violet LED having an InGaN semiconductor active layer having a peak wavelength of emission spectrum of 405 nm, to manufacture a light emitting device as shown in FIG. 18. Here, difference from Comparative Example B1 lies in the number of kinds of semiconductor fine particle phosphors and the kind of the light emitting element. The composition, manufacturing method and the like of the wavelength conversion member of the light emitting device according to Comparative Example B5, and optical characteristic and the like of the light emitting device are shown in FIG. 37.

In Comparative Example B6, as shown in FIG. 37, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above, and the manufactured wavelength conversion member was combined with a blue LD having an InGaN semiconductor active layer having a peak wavelength of emission spectrum of 450 nm, to manufacture a light emitting device as shown in FIG. 19. Here, difference from Comparative Example B1 lies in the kind of the light emitting element. The composition, manufacturing method and the like of the wavelength conversion member of the light emitting device according to Comparative Example B6, and optical characteristic and the like of the light emitting device are shown in FIG. 37.

In Comparative Example B7, as shown in FIG. 37, a wavelength conversion member constituted by an InP/ZnS red semiconductor fine particle phosphor, an InP/ZnS green semiconductor fine particle phosphor, an InP/ZnS blue semiconductor fine particle phosphor and silicone resin SCR-1015 was manufactured according to the manufacturing method shown in FIG. 53 as described above, and the manufactured wavelength conversion member was combined with a blue violet LD having an InGaN semiconductor active layer having a peak wavelength of emission spectrum of 405 nm, to manufacture a light emitting device as shown in FIG. 19. Here, difference from Comparative Example B1 lies in the number of kinds of semiconductor fine particle phosphors and the kind of the light emitting element. The composition, manufacturing method and the like of the wavelength conversion member of the light emitting device according to Comparative Example B7, and optical characteristic and the like of the light emitting device are shown in FIG. 37.

In Comparative Example B8, as shown in FIG. 37, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above, and the manufactured wavelength conversion member was combined with a blue EL having a FIrpic light emitting layer having a peak wavelength of emission spectrum of 480 nm, to manufacture a light emitting device as shown in FIG. 20. Here, difference from Comparative Example B1 lies in the kind of the light emitting element. The composition, manufacturing method and the like of the wavelength conversion member of the light emitting device according to Comparative Example B8, and optical characteristic and the like of the light emitting device are shown in FIG. 37.

First, influence of difference in the wavelength conversion member on the dispersed state of semiconductor fine particle phosphors will be discussed. For this discussion, Example B1, Example B2 and Comparative Example B1 are referred.

Example B1, Example B2 and Comparative Example B1 are substantially comparable in contained amounts of semiconductor fine particle phosphor and in a contained amount of silicone resin. However, due to the difference in the manufacturing method as described above, difference as shown in FIG. 37 arose in the dispersed state of semiconductor fine particle phosphor in the wavelength conversion member.

As shown in FIG. 37, in contrast to Example B1 and Example B2 where the semiconductor fine particle phosphors are regularly arrayed in the XY plane, the semiconductor fine particle phosphors are randomly located in the XY plane in Comparative Example B1. This is attributed to the fact that in Example B1 and Example B2, the semiconductor fine particle phosphors were applied on a blue LED in the condition that they were dispersed in a volatile solvent, and then the volatile solvent was volatilized. More specifically, as the volatilization of the volatile solvent proceeds, the volatile solvent would cover the blue LED in a thickness of several nanometers to several tens nanometers, and at this time, the semiconductor fine particle phosphors would be regularly arrayed in the form of layers by self-organization.

It was also demonstrated that in both of the wavelength conversion members of the light emitting devices according to Example B1 and Example B2, as shown in FIG. 14 and FIG. 9, the semiconductor fine particle phosphors were localized on either side of the wavelength conversion member. It was also demonstrated that in Example B1 and Example B2, InP/ZnS semiconductor fine particle phosphors are arrayed in the form of hexagonal lattice in the XY plane.

Next, influence of difference in the dispersed state of semiconductor fine particle phosphor on the emission efficiency of the light emitting device will be discussed. For this discussion, Example B1, Example B2 and Comparative Example B1 are referred.

Example B1, Example B2 and Comparative Example B1 are substantially comparable in contained amounts of semiconductor fine particle phosphors and in a contained amount of silicone resin. However, as shown in FIG. 37, emission efficiency of the light emitting device in Example B1, Example B2 and Comparative Example B1 was 53.5 lm/W, 35.8 lm/W and 27.1 lm/W, respectively. As evidenced by this, it was demonstrated that in both of the light emitting devices according to Example B1 and Example B2, higher emission efficiency than that of the light emitting device according to Comparative Example B1 is obtained.

These results mean that by providing dispersion concentration of semiconductor fine particle phosphor as described above with specific anisotropy as described above, it is possible to improve the emission efficiency of the light emitting device. That is, it is determined that by packing the semiconductor fine particle phosphors at high density in the XY plane, thereby increasing dispersion concentration of semiconductor fine particle phosphor in the XY in-plane direction, while decreasing concentration of semiconductor fine particle phosphor in the Z axial direction, reabsorption of fluorescence is suppressed and the emission efficiency of the light emitting device is improved.

Further, although the detail will not be shown, in the wavelength conversion members of the light emitting devices according to Example B1 and Example B2, absorptance of excitation light is improved and also external quantum efficiency (EQE) is improved in comparison with the wavelength conversion member of the light emitting device according to Comparative Example B1. This is attributable to the fact that in the wavelength conversion members of the light emitting devices according to Example B1 and Example B2, dispersion concentration of semiconductor fine particle phosphor in the XY plane is increased in comparison with the wavelength conversion member of the light emitting device according to Comparative Example B1.

Next, in laminating the semiconductor fine particle phosphors in the form of layers by kind based on emission wavelength and particle size, influence of difference in the order of lamination on the emission efficiency of the light emitting device will be discussed. For this discussion, Example B1, Example B2 and Comparative Example B1 are referred.

As shown in FIG. 37, by comparison of Example B1, Example B3 and Comparative Example B1 having different dispersed states of semiconductor fine particle phosphors or different orders of lamination, it was demonstrated that emission efficiency of the light emitting device is improved in Example B1 and Example B3 than in Comparative Example B1. This is attributable to the fact that reabsorption of fluorescence can be relatively suppressed because concentration of semiconductor fine particle phosphor in the XY plane is improved.

Also, as shown in FIG. 37, it is demonstrated that emission efficiency of the light emitting device is higher in Example B1 than in Example B3. This is attributable to the fact that reabsorption of fluorescence can be further suppressed because the semiconductor fine particle phosphors are laminated in the form of layers while they are separated by kind in the Z axial direction of the wavelength conversion member and the semiconductor fine particle phosphor of the kind having long emission wavelength and large particle size is disposed on the side of light input plane of the wavelength conversion member. More specifically, it is attributable to the fact that in Example B1, since the green semiconductor fine particle phosphor is disposed on the side closer to light output plane in the wavelength conversion member than the red semiconductor fine particle phosphor, fluorescence emitted by the green semiconductor fine particle phosphor is not reabsorbed by the red semiconductor fine particle phosphor and light loss is difficult to occur, while on the contrary, in Example B3, since the red semiconductor fine particle phosphor is disposed on the side closer to the light output plane in the wavelength conversion member than the green semiconductor fine particle phosphor, fluorescence emitted by the red semiconductor fine particle phosphor is reabsorbed by the green semiconductor fine particle phosphor and light loss is easy to occur.

These result mean that by increasing dispersion concentration of semiconductor fine particle phosphor in the XY in-plane direction by closely packing the semiconductor fine particle phosphors in the XY plane of the wavelength conversion member, and decreasing concentration of semiconductor fine particle phosphor in the Z axial direction, and laminating semiconductor fine particle phosphors in the form of layers based on emission wavelength and particle size while they are separated by kind in the Z axial direction, it is possible to suppress reabsorption of fluorescence and improve the emission efficiency of the wavelength conversion member.

Figure 39:
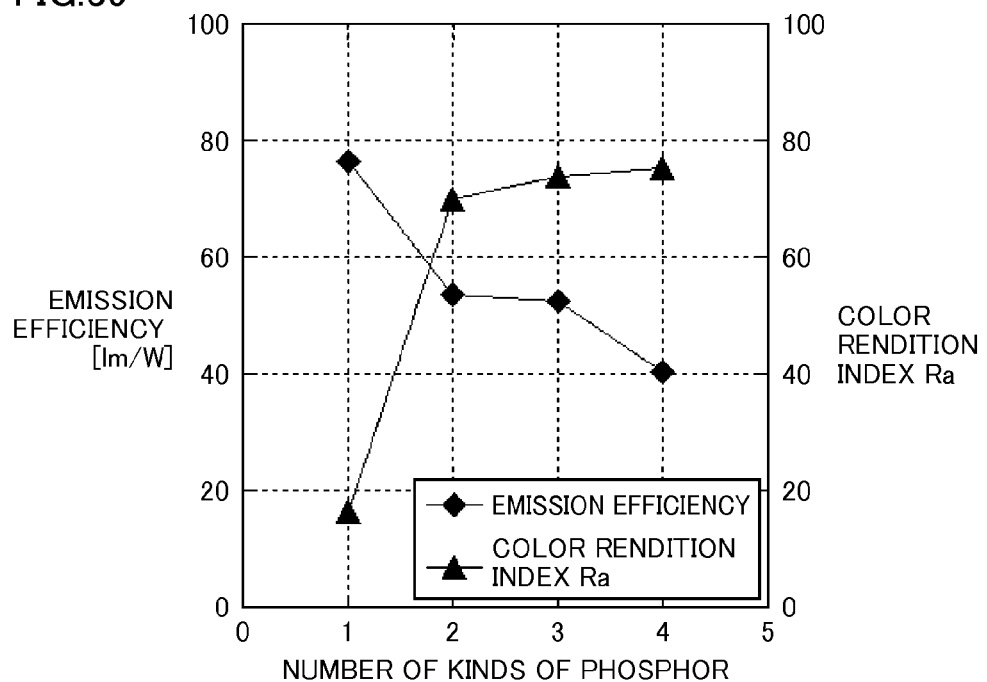
FIG. 39 is a graph showing correlations between the number of kinds of semiconductor fine particle phosphor, and emission efficiency and color rendition index Ra of the light emitting device in Examples B1, B4 to B6.
Figures 40, 41:
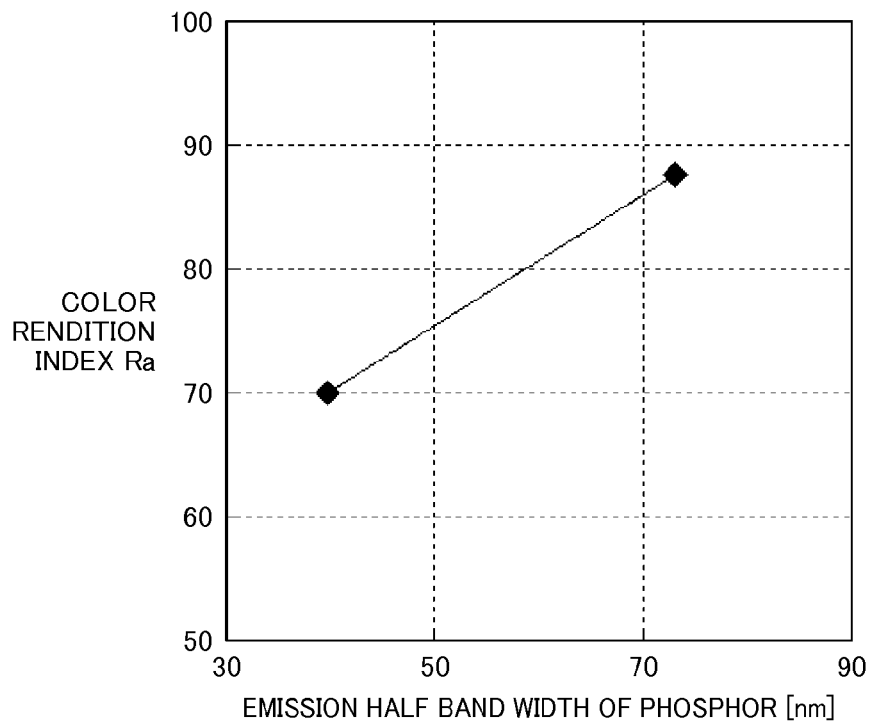
FIG. 40 is a graph showing a correlation between half band width of emission spectrum of semiconductor fine particle phosphor and emission efficiency of the light emitting device in Examples B1, B4 to B6.
FIG. 41 is a table showing results of various experimental manufactures in Examples B1, B7 to B9 and Comparative Examples B1 to B4.

Next, influence of difference in the number of kinds of semiconductor fine particle phosphors on emission efficiency and color rendition index of the light emitting device, and influence of difference in a half band width of emission spectrum of semiconductor fine particle phosphors on color rendition index of the light emitting device will be discussed. For this discussion, Examples B1, B4 to B6 are referred. FIG. 39 is a graph showing correlation between number of kinds of semiconductor fine particle phosphors and emission efficiency and color rendition index Ra of the light emitting device in Examples B1, B4 to B6. In FIG. 39, the horizontal axis represents number of kinds of semiconductor fine particle phosphors and the vertical axis represents emission efficiency [lm/W] and color rendition index of the light emitting device. FIG. 40 is a graph showing correlation between half band width of emission spectrum of semiconductor fine particle phosphors and color rendition index of the light emitting device in Examples B1, B4 to B6. In FIG. 40, the horizontal axis represents half band width [nm] of semiconductor fine particle phosphor and the vertical axis represents color rendition index of the light emitting device.

As shown in FIG. 39, a tendency is observed that as the number of kinds of semiconductor fine particle phosphors contained in the wavelength conversion member increases, emission efficiency of the light emitting device decreases. This is attributable to the fact that as the number of kinds of semiconductor fine particle phosphors increases, the rate of occurrence of reabsorption of fluorescence increases, and from this view point, it is demonstrated that a smaller number of kinds of semiconductor fine particle phosphors is preferred.

On the other hand, as shown in FIG. 39, a tendency is observed that as the number of kinds of semiconductor fine particle phosphors contained in the wavelength conversion member increases, color rendition index Ra of the light emitting device is improved. This is attributable to the fact that as the number of kinds of semiconductor fine particle phosphors increases, the emission spectrum of the light emitting device further approximates to a continuous spectrum, and from this view point, it is demonstrated that a larger number of kinds of semiconductor fine particle phosphors is preferred.

From these results, it was demonstrated that for realizing a light emitting device having high practicality enabling compatibility of emission efficiency and color rendition index, as the wavelength conversion member included in the light emitting device, the one having 2 to 4 kinds of semiconductor fine particle phosphors is preferably used.

Also, as shown in FIG. 40, a tendency was observed that the light emitting device using a semiconductor fine particle phosphor having a large half band width contained in the wavelength conversion member has improved color rendition index in comparison with the light emitting device using a semiconductor fine particle phosphor having a small half band width contained in the wavelength conversion member. Therefore, it was demonstrated that the half band width of semiconductor fine particle phosphor contained in the wavelength conversion member to be incorporated into the light emitting device is greater than or equal to 50 nm.

Next, influence of difference in the dispersion state of semiconductor fine particle phosphors on thinning of the wavelength conversion member of the light emitting device will be discussed. For this discussion, Examples B1, B7 to B9 and Comparative Examples B1 to B4 are referred. FIG. 41 is a table showing the results of various experimental manufactures in Examples B1, B7 to B9 and Comparative Examples B1 to B4.

As shown in FIG. 41, in light emitting devices according to Examples B1, B7 to B9 having specific anisotropy in dispersion concentration of semiconductor fine particle phosphor as described above, it was demonstrated that even when film thickness of the wavelength conversion member in the part where semiconductor fine particle phosphors are dispersed is thinned to 30.5 µm, it is possible to provide a light emitting device capable of outputting white light. However, in the light emitting devices according to Comparative Examples B1 to B4 not having specific anisotropy in dispersion concentration of semiconductor fine particle phosphor as described above, film thickness of the wavelength conversion member in the part where semiconductor fine particle phosphors are dispersed could be thinned to 75.8 µm at minimum for providing a light emitting device capable of outputting white light.

These results mean that by increasing dispersion concentration of semiconductor fine particle phosphor in the XY in-plane direction by closely packing the semiconductor fine particle phosphors in the XY plane of the wavelength conversion member, and decreasing concentration of semiconductor fine particle phosphor in the Z axial direction, it is possible to thin the wavelength conversion member of the light emitting device while keeping absorptance of excitation light high, and it is understood that a light emitting device that is thinned as a whole can be realized.

Figure 42:
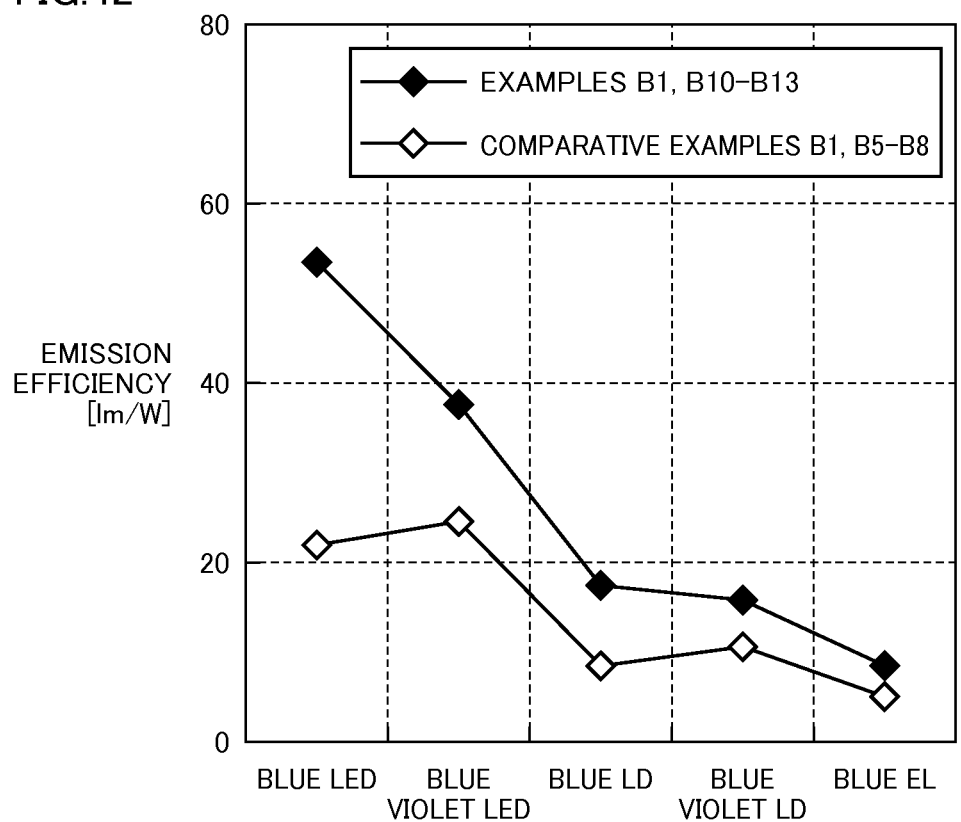
FIG. 42 is a graph showing correlations between the kind of light emitting element and emission efficiency of the light emitting device in Examples B1, B10 to B13 and Comparative Examples B1, B5 to B8.

Next, influence of difference in the kind of the light emitting element on emission efficiency of the light emitting device will be discussed. For this discussion, Examples B1, B10 to B13 and Comparative Examples B1, B5 to B8 are referred. FIG. 42 is a graph showing correlation between kind of the light emitting element and emission efficiency in Examples B1, B10 to B13 and Comparative Examples B1, B5 to B8. In FIG. 42, the horizontal axis represents kind of the light emitting element and the vertical axis represents emission efficiency [lm/W].

As shown in FIG. 42, it was demonstrated that the light emitting devices according to Examples B1, B10 to B13 showed higher emission efficiencies than the light emitting devices according to Comparative Examples B1, B5 to B8, respectively. That is, it was demonstrated that emission efficiency is improved in the light emitting devices according to Examples compared with the light emitting devices according to Comparative Examples in any case using a blue LED, a blue violet LED, a blue LD, a blue violet LD and a blue EL as the light emitting element.

These results mean that by increasing dispersion concentration of semiconductor fine particle phosphor in the XY in-plane direction by closely packing the semiconductor fine particle phosphors in the XY plane of the wavelength conversion member, and decreasing concentration of semiconductor fine particle phosphor in the Z axial direction, it is possible to provide a light emitting device capable of suppressing reabsorption of fluorescence and realizing high emission efficiency regardless of the kind of the light emitting element.

In the above, the test results of the cases where an InP/ZnS semiconductor fine particle phosphor is used as a semiconductor fine particle phosphor contained in the wavelength conversion member of the light emitting device have been described by taking Examples B1 to B13 and Comparative Examples B1 to B8 as examples, however, it is experimentally demonstrated that a similar tendency is observed even when other kinds of semiconductor fine particle phosphors are used. That is, it is demonstrated by the present inventors that as a result of evaluation of light emitting devices incorporating wavelength conversion members experimentally manufactured using various kinds of semiconductor fine particle phosphors, influence of difference in the dispersed state of semiconductor fine particle phosphors on emission efficiency of the wavelength conversion member of the light emitting device is similar to the light emitting device incorporating a wavelength conversion member manufactured by using the InP/ZnS semiconductor fine particle phosphors as described above.

Figure 43:
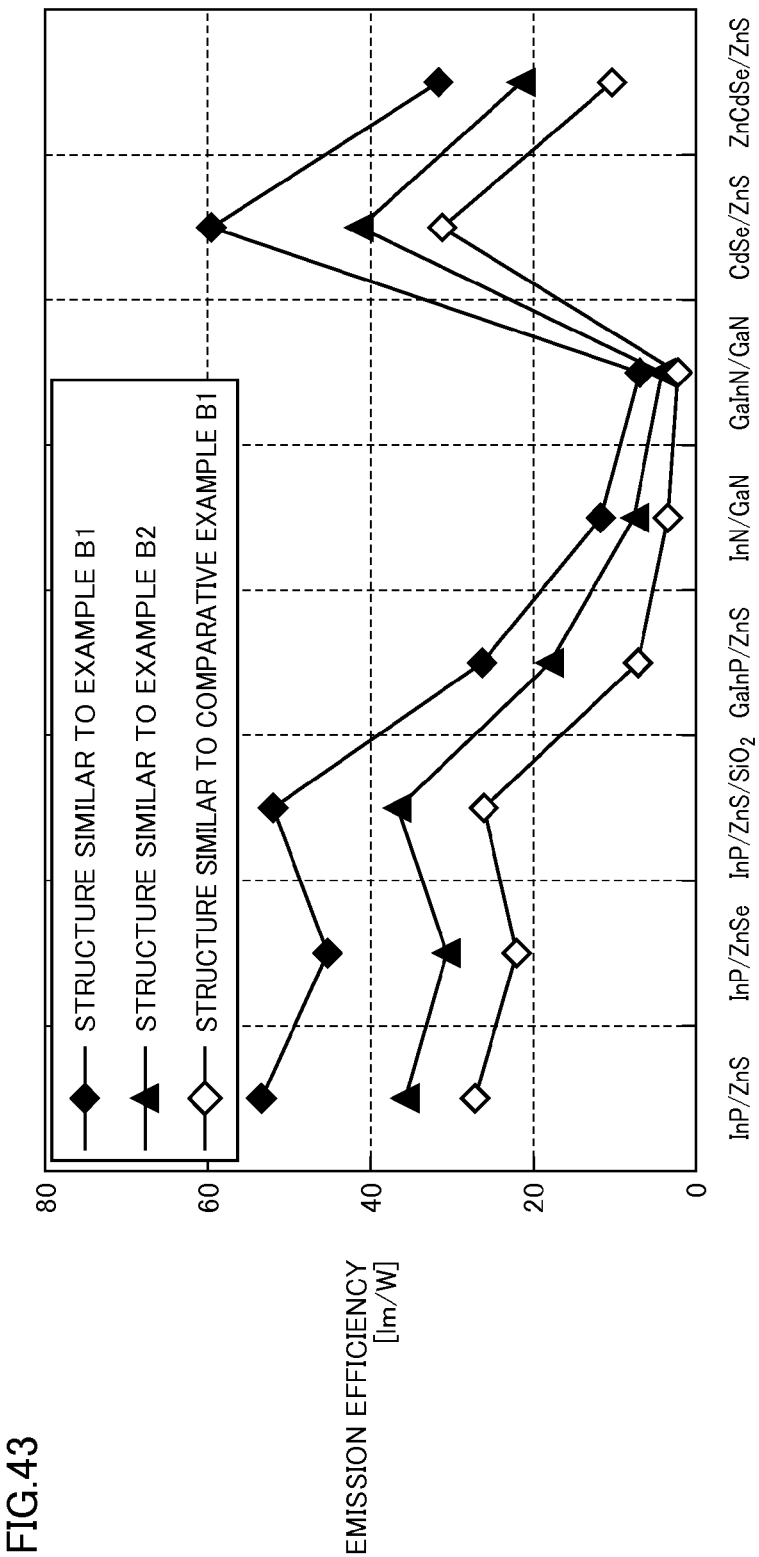
FIG. 43 is a graph showing emission efficiencies of light emitting devices including wavelength conversion members manufactured by using various semiconductor fine particle phosphors.

FIG. 43 is a graph showing emission efficiency of a light emitting device including a wavelength conversion member manufactured by using various kinds of semiconductor fine particle phosphors as described above. Here, in FIG. 43, the horizontal axis represents the kind of semiconductor fine particle phosphor, and the vertical axis represents emission efficiency [lm/W] of the light emitting device.

As shown in FIG. 43, it is demonstrated that emission efficiency of the light emitting device is improved not only in the case where InP/ZnS semiconductor fine particle phosphor is used as an semiconductor fine particle phosphor, but also in the cases where an InP/ZnSe semiconductor fine particle phosphor, an InP/ZnS/SiO$_2$ semiconductor fine particle phosphor, a Ga$_{0.5}$In$_{0.5}$P/ZnS semiconductor fine particle phosphor, an InN/GaN semiconductor fine particle phosphor, a Ga$_{0.4}$In$_{0.6}$N/GaN semiconductor fine particle phosphor, a CdSe/ZnS semiconductor fine particle phosphor, or a ZnCdSe/ZnS semiconductor fine particle phosphor is used.

Figure 45:
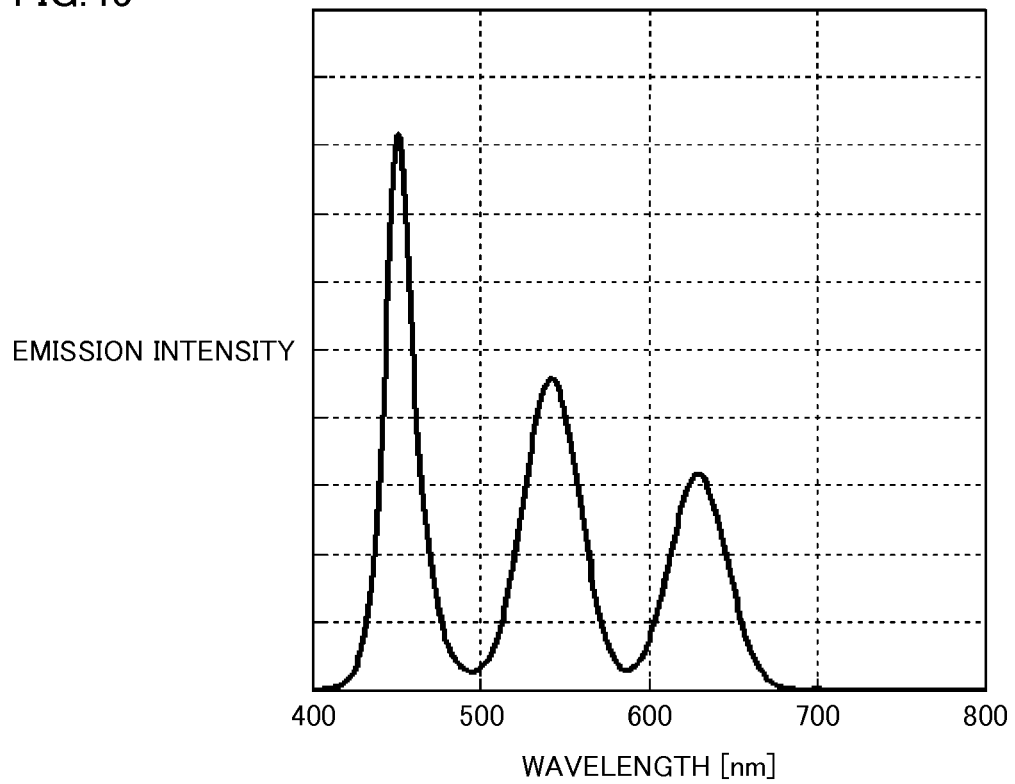
FIG. 45 is a graph showing an emission spectrum of a light emitting device used in the image display device according to Example C1.

FIG. 44 is a table collectively showing compositions and manufacturing methods of wavelength conversion members of image display devices and optical characteristic of the image display device according to Examples C1 to C11 and Comparative Examples C1 to C10. FIG. 45 is a graph showing emission spectrum of the light emitting device used in the image display device according to Example C1. In FIG. 45, the horizontal axis represents wavelength [nm], and the vertical axis represents emission intensity. For measurement of screen brightness, NTSC ratio and color temperature and chromaticity coordinate (u', v') at the time of white display of the image display device shown in FIG. 44, an emission measurement system MCPD-7000 available from OTSUKA ELECTRONICS CO., LTD. was used. Screen brightness is shown by a relative value with respect to the screen brightness of the image display device according to Comparative Example C1 of 1 (namely, 100%).

First, a concrete method for manufacturing a wavelength conversion member included in image display devices in Example and Comparative Example will be described. An image display device according to Example includes as a wavelength conversion member, a wavelength conversion member having specific anisotropy in dispersion concentration of semiconductor fine particle phosphor as described above, and an image display device according to Comparative Example includes as a wavelength conversion member, a wavelength conversion member not having specific anisotropy in dispersion concentration of semiconductor fine particle phosphor as described above. In a wavelength conversion member included in an image display device according to Example, amounts of various kinds of semiconductor fine particle phosphors and an amount of the light transmissive member were adjusted so that about 90% of excitation light at 450 nm is absorbed, and emission intensities of the semiconductor fine particle phosphors are in comparable levels.

In Example C1, as shown in FIG. 44, a wavelength conversion member constituted by an InP/ZnS red semiconductor fine particle phosphor, an InP/ZnS green semiconductor fine particle phosphor, and silicone resin SCR-1015 was manufactured according to the manufacturing method shown in FIG. 16 as described above, and the manufactured wavelength conversion member was combined with a blue LED having an InGaN semiconductor active layer having a peak wavelength of emission spectrum of 450 nm, to manufacture an image display device as shown in FIG. 21.

First, 0.75 mg of an InP/ZnS red semiconductor fine particle phosphor was dispersed in a toluene solvent. This dispersed liquid was applied on the blue LED, and the toluene solvent was volatilized. Then, 4.12 mg of an InP/ZnS green semiconductor fine particle phosphor was dispersed in a toluene solvent, and this dispersed liquid was further applied on the blue LED, and the toluene solvent was volatilized.

Then, 500.5 mg of silicone resin A liquid and 498.9 mg of silicone resin B liquid were weighed and mixed. The silicone resin mixture was applied on the blue LED, and cured by heating at 80° C. for 1 hour and at 150° C. for 5 hours, to obtain a light emitting device.

Then, on the light emitting device, a light guide plate and an image display part were provided, and thus the image display device according to Example C1 was obtained.

The wavelength conversion member included in the image display device according to Example C1 was directly observed under TEM, and it was demonstrated that as shown in FIG. 44, the semiconductor fine particle phosphors are arrayed in the form of hexagonal lattice in the XY plane (see FIG. 15), and the semiconductor fine particle phosphors are arrayed in the form of layers by kind in the Z axial direction (see FIG. 14).

The light emitting device used in Example C1 was caused to emit light, and an emission spectrum as shown in FIG. 45 was observed.

As shown in FIG. 44, it was demonstrated that in the image display device according to Example C1, screen brightness was 142.4%, NTSC ratio was 108.2%, color temperature was 9921K, and chromaticity coordinate (u', v') was (0.187, 0.443).

In Example C2, as shown in FIG. 44, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 11 as described above, and the manufactured wavelength conversion member was combined with a blue LED having an InGaN semiconductor active layer having a peak wavelength of emission spectrum of 450 nm, to manufacture an image display device as shown in FIG. 21.

First, 0.70 mg of an InP/ZnS red semiconductor fine particle phosphor and 5.41 mg of an InP/ZnS green semiconductor fine particle phosphor were mixed, and then these were dispersed in a toluene solvent. This dispersed liquid was applied on the blue LED, and the toluene solvent was volatilized.

Then, 500.3 mg of silicone resin A liquid and 494.6 mg of silicone resin B liquid were weighed, and mixed. The silicone resin mixture was applied on the blue LED, and cured by heating at 80° C. for 1 hour and at 150° C. for 5 hours, to obtain a light emitting device.

Then, on the light emitting device, a light guide plate and an image display part were provided, and thus the image display device according to Example C2 was obtained.

The wavelength conversion member included in the image display device according to Example C2 was directly observed under TEM, and it was demonstrated that as shown in FIG. 44, the semiconductor fine particle phosphors are arrayed in the form of hexagonal lattice in the XY plane (see FIG. 10), and the semiconductor fine particle phosphors are arrayed in the form of layers in the Z axial direction (see FIG. 9).

As shown in FIG. 44, it was demonstrated that in the image display device according to Example C2, screen brightness was 112.0%, NTSC ratio was 109.2%, color temperature was 10110K, and chromaticity coordinate (u', v') was (0.189, 0.440).

In Example C3, as shown in FIG. 44, a wavelength conversion member constituted by an InP/ZnS red semiconductor fine particle phosphor, an InP/ZnS green semiconductor fine particle phosphor, an InP/ZnS blue semiconductor fine particle phosphor and silicone resin SCR-1015 was manufactured according to the manufacturing method shown in FIG. 16 as described above, and the manufactured wavelength conversion member was combined with a blue violet LED having an InGaN semiconductor active layer having a peak wavelength of emission spectrum of 405 nm, to manufacture an image display device as shown in FIG. 21. Here, difference from Example C1 lies in the number of kinds of semiconductor fine particle phosphors and the kind of the light emitting element. The composition, manufacturing method and the like of the wavelength conversion member of the image display device according to Example C3, and optical characteristic and the like of the image display device are shown in FIG. 44.

In Example C4, as shown in FIG. 44, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue LD having an InGaN semiconductor active layer having a peak wavelength of emission spectrum of 450 nm, to manufacture an image display device as shown in FIG. 21. Here, difference from Example C1 lies in the kind of the light emitting element. The composition, manufacturing method and the like of the wavelength conversion member of the image display device according to Example C4, and optical characteristic and the like of the image display device are shown in FIG. 44.

In Example C5, as shown in FIG. 44, a wavelength conversion member constituted by an InP/ZnS red semiconductor fine particle phosphor, an InP/ZnS green semiconductor fine particle phosphor, an InP/ZnS blue semiconductor fine particle phosphor and silicone resin SCR-1015 was manufactured according to the manufacturing method shown in FIG. 16 as described above, and the manufactured wavelength conversion member was combined with a blue violet LD having an InGaN semiconductor active layer having a peak wavelength of emission spectrum of 405 nm, to manufacture an image display device as shown in FIG. 21. Here, difference from Example C1 lies in the number of kinds of semiconductor fine particle phosphors and the kind of the light emitting element. The composition, manufacturing method and the like of the wavelength conversion member of the image display device according to Example C5, and optical characteristic and the like of the image display device are shown in FIG. 44.

In Example C6, as shown in FIG. 44, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue EL having a FIrpic light emitting layer having a peak wavelength of emission spectrum of 480 nm, to manufacture an image display device as shown in FIG. 26. Here, difference from Example C1 lies in the kind of the light emitting element. The composition, manufacturing method and the like of the wavelength conversion member of the image display device according to Example C6, and optical characteristic and the like of the image display device are shown in FIG. 44.

In Example C7, as shown in FIG. 44, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue LED having an InGaN semiconductor active layer having a peak wavelength of emission spectrum of 450 nm, to manufacture an image display device as shown in FIG. 24. Here, difference from Example C1 lies in the structure of the image display device, and concretely, in Example C7, the wavelength conversion member is incorporated into the image display part rather than being incorporated into the irradiation part. The composition, manufacturing method and the like of the wavelength conversion member of the image display device according to Example C7, and optical characteristic and the like of the image display device are shown in FIG. 44.

In Examples C8 to C10, as shown in FIG. 44, likewise the case of Example C7 as described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue LED having an InGaN semiconductor active layer having a peak wavelength of emission spectrum of 450 nm, to manufacture an image display device as shown in FIG. 24. Here, difference from Example C7 lies in the contained amounts of the InP/ZnS red semiconductor fine particle phosphor and the InP/ZnS green semiconductor fine particle phosphor, and in Examples C8 to C10, film thickness of the wavelength conversion member in the part where these semiconductor fine particle phosphors are dispersed is varied by varying these contained amounts much widely. The compositions, manufacturing methods and the like of the wavelength conversion members of the image display devices according to Examples C8 to C10, and optical characteristics and the like of the image display devices are shown in FIG. 44.

In Example C11, as shown in FIG. 44, likewise the case of Example C6 as described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue EL having a FIrpic light emitting layer having a peak wavelength of emission spectrum of 480 nm, to manufacture an image display device as shown in FIG. 28. Here, difference from Example C6 lies in the structure of the image display device, and concretely, in Example C11, the wavelength conversion member is incorporated into the image display part rather than being incorporated into the irradiation part. The composition, manufacturing method and the like of the wavelength conversion member of the image display device according to Example C11, and optical characteristic and the like of the image display device are shown in FIG. 44.

In Comparative Example C1, as shown in FIG. 44, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above, and the manufactured wavelength conversion member was combined with a blue LED having an InGaN semiconductor active layer having a peak wavelength of emission spectrum of 450 nm, to manufacture an image display device as shown in FIG. 21.

First, 0.64 mg of an InP/ZnS red semiconductor fine particle phosphor and 6.31 mg of an InP/ZnS green semiconductor fine particle phosphor were mixed. Then 488.3 mg of silicone resin A liquid and 498.2 mg of silicone resin B liquid were weighed and mixed.

The silicone resin mixture was mixed and dispersed with the semiconductor fine particle phosphor mixture, and applied on a blue LED, and cured by heating at 80° C. for 1 hour and at 150° C. for 5 hours, to obtain a light emitting device.

Then, on the light emitting device, a light guide plate and an image display part were provided, and thus the image display device according to Comparative Example C1 was obtained.

The wavelength conversion member included in the image display device according to Comparative Example C1 was directly observed under TEM, and it was demonstrated that as shown in FIG. 44, the semiconductor fine particle phosphors are dispersed randomly in the XY plane (see FIG. 51), and the semiconductor fine particle phosphors are dispersed randomly in the Z axial direction (see FIG. 50).

As shown in FIG. 44, it was demonstrated that in the image display device according to Comparative Example C1, screen brightness was 100.0%, NTSC ratio was 107.2%, color temperature was 9907K, and chromaticity coordinate (u', v') was (0.187, 0.443).

In Comparative Example C2, as shown in FIG. 44, a wavelength conversion member constituted by an InP/ZnS red semiconductor fine particle phosphor, an InP/ZnS green semiconductor fine particle phosphor, an InP/ZnS blue semiconductor fine particle phosphor and silicone resin SCR-1015 was manufactured according to the manufacturing method shown in FIG. 53 as described above, and the manufactured wavelength conversion member was combined with a blue violet LED having an InGaN semiconductor active layer having a peak wavelength of emission spectrum of 405 nm, to manufacture an image display device as shown in FIG. 21. Here, difference from Comparative Example C1 lies in the number of kinds of semiconductor fine particle phosphors and the kind of the light emitting element. The composition, manufacturing method and the like of the wavelength conversion member of the image display device according to Comparative Example C2, and optical characteristic and the like of the image display device are shown in FIG. 44.

In Comparative Example C3, as shown in FIG. 44, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above, and the manufactured wavelength conversion member was combined with a blue LD having an InGaN semiconductor active layer having a peak wavelength of emission spectrum of 450 nm, to manufacture an image display device as shown in FIG. 21. Here, difference from Comparative Example C1 lies in the kind of the light emitting element. The composition, manufacturing method and the like of the wavelength conversion member of the image display device according to Comparative Example C3, and optical characteristic and the like of the image display device are shown in FIG. 44.

In Comparative Example C4, as shown in FIG. 44, a wavelength conversion member constituted by an InP/ZnS red semiconductor fine particle phosphor, an InP/ZnS green semiconductor fine particle phosphor, an InP/ZnS blue semiconductor fine particle phosphor and silicone resin SCR-1015 was manufactured according to the manufacturing method shown in FIG. 53 as described above, and the manufactured wavelength conversion member was combined with a blue violet LD having an InGaN semiconductor active layer having a peak wavelength of emission spectrum of 405 nm, to manufacture an image display device as shown in FIG. 21. Here, difference from Comparative Example C1 lies in the number of kinds of semiconductor fine particle phosphors and the kind of the light emitting element. The composition, manufacturing method and the like of the wavelength conversion member of the image display device according to Comparative Example C4, and optical characteristic and the like of the image display device are shown in FIG. 44.

In Comparative Example C5, as shown in FIG. 44, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 16 as described above, and the manufactured wavelength conversion member was combined with a blue EL having a FIrpic light emitting layer having a peak wavelength of emission spectrum of 480 nm, to manufacture an image display device as shown in FIG. 26. Here, difference from Comparative Example C1 lies in the kind of the light emitting element. The composition, manufacturing method and the like of the wavelength conversion member of the image display device according to Comparative Example C5, and optical characteristic and the like of the image display device are shown in FIG. 44.

In Comparative Example C6, as shown in FIG. 44, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above, and the manufactured wavelength conversion member was combined with a blue LED having an InGaN semiconductor active layer having a peak wavelength of emission spectrum of 450 nm, to manufacture an image display device as shown in FIG. 24. Here, difference from Comparative Example C1 lies in the structure of the image display device, and concretely, in Comparative Example C6, the wavelength conversion member is incorporated into the image display part rather than being incorporated into the irradiation part. The composition, manufacturing method and the like of the wavelength conversion member of the image display device according to Comparative Example C6, and optical characteristic and the like of the image display device are shown in FIG. 44.

In Comparative Examples C7 to C9, as shown in FIG. 44, likewise the case of Comparative Example C6 as described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above, and the manufactured wavelength conversion member was combined with a blue LED having an InGaN semiconductor active layer having a peak wavelength of emission spectrum of 450 nm, to manufacture an image display device as shown in FIG. 24. Here, difference from Comparative Example C6 lies in the contained amounts of the InP/ZnS red semiconductor fine particle phosphor and the InP/ZnS green semiconductor fine particle phosphor, and in Comparative Examples C7 to C9, film thickness of the wavelength conversion member in the part where these semiconductor fine particle phosphors are dispersed is varied by varying these contained amounts much widely. The compositions, manufacturing methods and the like of the wavelength conversion members of the image display devices according to Comparative Examples C7 to C9, and optical characteristics and the like of the image display devices are shown in FIG. 44.

In Comparative Example C10, as shown in FIG. 44, likewise the case of Comparative Example C5 as described above, a wavelength conversion member constituted by an InP/ZnS red semiconductor fine particle phosphor, an InP/ZnS green semiconductor fine particle phosphor and silicone resin SCR-1015 was manufactured according to the manufacturing method shown in FIG. 53 as described above, and the manufactured wavelength conversion member was combined with a blue EL having a FIrpic light emitting layer having a peak wavelength of emission spectrum of 480 nm, to manufacture an image display device as shown in FIG. 28. Here, difference from Comparative Example C5 lies in the structure of the image display device, and concretely, in Comparative Example C10, the wavelength conversion member is incorporated into the image display part rather than being incorporated into the irradiation part. The composition, manufacturing method and the like of the wavelength conversion member of the image display device according to Comparative Example C10, and optical characteristic and the like of the image display device are shown in FIG. 44.

First, influence of difference in the wavelength conversion member on the dispersed state of semiconductor fine particle phosphors will be discussed. For this discussion, Example C1, Example C2 and Comparative Example C1 are referred.

Example C1, Example C2 and Comparative Example C1 are substantially comparable in contained amounts of semiconductor fine particle phosphor and in a contained amount of silicone resin. However, due to the difference in the manufacturing method as described above, difference as shown in FIG. 44 arose in the dispersed state of semiconductor fine particle phosphor in the wavelength conversion member.

As shown in FIG. 44, in contrast to Example C1 and Example C2 where the semiconductor fine particle phosphors are regularly arrayed in the XY plane, the semiconductor fine particle phosphors are randomly located in the XY plane in Comparative Example C1. This is attributed to the fact that in Example C1 and Example C2, the semiconductor fine particle phosphors were applied on a blue LED in the condition that they were dispersed in a volatile solvent, and then the volatile solvent was volatilized. More specifically, as the volatilization of the volatile solvent proceeds, the volatile solvent would cover the blue LED in a thickness of several nanometers to several tens nanometers, and at this time, the semiconductor fine particle phosphors would be regularly arrayed in the form of layers by self-organization.

It was also demonstrated that in both of the wavelength conversion members of the image display devices according to Example C1 and Example C2, as shown in FIG. 14 and FIG. 9, the semiconductor fine particle phosphors were localized on either side of the wavelength conversion member. It was also demonstrated that in Example C1 and Example C2, InP/ZnS semiconductor fine particle phosphors are arrayed in the form of hexagonal lattice in the XY plane.

Next, influence of difference in the dispersed state of semiconductor fine particle phosphor on the screen brightness of the image display device will be discussed. For this discussion, Example C1, Example C2 and Comparative Example C1 are referred.

Example C1, Example C2 and Comparative Example C1 are substantially comparable in contained amounts of semiconductor fine particle phosphors and in a contained amount of silicone resin. However, as shown in FIG. 44, screen brightness of the image display device was 142.4%, 112.0% and 100.0%, respectively, in Example C1, Example C2 and Comparative Example C1. As evidenced by this, it was demonstrated that in both of the image display devices according to Example C1 and Example C2, higher screen brightness than that of the image display device according to Example C1 was obtained.

These results mean that by providing dispersion concentration of semiconductor fine particle phosphor as described above with specific anisotropy as described above, it is possible to improve the screen brightness of the image display device. That is, it is determined that by packing the semiconductor fine particle phosphors at high density in the XY plane, thereby increasing dispersion concentration of semiconductor fine particle phosphor in the XY in-plane direction, while decreasing concentration of semiconductor fine particle phosphor in the Z axial direction, reabsorption of fluorescence is suppressed and the screen brightness of the image display device is improved.

Further, although the detail will not be shown, in the wavelength conversion members of the image display devices according to Example C1 and Example C2, absorptance of excitation light is improved and also external quantum efficiency (EQE) is improved in comparison with the wavelength conversion member of the image display device according to Comparative Example C1. This is attributable to the fact that in the wavelength conversion members of the image display devices according to Example C1 and Example C2, dispersion concentration of semiconductor fine particle phosphor in the XY plane is increased in comparison with the wavelength conversion member of the image display device according to Comparative Example C1.

Figures 46, 47:
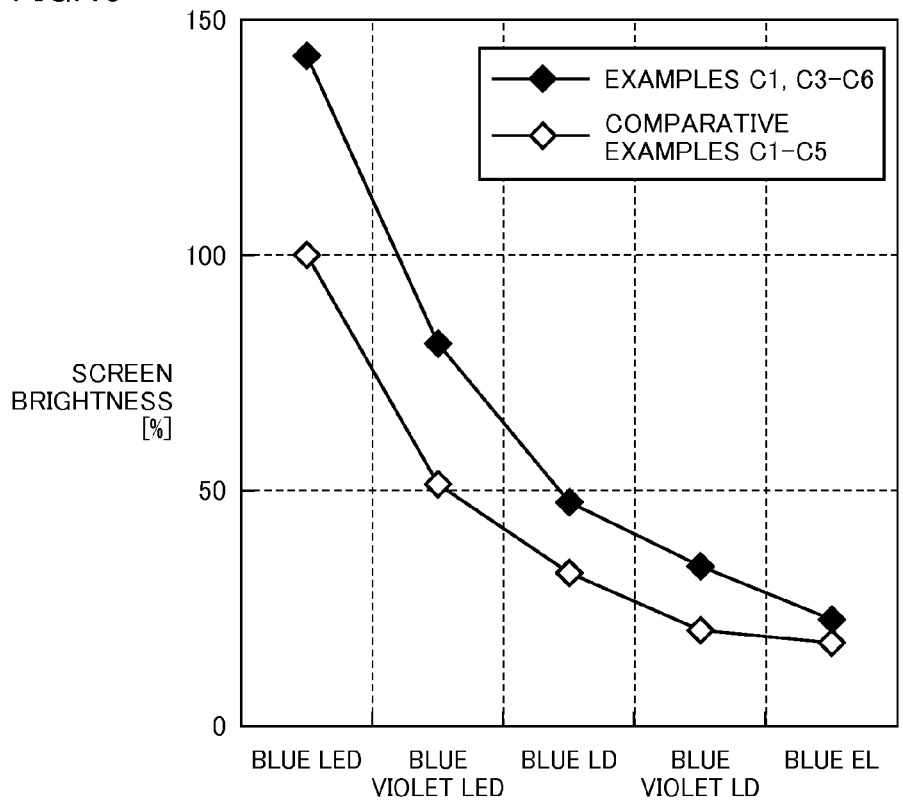
FIG. 46 is a graph showing correlations between the kind of light emitting element and screen brightness in Examples C1, C3 to C6 and Comparative Examples C1 to C5.
FIG. 47 is a table showing results of various experimental manufactures in Examples C7 to C10 and Comparative Examples C6 to C9.

Next, influence of difference in the light emitting element on screen brightness of the image display device will be discussed. For this discussion, Examples C1, C3 to C6 and Comparative Examples C1 to C5 are referred. FIG. 46 is a graph showing correlation between kind of the light emitting element and screen brightness in Examples C1, C3 to C6 and Comparative Examples C1 to C5. In FIG. 46, the horizontal axis represents kind of the light emitting element and the vertical axis represents screen brightness [%].

As shown in FIG. 46, it was demonstrated that the image display devices according to Examples C1, C3 to C6 showed higher screen brightness than the image display devices according to Comparative Examples C1 to C5, respectively. That is, it was demonstrated that screen brightness is improved in the image display devices according to Examples compared with the image display devices according to Comparative Examples in any case using a blue LED, a blue violet LED, a blue LD, a blue violet LD and a blue EL as the light emitting element.

These results mean that by increasing dispersion concentration of semiconductor fine particle phosphor in the XY in-plane direction by closely packing the semiconductor fine particle phosphors in the XY plane of the wavelength conversion member, and decreasing concentration of semiconductor fine particle phosphor in the Z axial direction, it is possible to provide an image display device capable of suppressing reabsorption of fluorescence and realizing high screen brightness regardless of the kind of the light emitting element.

Next, influence of difference in the dispersion state of semiconductor fine particle phosphors on thinning of the wavelength conversion member of the image display device will be discussed. For this discussion, Examples C7 to C10 and Comparative Examples C6 to C9 are referred. FIG. 47 is a table showing the results of various experimental manufactures in Examples C7 to C10 and Comparative Examples C6 to C9.

As shown in FIG. 47, in image display devices according to Examples C7 to C10 having specific anisotropy in dispersion concentration of semiconductor fine particle phosphor as described above, it was demonstrated that even when film thickness of the wavelength conversion member in the part where semiconductor fine particle phosphors are dispersed is thinned to 33.8 μm, it is possible to provide an image display device capable of outputting white light. However, in the light emitting devices according to Comparative Examples C6 to C9 not having specific anisotropy in dispersion concentration of semiconductor fine particle phosphor as described above, film thickness of the wavelength conversion member in the part where semiconductor fine particle phosphors are dispersed could be thinned to 61.4 μm at minimum for providing an image display device capable of outputting white light.

These results mean that by increasing dispersion concentration of semiconductor fine particle phosphor in the XY in-plane direction by closely packing the semiconductor fine particle phosphors in the XY plane of the wavelength conversion member, and decreasing concentration of semiconductor fine particle phosphor in the Z axial direction, it is possible to thin the wavelength conversion member of the image display device while keeping absorptance of excitation light high, and it is understood that an image display device that is thinned as a whole can be realized.

Next, influence of difference in structure of the image display device on screen brightness of the image display device will be discussed. For this discussion, Examples C1, C7, C6, C11 and Comparative Examples C1, C6, C5, C10 are referred. Among these, the image display devices according to Example C1 and Comparative Example C1 are image display devices having the structure shown in FIG. 21 as described above, and include the wavelength conversion member in the irradiation part. On the other hand, the image display devices according to Example C7 and Comparative Example C6 are image display devices having the structure shown in FIG. 24 as described above, and include the wavelength conversion member in the image display part. The image display devices according to Example C6 and Comparative Example C5 are image display devices having the structure shown in FIG. 26 as described above, and include the wavelength conversion member in the irradiation part. On the other hand, the image display devices according to Example C11 and Comparative Example C10 are image display devices having the structure shown in FIG. 28 as described above, and include the wavelength conversion member in the image display part.

As shown in FIG. 44, it was demonstrated that the image display devices according to Examples C1, C7, C6, C11 exhibit screen brightness, respectively, higher than that of image display devices according to Comparative Examples C1, C6, C5, C10. It was demonstrated that screen brightness is improved in the image display devices according to Examples compared with the image display devices according to Comparative Examples, both in the case of employing the structure including the wavelength conversion member in the irradiation part and in the case of employing the structure including the wavelength conversion member in the image display part. These results mean that by increasing dispersion concentration of semiconductor fine particle phosphor in the XY in-plane direction by closely packing the semiconductor fine particle phosphors in the XY plane of the wavelength conversion member, and decreasing concentration of semiconductor fine particle phosphor in the Z axial direction, it is possible to provide an image display device capable of suppressing reabsorption of fluorescence and realizing high screen brightness regardless of the structure of the image display device.

Figure 48:
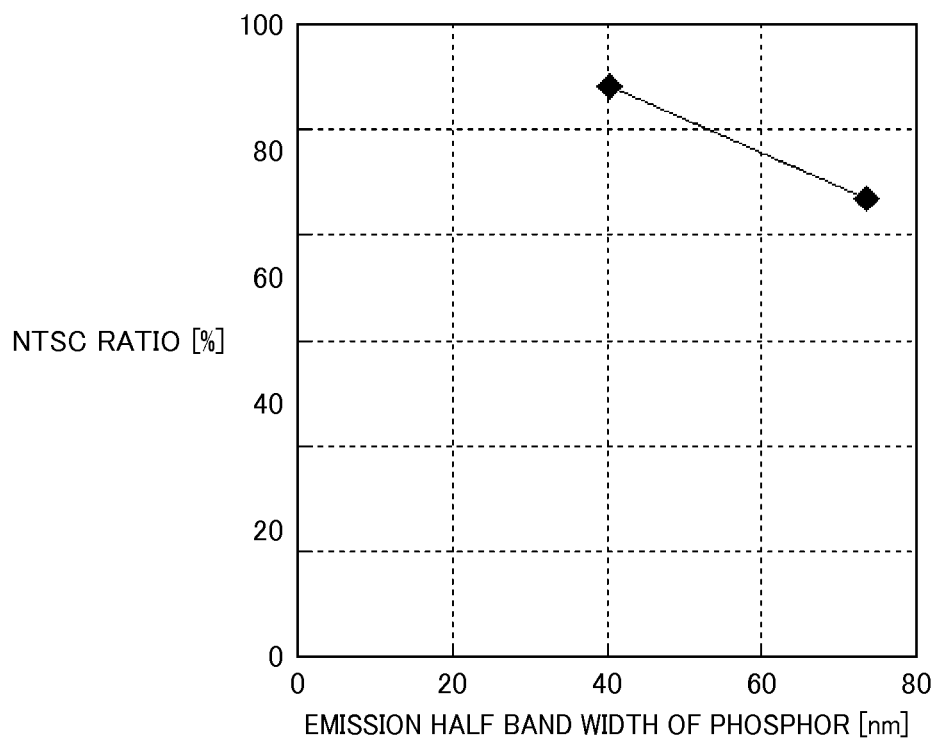
FIG. 48 is a graph showing correlations between half band width of emission spectrum of semiconductor fine particle phosphor and NTSC ratio of the image display device in Examples C1, C7, C6, C11 and Comparative Examples C1, C6, C5, C10.

As a complementary discussion result, influence of the difference in half band width of emission spectrum of semiconductor fine particle phosphor on NTSC ratio of the image display device will be described below. FIG. 48 is a graph showing a correlation between half band width of emission spectrum of the semiconductor fine particle phosphor and NTSC ratio of the image display device. In FIG. 48, the horizontal axis represents half band width [nm] of the semiconductor fine particle phosphor, and the vertical axis represents NTSC ratio [%] of the light emitting device. Detailed description of the test conditions and the like is omitted here.

As shown in FIG. 48, a tendency was observed that the image display device using a semiconductor fine particle phosphor having a large half band width contained in the wavelength conversion member has higher NTSC ratio in comparison with the image display device using a semiconductor fine particle phosphor having a small half band width contained in the wavelength conversion member. Here, as is recognized from the FIG. 48, assuming that half band width of semiconductor fine particle phosphor has a linear relation with NTSC ratio, it would be preferred that the half band width of the semiconductor fine particle phosphor contained in the wavelength conversion member to be incorporated into the image display device is less than or equal to 50 nm for keeping the NTSC ratio higher than or equal to 80%.

In the above, the test results of the cases where an InP/ZnS semiconductor fine particle phosphor is used as a semiconductor fine particle phosphor contained in the wavelength conversion member of the image display device have been described by taking Examples C1 to C11 and Comparative Examples C1 to C10 as examples, however, it is experimentally demonstrated that a similar tendency is observed even when other kinds of semiconductor fine particle phosphors are used. That is, it is demonstrated by the present inventors that as a result of evaluation of image display devices incorporating wavelength conversion members experimentally manufactured using various kinds of semiconductor fine particle phosphors, influence of difference in the dispersed state of semiconductor fine particle phosphors on screen brightness of the wavelength conversion member of the image display device is similar to the image display device incorporating a wavelength conversion member manufactured by using the InP/ZnS semiconductor fine particle phosphors as described above.

Figure 49:
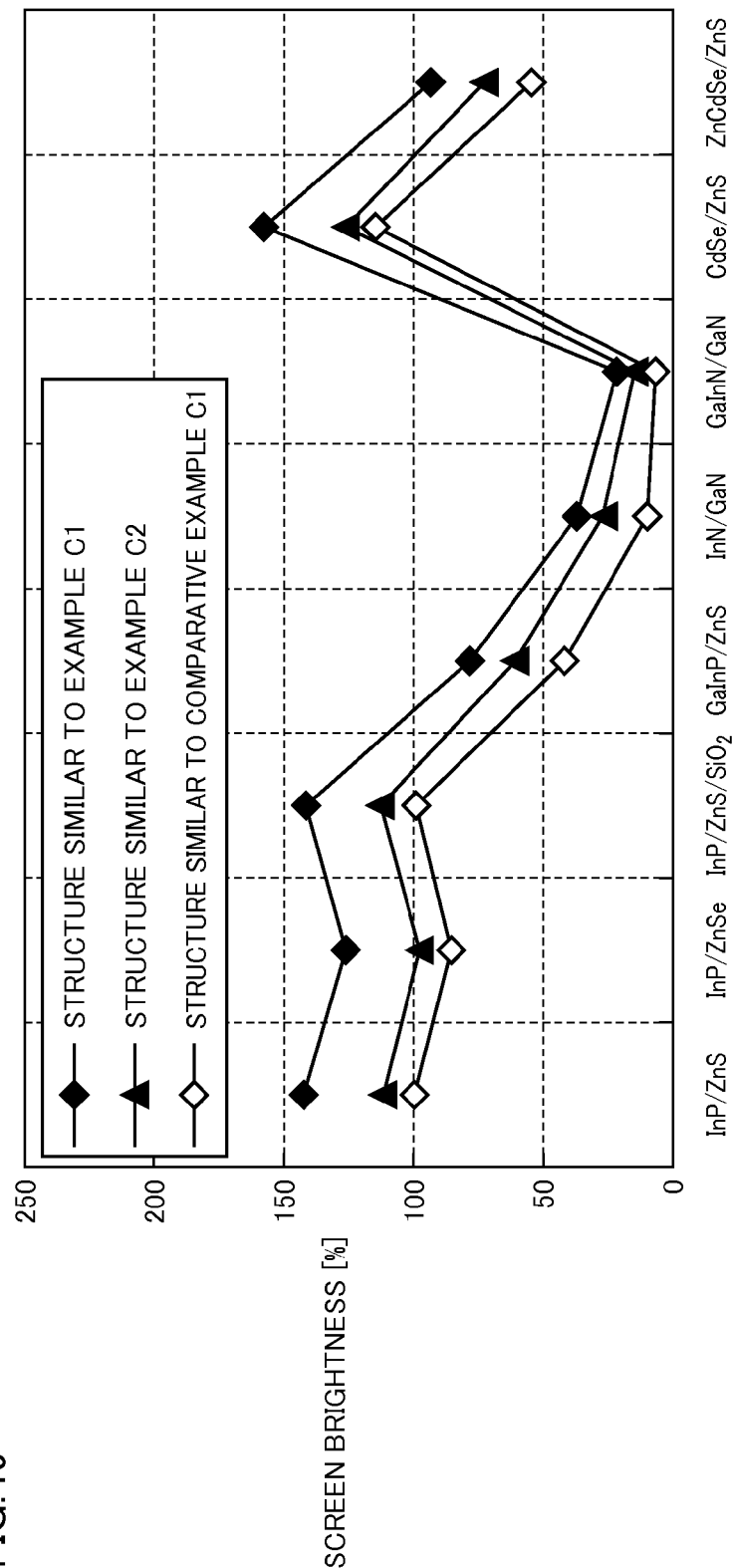
FIG. 49 is a graph showing screen brightness of image display devices including wavelength conversion members manufactured by using various semiconductor fine particle phosphors.

FIG. 49 is a graph showing screen brightness of an image display device including a wavelength conversion member manufactured by using various kinds of semiconductor fine particle phosphors as described above. Here, in FIG. 49, the horizontal axis represents the kind of semiconductor fine particle phosphor, and the vertical axis represents screen brightness [%] of the image display device.

As shown in FIG. 49, it is demonstrated that screen brightness of the image display device is improved not only in the case where InP/ZnS semiconductor fine particle phosphor is used as an semiconductor fine particle phosphor, but also in the cases where an InP/ZnSe semiconductor fine particle phosphor, an InP/ZnS/SiO$_2$ semiconductor fine particle phosphor, a Ga$_{0.5}$In$_{0.5}$P/ZnS semiconductor fine particle phosphor, an InN/GaN semiconductor fine particle phosphor, a Ga$_{0.4}$In$_{0.6}$N/GaN semiconductor fine particle phosphor, a CdSe/ZnS semiconductor fine particle phosphor, or a ZnCdSe/ZnS semiconductor fine particle phosphor is used.

From these test results described above, it was demonstrated that by a wavelength conversion member, a light emitting device and an image display device to which the present invention is applied, it is possible to realize a wavelength conversion member and a light emitting device and an image display device including the same having higher emission efficiency, in comparison with a conventional wavelength conversion member, light emitting device and image display device.

In the foregoing, a wavelength conversion member having specific anisotropy in dispersion concentration of semiconductor fine particle phosphor, and a light emitting device and an image display device including the same as shown in Embodiments 1 to 7 of the present invention as described above are actually manufactured experimentally and evaluated, and only the test contents and test results thereof are clearly shown. However, inventors of the present invention also actually manufactured a wavelength conversion member experimentally by forming a wavelength conversion layer of an aggregate of semiconductor fine particle phosphor likewise the Embodiment 15 of the present invention as described above and providing the number of particles of semiconductor fine particle phosphor with specific anisotropy, and a light emitting device and an image display device including the same, and evaluated them. Since the test contents regarding evaluation are equivalent to those described above, and the test results regarding evaluation are also equivalent to that described above, clear description thereof is omitted here. The reason why the test results are equivalent to those described above would be because the optical characteristics are equivalent because the wavelength conversion member manufactured by forming a wavelength conversion layer of an aggregate of semiconductor fine particle phosphor and providing particle number of the semiconductor fine particle phosphor with specific anisotropy, and the light emitting device and the image display device including the same are different from the wavelength conversion member having specific anisotropy in dispersion concentration of semiconductor fine particle phosphor, and a light emitting device and an image display device including the same, basically only in that the semiconductor fine particle phosphor is not sealed by a light transmissive member.

As a light emitting device and an image display device to which the present invention is applicable, various products such as an alternate light source for a conventionally-used small light bulb, a light source for display, a backlight light source for liquid crystal panel, general luminaire, decorative luminaire, light emitting display device, display, projector and the like, are supposed.

Also, the characteristic configurations of the wavelength conversion members, light emitting devices, and image display devices described in Embodiments 1 to 15 of the present invention as described above may be of course mutually combined as far as such combination is allowable in respect of the apparatus configuration.

As described above, the embodiments and examples disclosed herein are given for exemplification and not for limitation in all respects. The technical scope of the present invention is defined by claims, and includes every modification within the meaning and scope equivalent to description of the claims.

The invention claimed is:

1. A wavelength conversion member comprising:
a light transmissive member including a light input plane into which light is inputted, and a light output plane from which light is outputted; and
a semiconductor fine particle phosphor arranged inside said light transmissive member, for absorbing excitation light and emitting light after converting wavelength of the same,
wherein said wavelength conversion member includes a portion where said semiconductor fine particle phosphor is regularly arrayed, as a result of self-organization, in a plane that is orthogonal to a light traveling direction which is a direction connecting said light input plane and said light output plane,
a dispersion concentration of said semiconductor fine particle phosphor in a direction parallel to said light traveling direction is lower than a dispersion concentration of said semiconductor fine particle phosphor in a direction orthogonal to said light traveling direction, and
said semiconductor fine particle phosphor is packed in a form of hexagonal lattice in said portion where said semiconductor fine particle phosphor is regularly arrayed.

2. The wavelength conversion member according to claim 1, wherein as said semiconductor fine particle phosphor, a plurality of kinds of semiconductor fine particle phosphors having different emission wavelengths are contained.

3. The wavelength conversion member according to claim 2, wherein said plurality of kinds of semiconductor fine particle phosphors having different emission wavelengths are arranged in the form of layers along said light traveling direction while they are separated by kind.

4. The wavelength conversion member according to claim 3, wherein respective layers of the plurality of kinds of semiconductor fine particle phosphors arranged in the form of layers while they are separated by kind are arrayed so that emission wavelength of the semiconductor fine particle phosphor contained in each layer decreases from the side of said light input plane to the side of said light output plane.

5. The wavelength conversion member according to claim 1, wherein absorbance per 1 μm along said light traveling direction is greater than or equal to 0.02.

6. The wavelength conversion member according to 1, having a thickness along said light traveling direction of greater than or equal to 0.5 nm and less than or equal to 50 μm, and absorbing greater than or equal to 90% of inputted excitation light and converting wavelength of the same.

7. The wavelength conversion member according to claim 1, wherein said semiconductor fine particle phosphor has a core part formed of a semiconductor material, and a shell part that covers the core part, and is formed of a material different from that of the core part, and
said core part is formed of a III-V group compound semiconductor material.

8. The wavelength conversion member according to claim 1, wherein said semiconductor fine particle phosphor has a core part formed of a semiconductor material, and a shell part that covers the core part, and is formed of a material different from that of the core part, and
said core part is formed of a material selected from the group consisting of InP, InN, mixed crystal of InP and mixed crystal of InN.

9. A wavelength conversion member comprising:
a wavelength conversion layer including a light input plane into which light is inputted, and a light output plane from which light is outputted; and
a semiconductor fine particle phosphor situated in said wavelength conversion layer, for absorbing excitation light and emitting light after converting wavelength of the same,
wherein said wavelength conversion layer is constituted by an aggregate of said semiconductor fine particle phosphor,
said semiconductor fine particle phosphor is regularly arrayed as a result of self-organization,
a number of particles of said semiconductor fine particle phosphor in a direction parallel to a light traveling direction which is a direction connecting said light input plane and said light output plane is smaller than a number of particles of said semiconductor fine particle phosphor in a direction orthogonal to said light traveling direction, and
said semiconductor fine particle phosphor is packed in a form of hexagonal lattice.

10. The wavelength conversion member according to claim 9, wherein as said semiconductor fine particle phosphor, a plurality of kinds of semiconductor fine particle phosphors having different emission wavelengths are contained.

11. The wavelength conversion member according to claim 10, wherein said plurality of kinds of semiconductor fine particle phosphors having different emission wavelengths are arranged in the form of layers along said light traveling direction while they are separated by kind.

12. The wavelength conversion member according to claim 11, wherein respective layers of the plurality of kinds of semiconductor fine particle phosphors arranged in the form of layers while they are separated by kind are arrayed so that emission wavelength of the semiconductor fine particle phosphor contained in each layer decreases from the side of said light input plane to the side of said light output plane.

13. The wavelength conversion member according to 9, wherein absorbance per 1 μm along said light traveling direction is greater than or equal to 0.02.

14. The wavelength conversion member according to 9, having a thickness along said light traveling direction of greater than or equal to 0.5 nm and less than or equal to 50 μm, and absorbing greater than or equal to 90 % of inputted excitation light and converting wavelength of the same.

15. The wavelength conversion member according to claim 9, wherein said semiconductor fine particle phosphor has a core part formed of a semiconductor material, and a shell part that covers the core part, and is formed of a material different from that of the core part, and
said core part is formed of a III-V group compound semiconductor material.

16. The wavelength conversion member according to claim 9, wherein said semiconductor fine particle phosphor has a core part formed of a semiconductor material, and a shell part that covers the core part, and is formed of a material different from that of the core part, and
said core part is formed of a material selected from the group consisting of InP, InN, mixed crystal of InP and mixed crystal of InN.

17. A wavelength conversion member comprising:
a light transmissive member including a light input plane into which light is inputted, and a light output plane from which light is outputted; and
a semiconductor fine particle phosphor arranged inside said light transmissive member, for absorbing excitation light and emitting light after converting wavelength of the same,
wherein said wavelength conversion member includes a portion where said semiconductor fine particle phosphor is regularly arrayed, as a result of self-organization, in a plane that is orthogonal to a light traveling direction which is a direction connecting said light input plane and said light output plane,
a dispersion concentration of said semiconductor fine particle phosphor in a direction parallel to said light traveling direction is lower than a dispersion concentration of said semiconductor fine particle phosphor in a direction orthogonal to said light traveling direction, and
said semiconductor fine particle phosphor is packed in a form of cubic lattice in said portion where said semiconductor fine particle phosphor is regularly arrayed.

18. The wavelength conversion member according to claim 17, wherein as said semiconductor fine particle phosphor, a plurality of kinds of semiconductor fine particle phosphors having different emission wavelengths are contained.

19. The wavelength conversion member according to claim 18, wherein said plurality of kinds of semiconductor fine particle phosphors having different emission wavelengths are arranged in the form of layers along said light traveling direction while they are separated by kind.

20. The wavelength conversion member according to claim 19, wherein respective layers of the plurality of kinds of semiconductor fine particle phosphors arranged in the form of layers while they are separated by kind are arrayed so that emission wavelength of the semiconductor fine particle phosphor contained in each layer decreases from the side of said light input plane to the side of said light output plane.

21. The wavelength conversion member according to claim 17, wherein absorbance per 1 μm along said light traveling direction is greater than or equal to 0.02.

22. The wavelength conversion member according to claim 17, having a thickness along said light traveling direction of greater than or equal to 0.5 nm and less than or equal to 50 μm, and absorbing greater than or equal to 90% of inputted excitation light and converting wavelength of the same.

23. The wavelength conversion member according to claim 17, wherein said semiconductor fine particle phosphor has a core part formed of a semiconductor material, and a shell part that covers the core part, and is formed of a material different from that of the core part, and
said core part is formed of a III-V group compound semiconductor material.

24. The wavelength conversion member according to claim 17, wherein said semiconductor fine particle phosphor has a core part formed of a semiconductor material, and a shell part that covers the core part, and is formed of a material different from that of the core part, and
said core part is formed of a material selected from the group consisting of InP, InN, mixed crystal of InP and mixed crystal of InN.

25. A wavelength conversion member according comprising:
a wavelength conversion layer including a light input plane into which light is inputted, and a light output plane from which light is outputted; and
a semiconductor fine particle phosphor situated in said wavelength conversion layer, for absorbing excitation light and emitting light after converting wavelength of the same,
wherein said wavelength conversion layer is constituted by an aggregate of said semiconductor fine particle phosphor,
said semiconductor fine particle phosphor is regularly arrayed as a result of self-organization,
a number of particles of said semiconductor fine particle phosphor in a direction parallel to a light traveling direction which is a direction connecting said light input plane and said light output plane is smaller than a number of particles of said semiconductor fine particle phosphor in a direction orthogonal to said light traveling direction, and
said semiconductor fine particle phosphor is packed in a form of cubic lattice.

26. The wavelength conversion member according to claim 25, wherein as said semiconductor fine particle phosphor, a plurality of kinds of semiconductor fine particle phosphors having different emission wavelengths are contained.

27. The wavelength conversion member according to claim 26, wherein said plurality of kinds of semiconductor fine particle phosphors having different emission wavelengths are arranged in the form of layers along said light traveling direction while they are separated by kind.

28. The wavelength conversion member according to claim 27, wherein respective layers of the plurality of kinds of semiconductor fine particle phosphors arranged in the form of layers while they are separated by kind are arrayed so that emission wavelength of the semiconductor fine particle phosphor contained in each layer decreases from the side of said light input plane to the side of said light output plane.

29. The wavelength conversion member according to claim 25, wherein absorbance per 1 μn along said light traveling direction is greater than or equal to 0.02.

30. The wavelength conversion member according to claim 25, having a thickness along said light traveling direction of greater than or equal to 0.5 nm and less than or equal to 50 μm, and absorbing greater than or equal to 90% of inputted excitation light and converting wavelength of the same.

31. The wavelength conversion member according to claim 25, wherein said semiconductor fine particle phosphor has a core part formed of a semiconductor material, and a shell part that covers the core part, and is formed of a material different from that of the core part, and said core part is formed of a III-V group compound semiconductor material.

32. The wavelength conversion member according to claim 25, wherein said semiconductor fine particle phosphor has a core part formed of a semiconductor material, and a shell part that covers the core part, and is formed of a material different from that of the core part, and said core part is formed of a material selected from the group consisting of InP, InN, mixed crystal of InP and mixed crystal of InN.

* * * * *